United States Patent
Holmes et al.

(10) Patent No.: US 12,096,702 B2
(45) Date of Patent: Sep. 17, 2024

(54) EPITAXIAL JOSEPHSON JUNCTION DEVICE

(71) Applicant: International Business Machines Corporation, Armonk, NY (US)

(72) Inventors: Steven J. Holmes, Ossining, NY (US); Devendra K. Sadana, Pleasantville, NY (US); Brent A. Wacaser, Putnam Valley, NY (US); Damon Farmer, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 18/063,728

(22) Filed: Dec. 9, 2022

(65) Prior Publication Data

US 2023/0122482 A1    Apr. 20, 2023

Related U.S. Application Data

(62) Division of application No. 16/738,109, filed on Jan. 9, 2020, now Pat. No. 11,563,162.

(51) Int. Cl.
*H10N 60/12*   (2023.01)
*B82Y 10/00*   (2011.01)
(Continued)

(52) U.S. Cl.
CPC .............. *H10N 60/12* (2023.02); *B82Y 10/00* (2013.01); *H10N 60/0912* (2023.02);
(Continued)

(58) Field of Classification Search
None
See application file for complete search history.

(56) References Cited

U.S. PATENT DOCUMENTS 3,758,854 A * 9/1973 Zimmerman .......... A61B 5/242
                                                    327/527
3,798,511 A * 3/1974 Notarys ................. H10N 60/12
                                                    331/107 S
(Continued)

FOREIGN PATENT DOCUMENTS

CN    109285760 A  *  1/2019  ......... H01L 21/0217
WO    WO-2018106215 A1 *  6/2018  ............ H10N 60/12
WO    2018/231212 A1    12/2018

OTHER PUBLICATIONS

Kjaergaard et al. "Transparent Semiconductor-Superconductor Interface and Induced Gap in an Epitaxial Heterostructure Josephson Junction", Physical Review Applied 7, 034029 (2017); 9 pages. (Year: 2017).*

(Continued)

*Primary Examiner* — Scott B Geyer
(74) *Attorney, Agent, or Firm* — Amin, Turocy & Watson, LLP

(57) ABSTRACT

Devices, systems, methods, computer-implemented methods, apparatus, and/or computer program products that can facilitate an epitaxial Josephson junction transmon device are provided. According to an embodiment, a device can comprise a substrate. The device can further comprise an epitaxial Josephson junction transmon device coupled to the substrate. According to an embodiment, a device can comprise an epitaxial Josephson junction transmon device coupled to a substrate. The device can further comprise a tuning gate coupled to the substrate and formed across the epitaxial Josephson junction transmon device. According to an embodiment, a device can comprise a first superconducting region and a second superconducting region formed on a substrate. The device can further comprise an epitaxial Josephson junction tunneling channel coupled to the first (Continued)

7 Claims, 34 Drawing Sheets

(51) Int. Cl.
  *H10N 60/01* (2023.01)
  *H10N 60/10* (2023.01)
  *H10N 60/80* (2023.01)
  *H10N 60/81* (2023.01)
  *H10N 69/00* (2023.01)

(52) U.S. Cl.
  CPC ......... *H10N 60/128* (2023.02); *H10N 60/805* (2023.02); *H10N 60/815* (2023.02); *H10N 69/00* (2023.02)

(56) References Cited

U.S. PATENT DOCUMENTS

| | | | | |
|---|---|---|---|---|
| 4,220,959 | A * | 9/1980 | Kroger | H10N 60/12 327/528 |
| 4,578,691 | A * | 3/1986 | Murakami | H10N 60/12 257/E39.014 |
| 4,589,001 | A * | 5/1986 | Sakai | H10N 60/128 257/E39.016 |
| 4,647,954 | A * | 3/1987 | Graf | H10N 60/128 505/860 |
| 4,768,069 | A * | 8/1988 | Talvacchio | H10N 60/12 257/35 |
| 4,980,341 | A * | 12/1990 | Gehring | H10N 60/0941 505/412 |
| 5,026,682 | A * | 6/1991 | Clark | H10N 60/0941 427/63 |
| 5,047,390 | A * | 9/1991 | Higashino | H10N 60/0941 505/190 |
| 5,077,266 | A * | 12/1991 | Takagi | H10N 60/0941 427/63 |
| 5,179,426 | A * | 1/1993 | Iwamatsu | H10N 60/128 257/E39.016 |
| 5,198,413 | A * | 3/1993 | Tarutani | H10N 60/0941 505/190 |
| 5,296,749 | A * | 3/1994 | Berlincourt | H10N 60/12 327/527 |
| 5,304,538 | A * | 4/1994 | Vasquez | H10N 60/124 505/190 |
| 5,376,626 | A * | 12/1994 | Drehman | H10N 60/35 327/527 |
| 5,422,497 | A * | 6/1995 | Saitoh | H10N 60/0716 257/30 |
| 5,448,098 | A * | 9/1995 | Shinohara | H10N 60/84 257/608 |
| 5,481,119 | A * | 1/1996 | Higashino | H10N 60/124 505/190 |
| 5,514,877 | A * | 5/1996 | Nakamura | H10N 60/207 427/63 |
| 5,552,373 | A * | 9/1996 | Agostinelli | H10N 60/0941 505/190 |
| 5,625,290 | A * | 4/1997 | You | G01R 33/0358 257/E39.015 |
| 5,729,046 | A * | 3/1998 | Nishino | H10N 60/124 257/E39.015 |
| 5,846,846 | A * | 12/1998 | Suh | H10N 60/128 505/193 |
| 5,849,669 | A * | 12/1998 | Wen | H10N 60/124 428/209 |
| 5,877,122 | A * | 3/1999 | Ishimaru | H10N 60/124 505/190 |
| 6,016,433 | A * | 1/2000 | Mizuno | H10N 60/124 505/190 |
| 6,111,268 | A * | 8/2000 | Mannhart | H10N 60/128 505/193 |
| 6,160,266 | A * | 12/2000 | Odagawa | H10N 60/0941 257/E39.015 |
| 6,239,431 | B1 * | 5/2001 | Hilton | H10N 60/84 374/E7.003 |
| 9,385,159 | B2 * | 7/2016 | Taylor | H10N 60/124 |
| 10,147,865 | B1 * | 12/2018 | Tahan | H10N 60/805 |
| 10,930,750 | B2 * | 2/2021 | Merckling | H01L 21/308 |
| 2003/0071258 | A1 * | 4/2003 | Zagoskin | H10N 60/124 380/278 |
| 2016/0049489 | A1 * | 2/2016 | Wan | H01L 29/66545 438/157 |
| 2016/0276570 | A1 * | 9/2016 | Chang | H10N 60/805 |
| 2016/0343935 | A1 * | 11/2016 | Chang | H10N 60/12 |
| 2017/0084813 | A1 | 3/2017 | Chang et al. | |
| 2017/0133576 | A1 | 5/2017 | Marcus et al. | |
| 2018/0013053 | A1 * | 1/2018 | Lebby | H10N 60/0632 |
| 2018/0247974 | A1 | 8/2018 | Oliver et al. | |
| 2019/0042963 | A1 | 2/2019 | Abraham et al. | |
| 2019/0042967 | A1 | 2/2019 | Yoscovits et al. | |
| 2019/0131513 | A1 | 5/2019 | Krogstrup et al. | |
| 2019/0296210 | A1 * | 9/2019 | Brink | H01P 11/003 |
| 2019/0296213 | A1 | 9/2019 | Brink et al. | |
| 2019/0305037 | A1 | 10/2019 | Michalak et al. | |
| 2019/0363239 | A1 | 11/2019 | Yoscovits et al. | |
| 2020/0044137 | A1 * | 2/2020 | Schueffelgen | G06N 10/00 |
| 2020/0243601 | A1 * | 7/2020 | Orcutt | G06N 10/00 |
| 2020/0321508 | A1 * | 10/2020 | Hart | H10N 60/12 |
| 2020/0328338 | A1 * | 10/2020 | Adiga | H10N 60/0912 |
| 2020/0328339 | A1 | 10/2020 | Shabani et al. | |
| 2020/0335549 | A1 * | 10/2020 | Sandberg | H10N 60/12 |
| 2020/0364600 | A1 | 11/2020 | Elsherbini et al. | |
| 2021/0336121 | A1 * | 10/2021 | Burkett | G06N 10/00 |

OTHER PUBLICATIONS

Nakamura et al., "Superconducting qubits consisting of epitaxially grown NbN/AlN/NbN Josephson junctions", Appl. Phys. Lett. 99, 212502 (2011); 4 pages. (Year: 2011).*

Delfanazari et al., "On-Chip Andreev Devices: Hard Superconducting Gap and Quantum Transport in Ballistic Nb—In0.75Ga0.25As-Quantum-Well—Nb Josephson Junctions", Advanced Materials 29, 1701836 (2017); 6 pages. (Year: 2017).*

Wan et al., "Induced Superconductivity in High-Mobility Two-Dimensional Electron Gas in Gallium Arsenide Heterostructures", Nature Communications, vol. 6, No. 7426, Jun. 11, 2015, 5 pages.

Hendrickx et al., "Gate-Controlled Quantum Dots and Superconductivity in Planar Germanium", Nature Communications, vol. 9, No. 2835, 2018, 7 pages.

Zhang et al., "Semiconductor Quantum Computation", National Science Review, vol. 6, Dec. 18, 2018, 23 pages.

Nakamura et al., "Coherent Control of Macroscopic Quantum States in a Single-Cooper-Pair Box", arXiv:cond-mat/9904003, Apr. 1, 1999, 8 pages.

Loubet et al., "Stacked Nanosheet Gate-All-Around Transistor to Enable Scaling Beyond FinFET," Symposium onVLSI Technology Digest of Technical Papers, 2017, 2 pages.

Hartmann et al., "HCl Selective Etching of SiGe Versus Si in Stacks Grown on (110)", Semiconductor Science and Technology, vol. 25, Sep. 17, 2010, 10 pages.

Requirement for Restriction received for U.S. Appl. No. 16/738,109 dated Dec. 29, 2021, 7 pages.

Non Final Office Action received for U.S. Appl. No. 16/738,109 dated Feb. 23, 2022, 16 pages.

Non Final Office Action received for U.S. Appl. No. 16/738,109 dated Jun. 16, 2022, 15 pages.

Casparis et al., "Superconducting Gatemon Qubit Based on a Proximitized Two-Dimensional Electron Gas", Nature Nanotechnology, vol. 13, Oct. 2018, pp. 915-919.

Kline et al., "Sub-Micrometer Epitaxial Josephson Junctions for Quantum Circuits", Superconductor Science and Technology, vol. 25, 2012, 8 pages.

Vigneau et al., "Germanium Quantum-Well Josephson Field-Effect Transistors and Interferometers", Nano Letters, vol. 19, 2019, pp. 1023-1027.

(56) References Cited

OTHER PUBLICATIONS

Nakamura et al., "Superconducting Qubits Consisting of Epitaxially Grown NbN/AlN/NbN Josephson Junctions", Applied Physics Letters, vol. 99, No. 212502, 2011, 4 pages.
Notice of Allowance received for U.S. Appl. No. 16/738,109 dated Sep. 14, 2022, 26 pages.

* cited by examiner

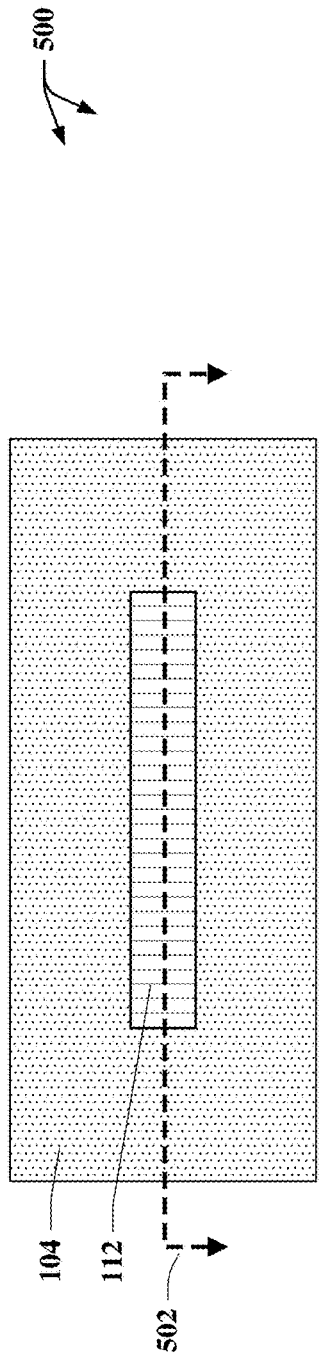
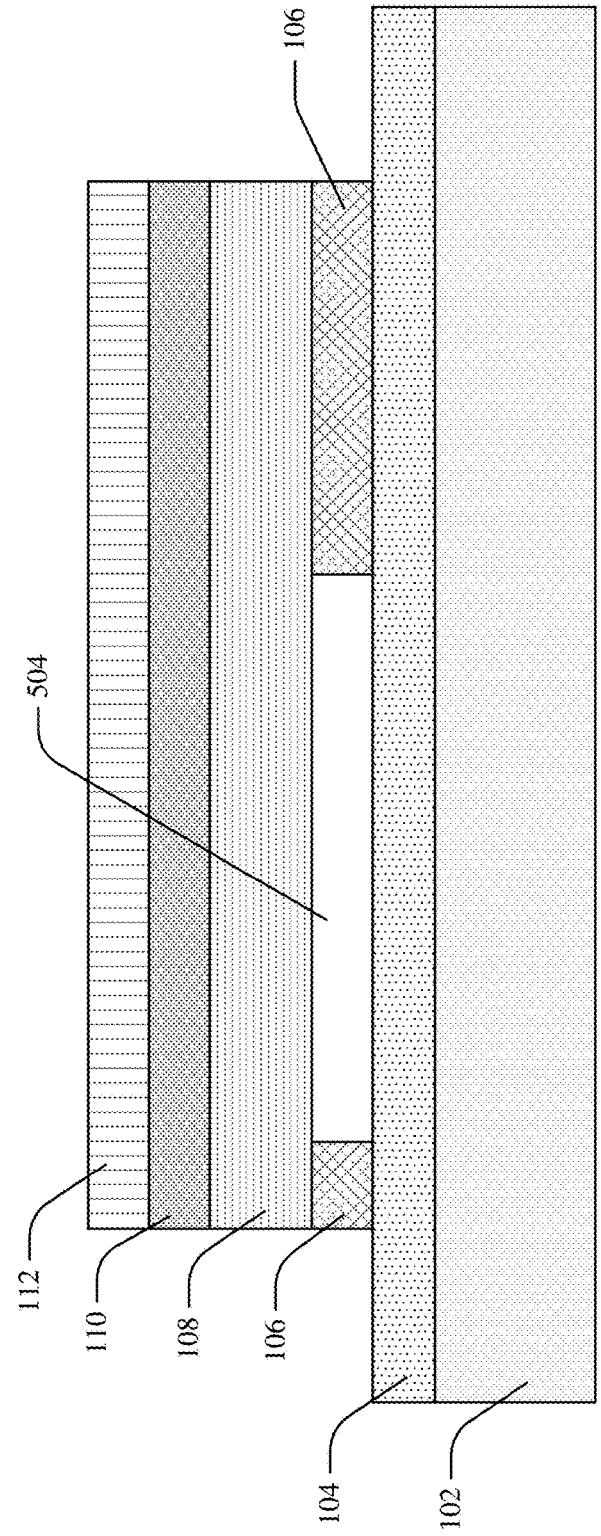
FIG. 5A
FIG. 5B

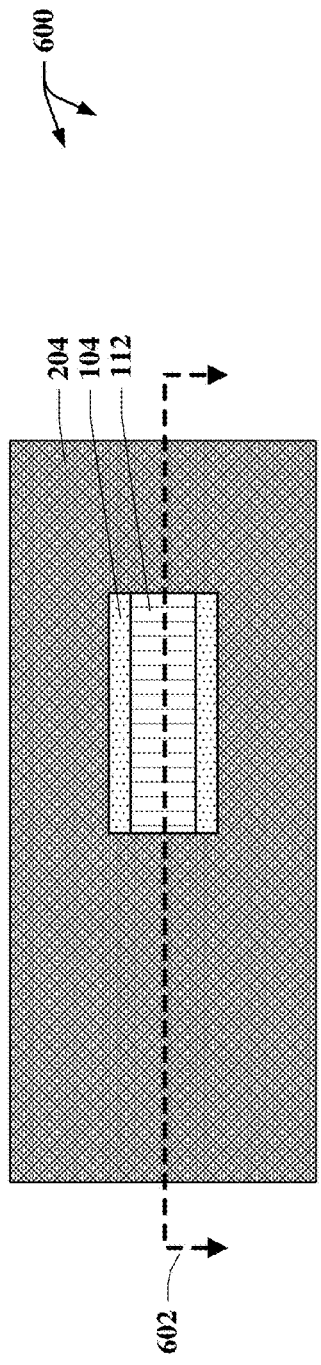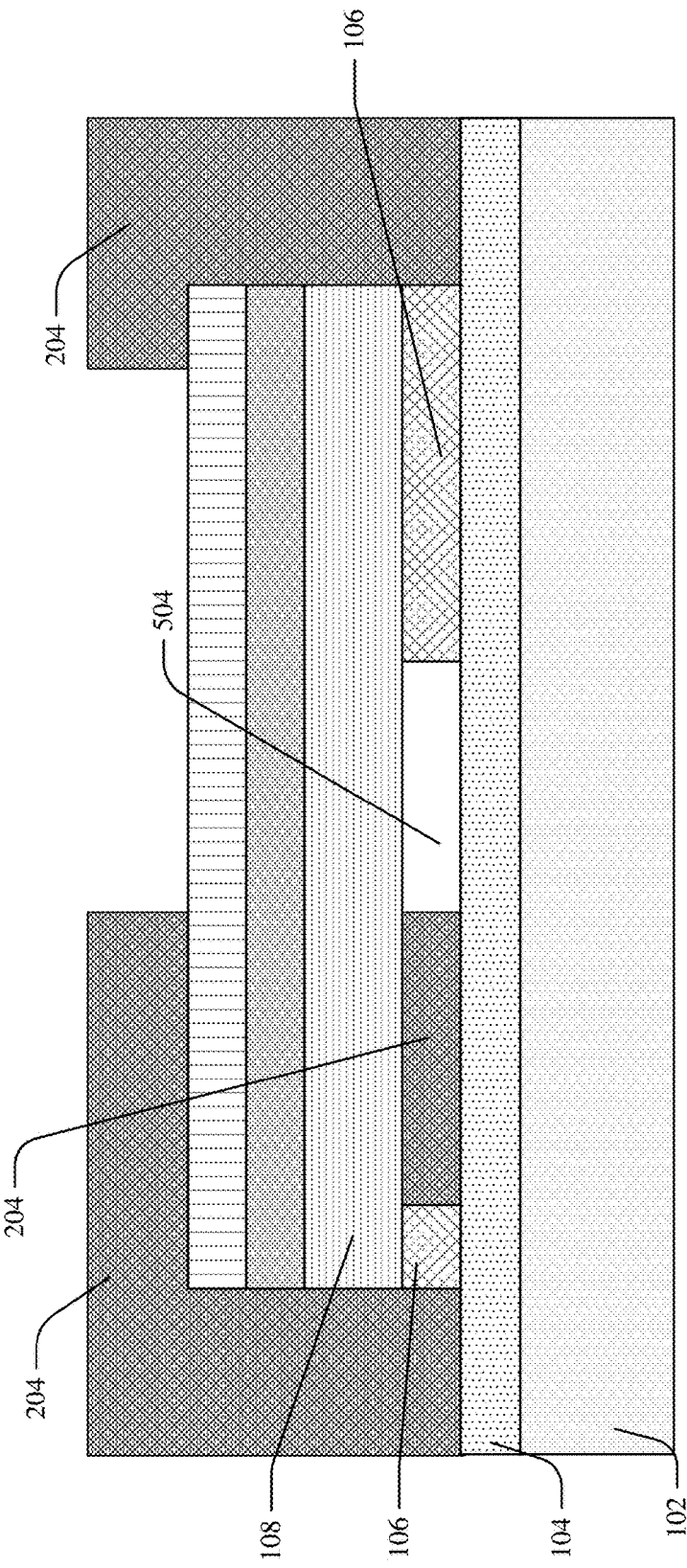
FIG. 6A
FIG. 6B

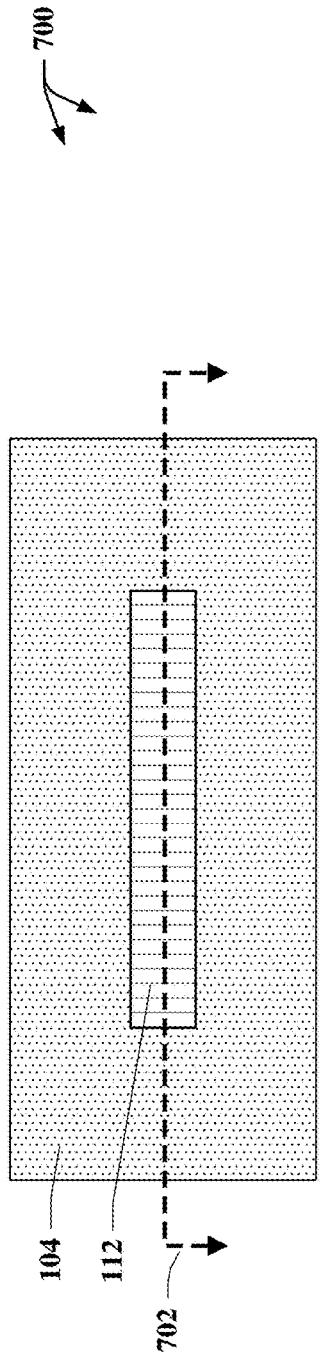
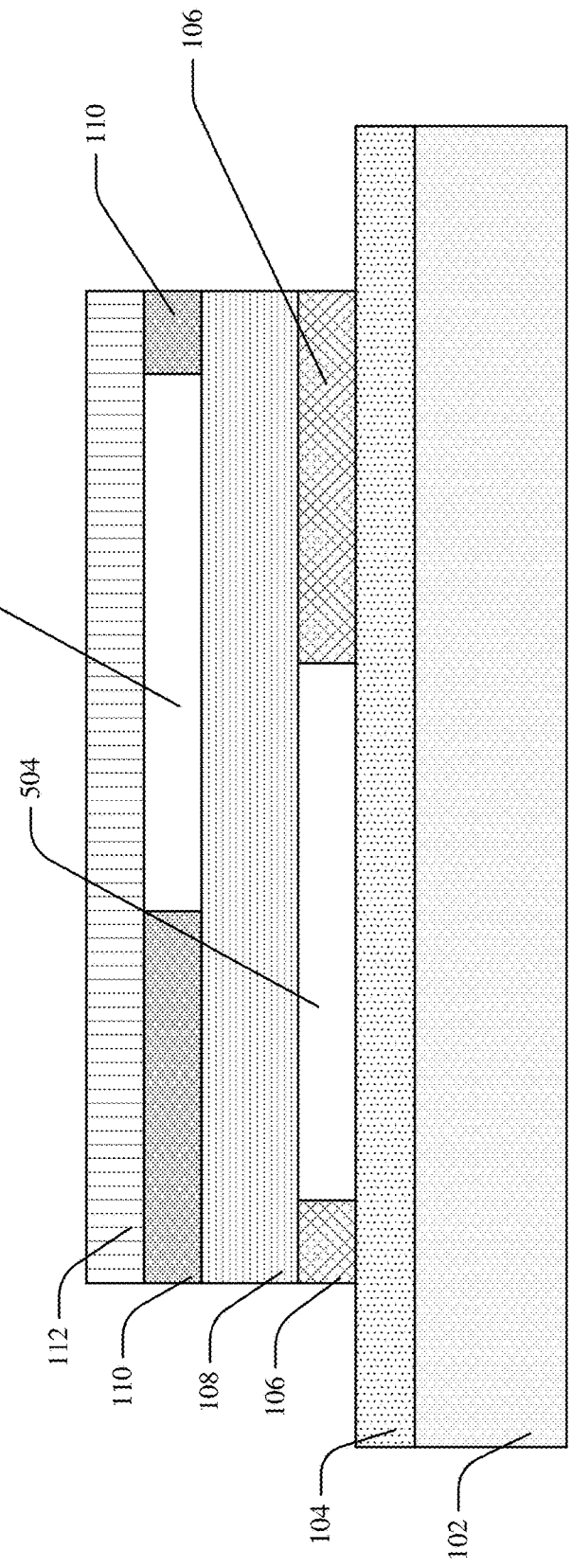
FIG. 7A
FIG. 7B

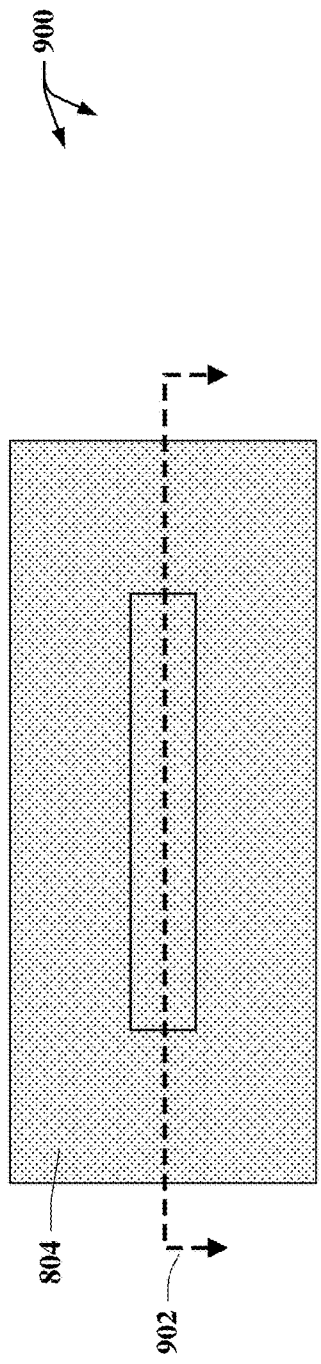
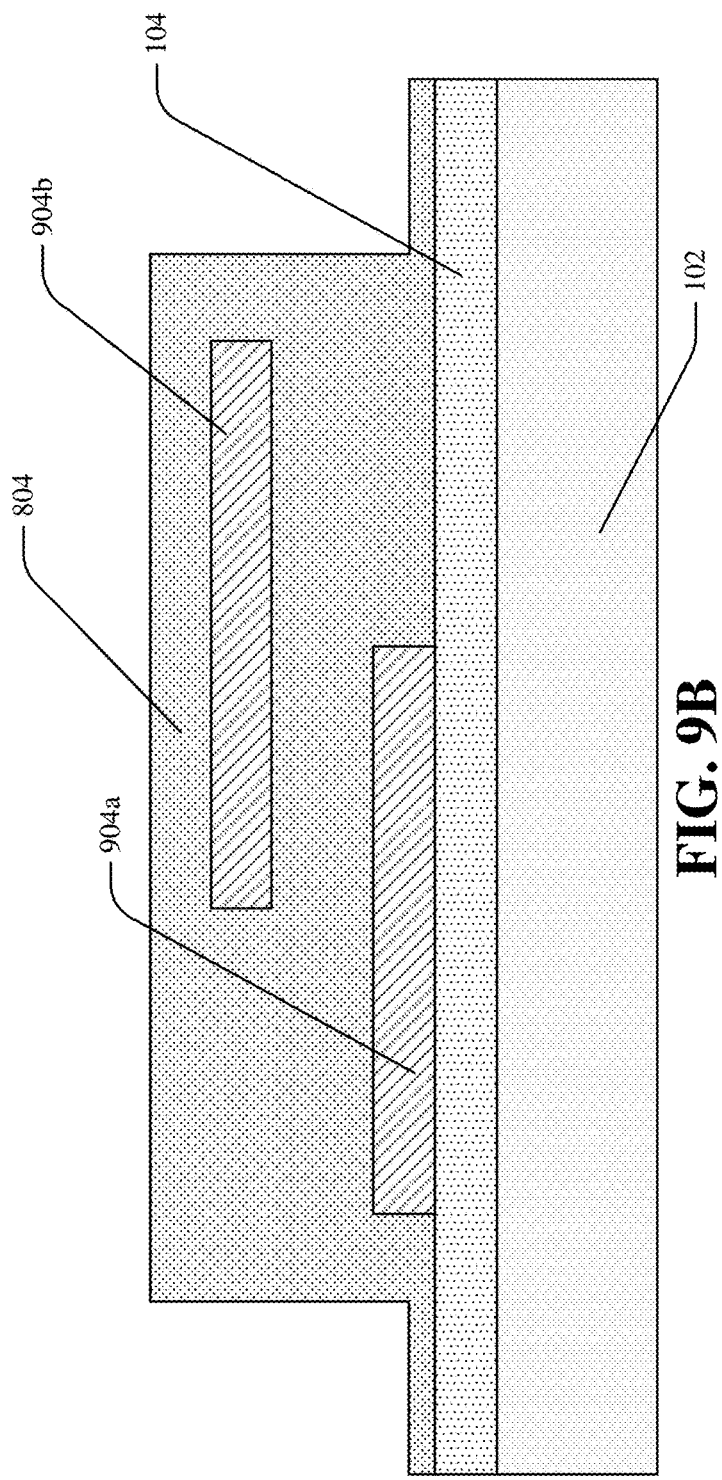
FIG. 9A
FIG. 9B

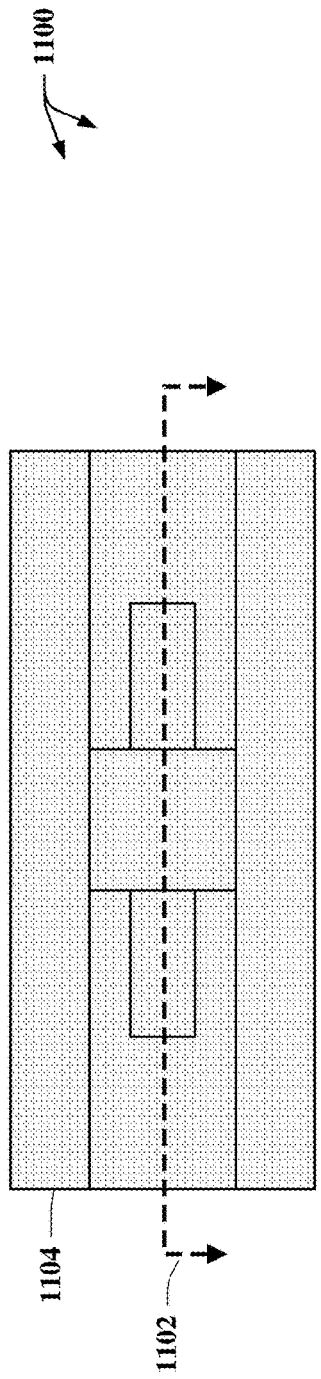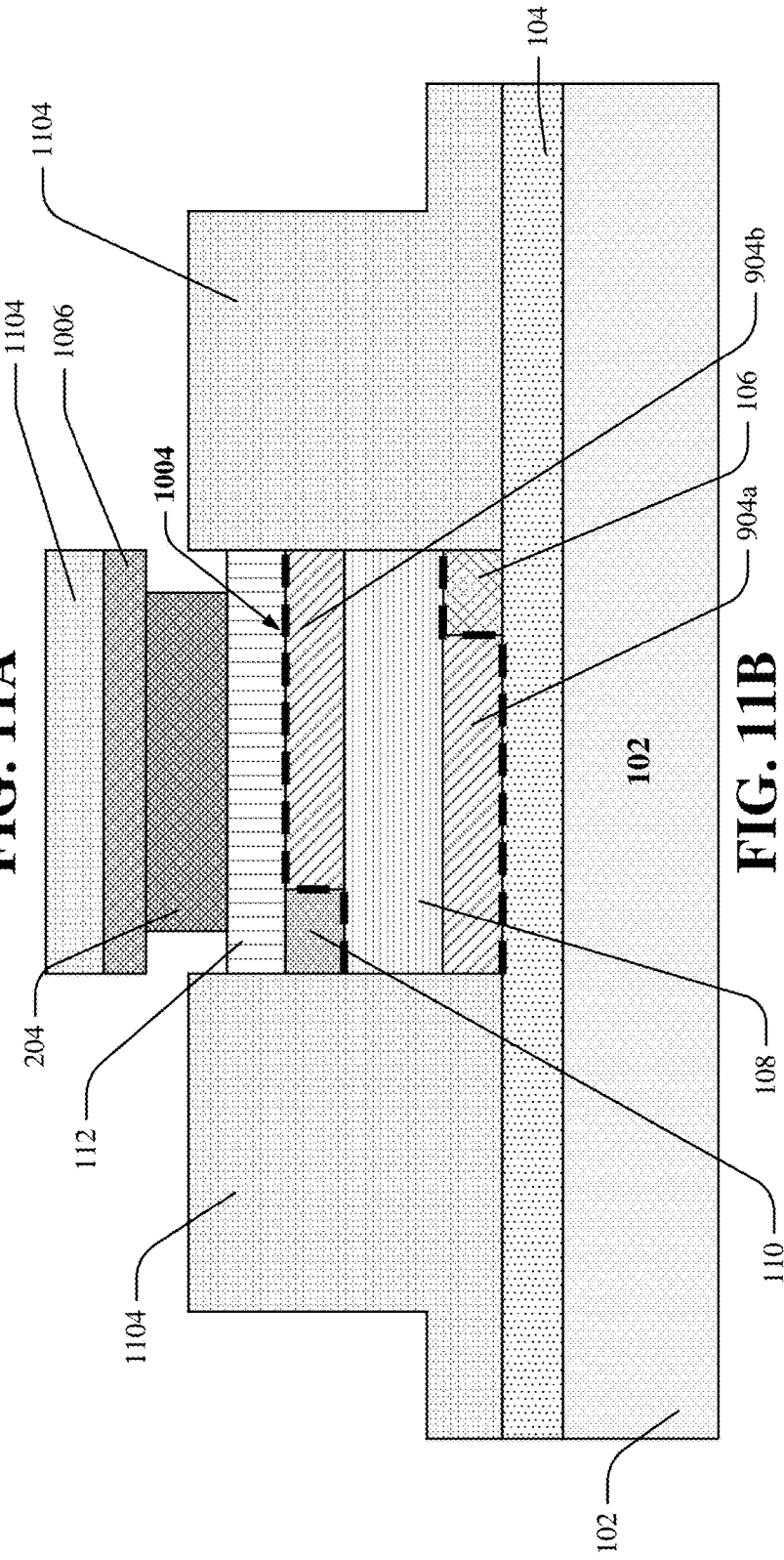

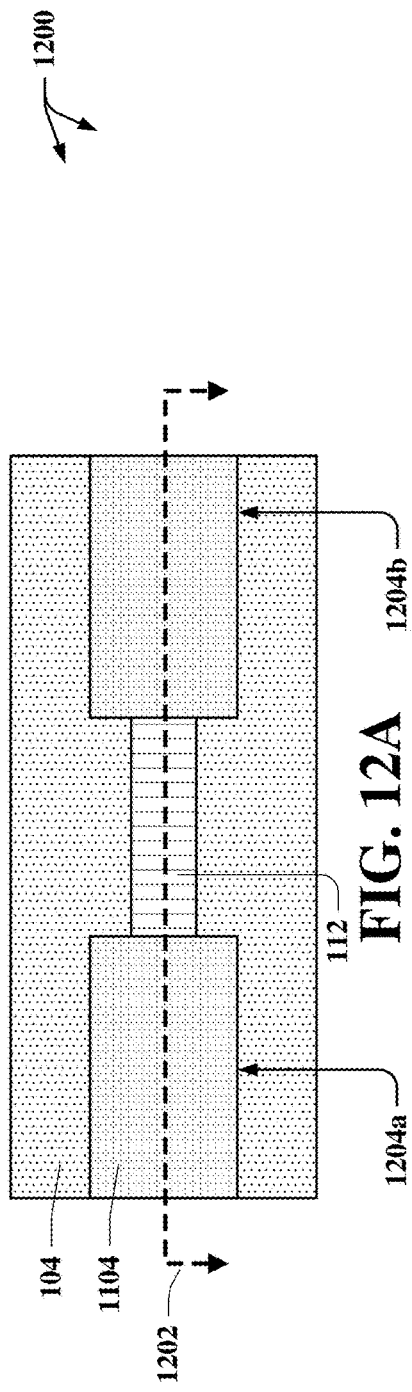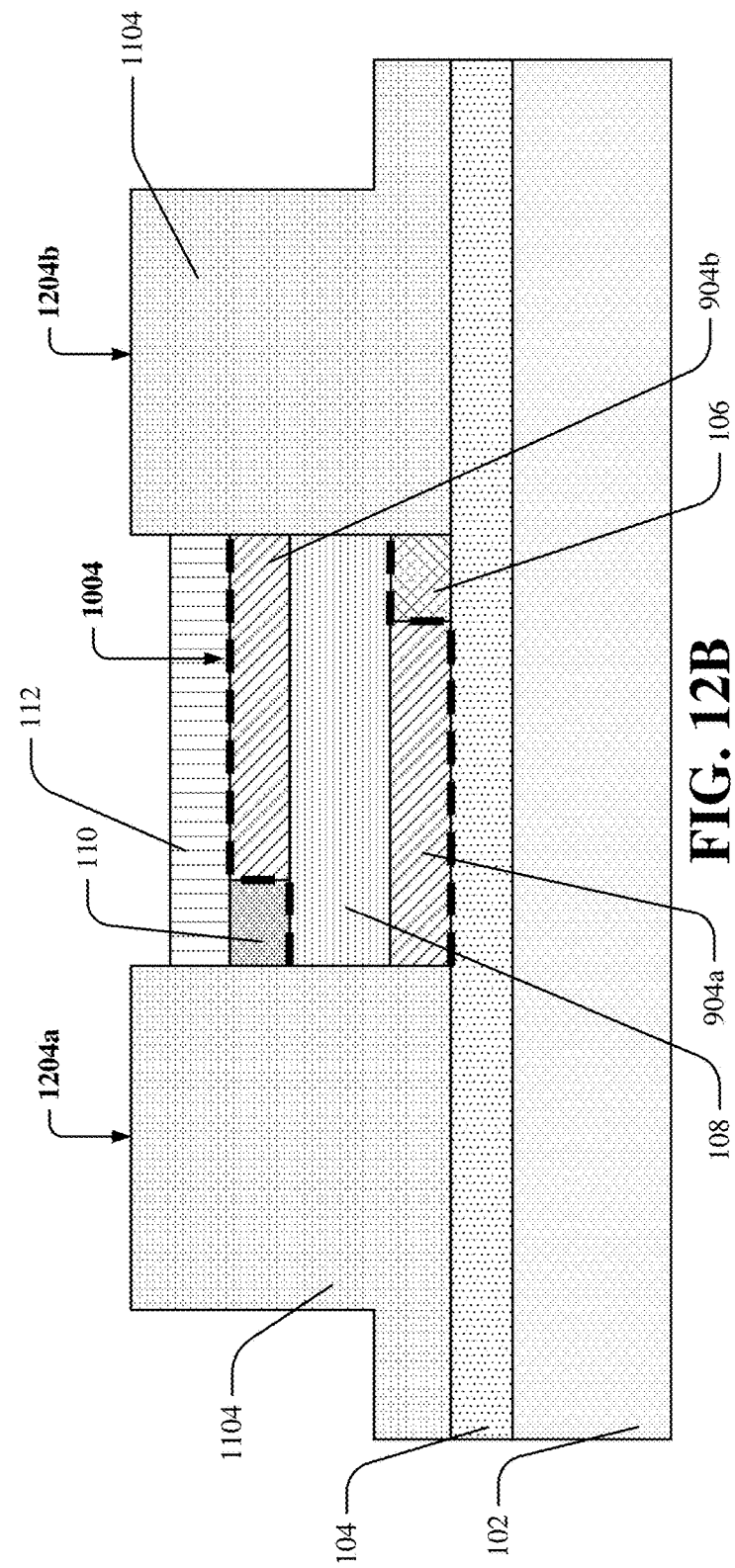

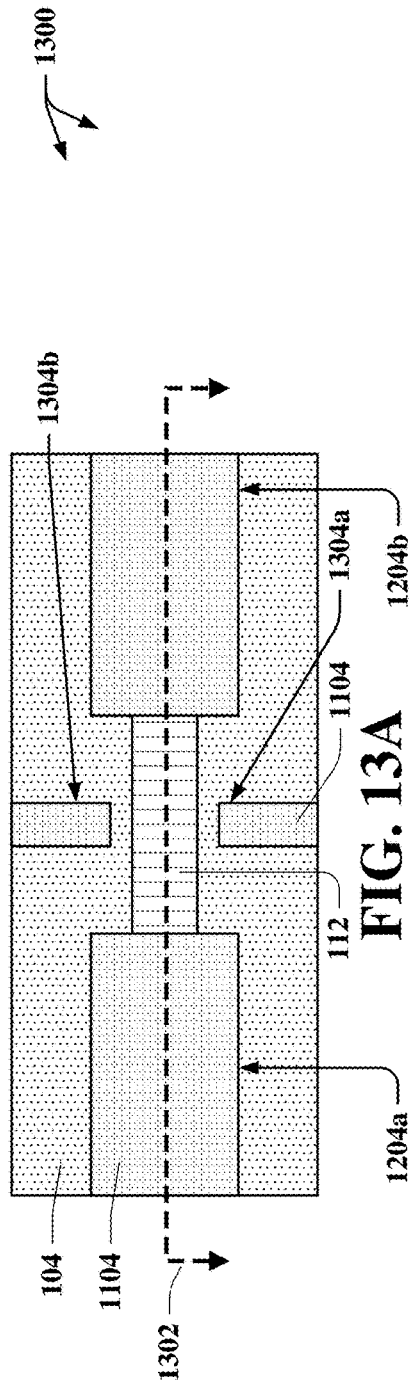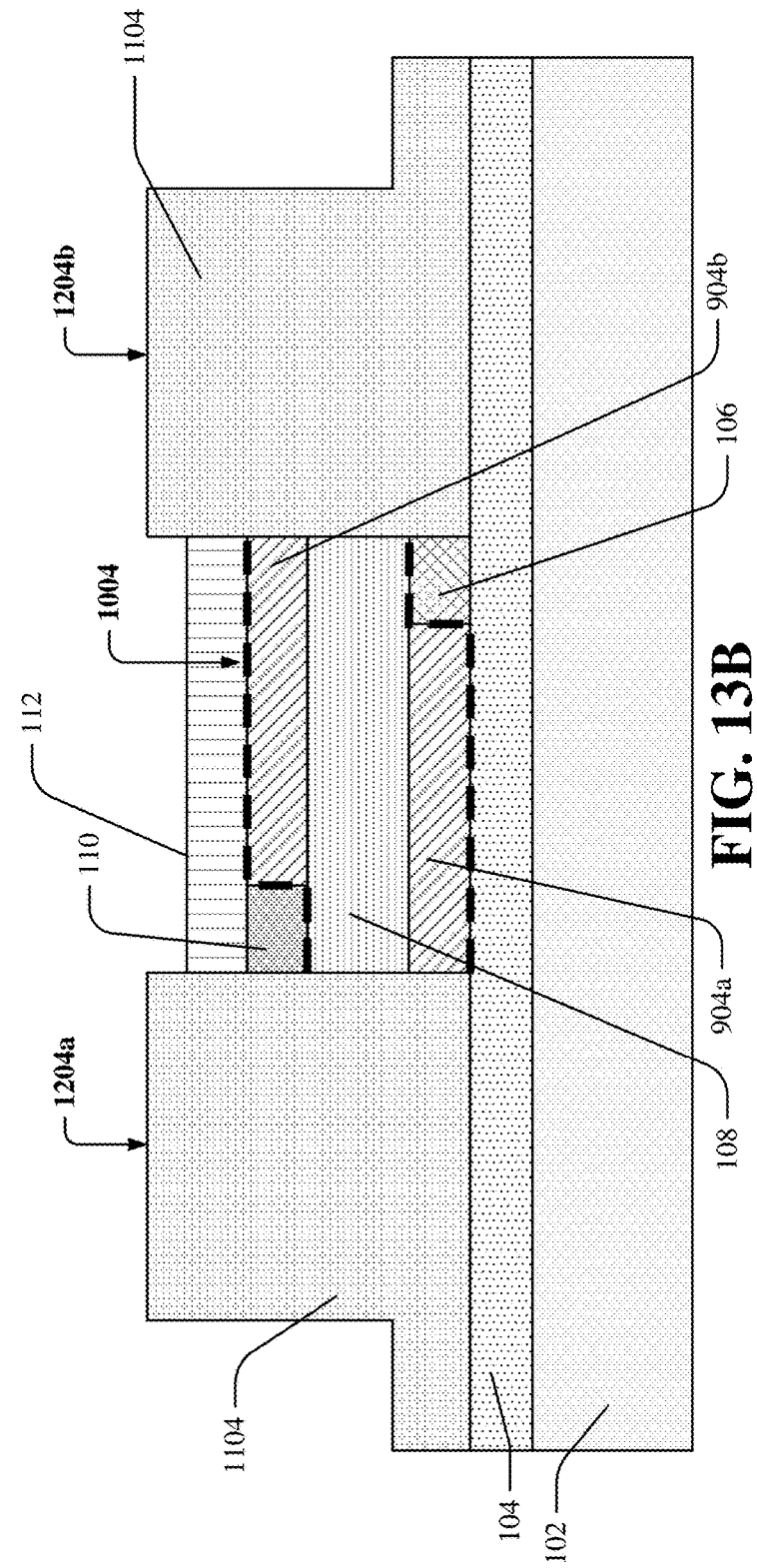

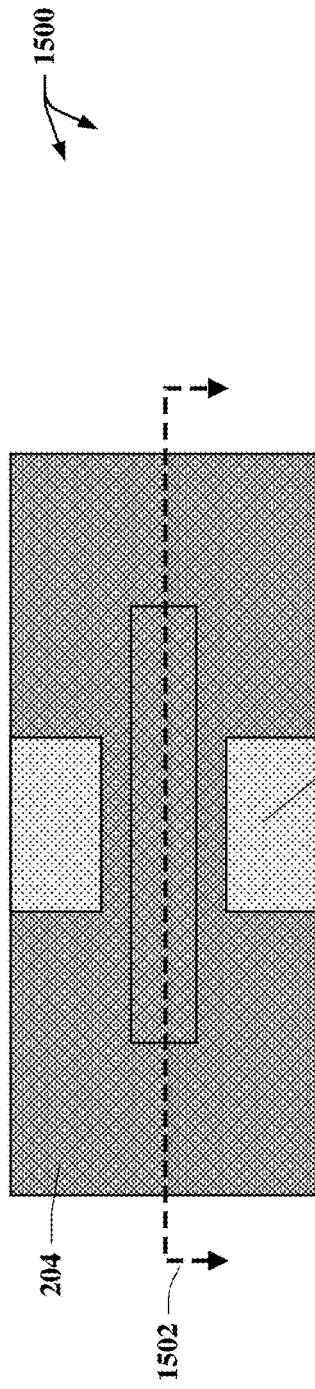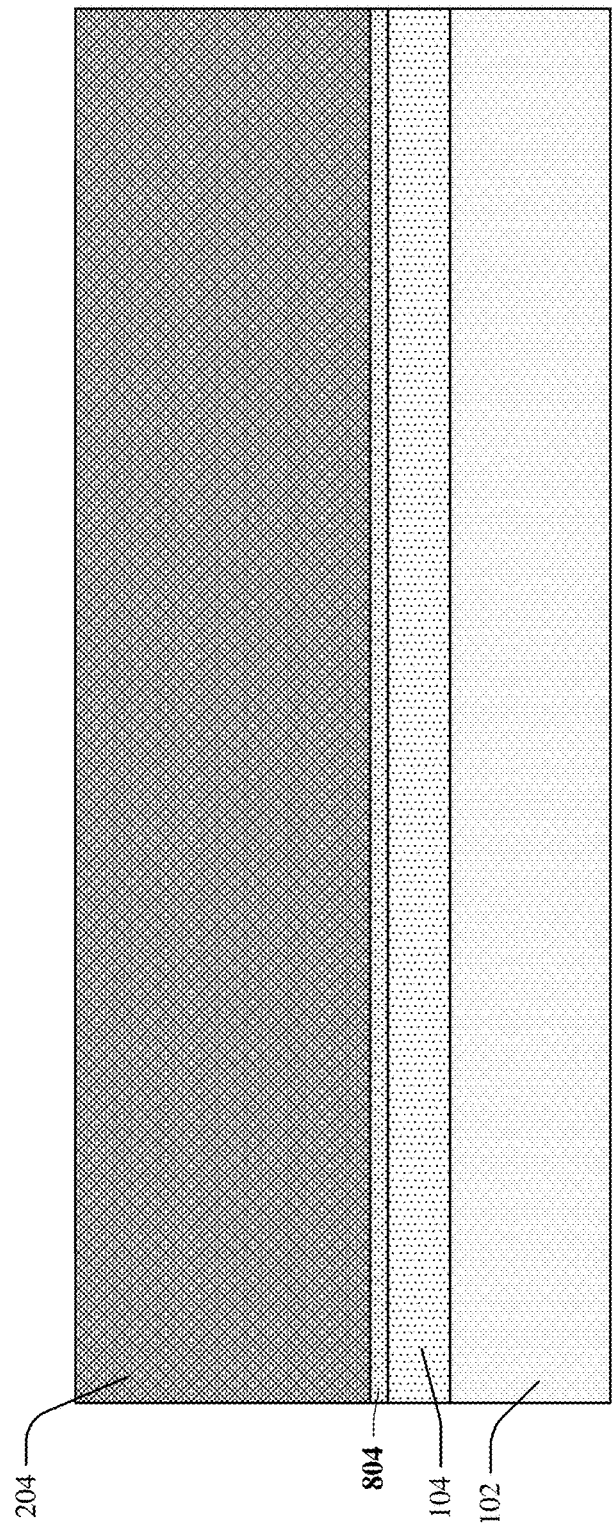

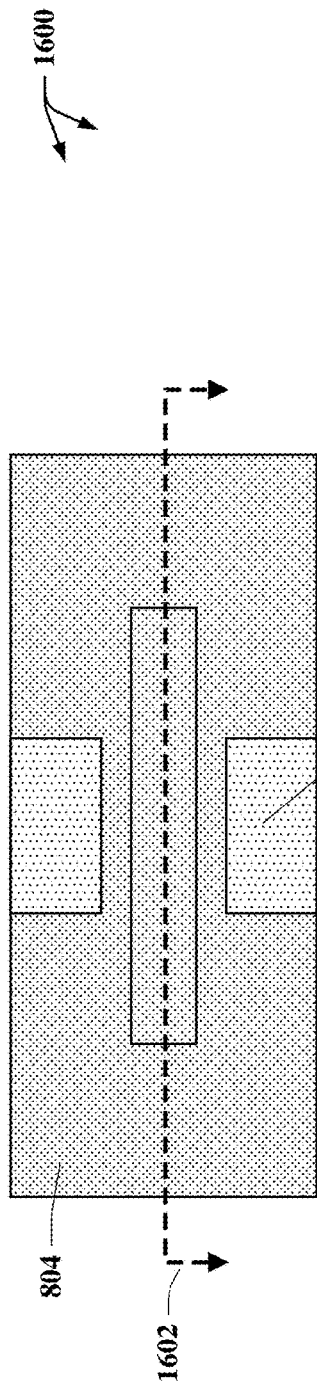
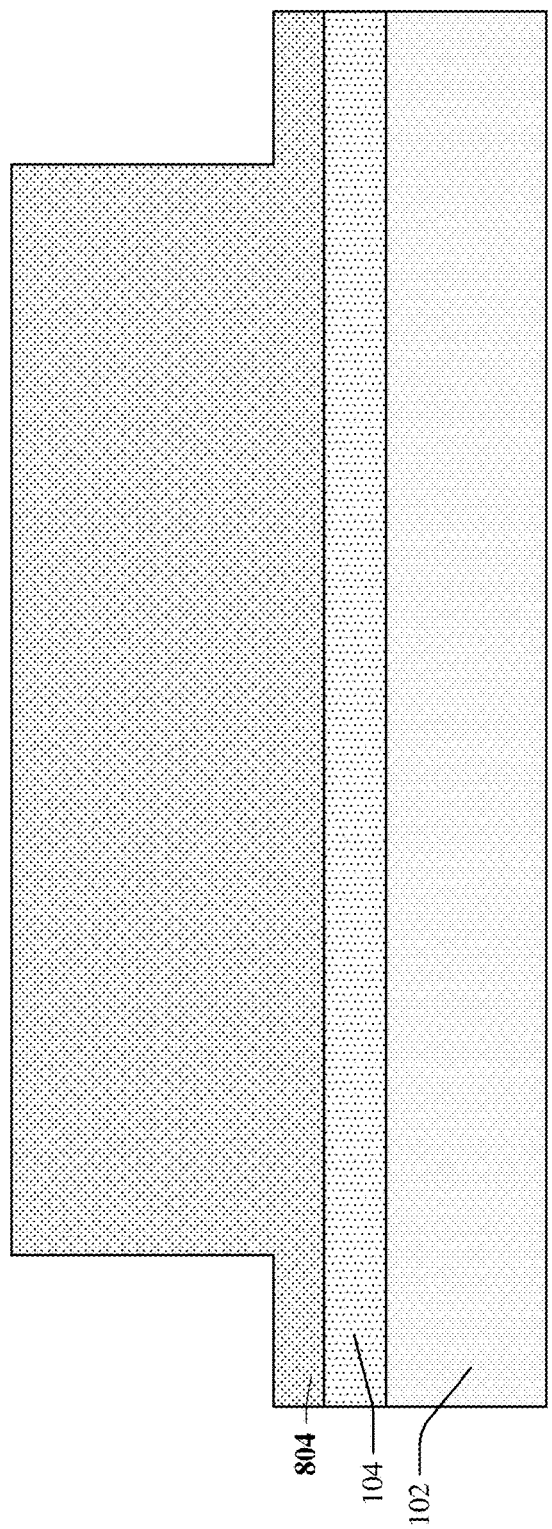

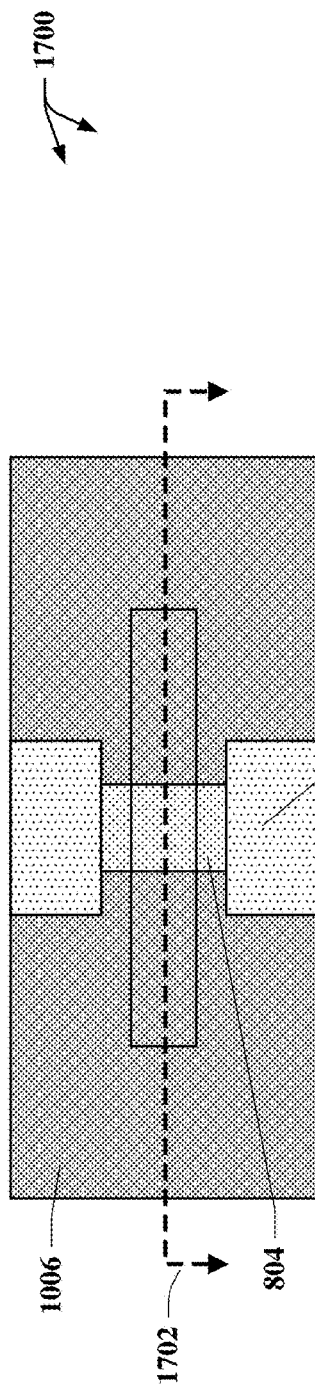
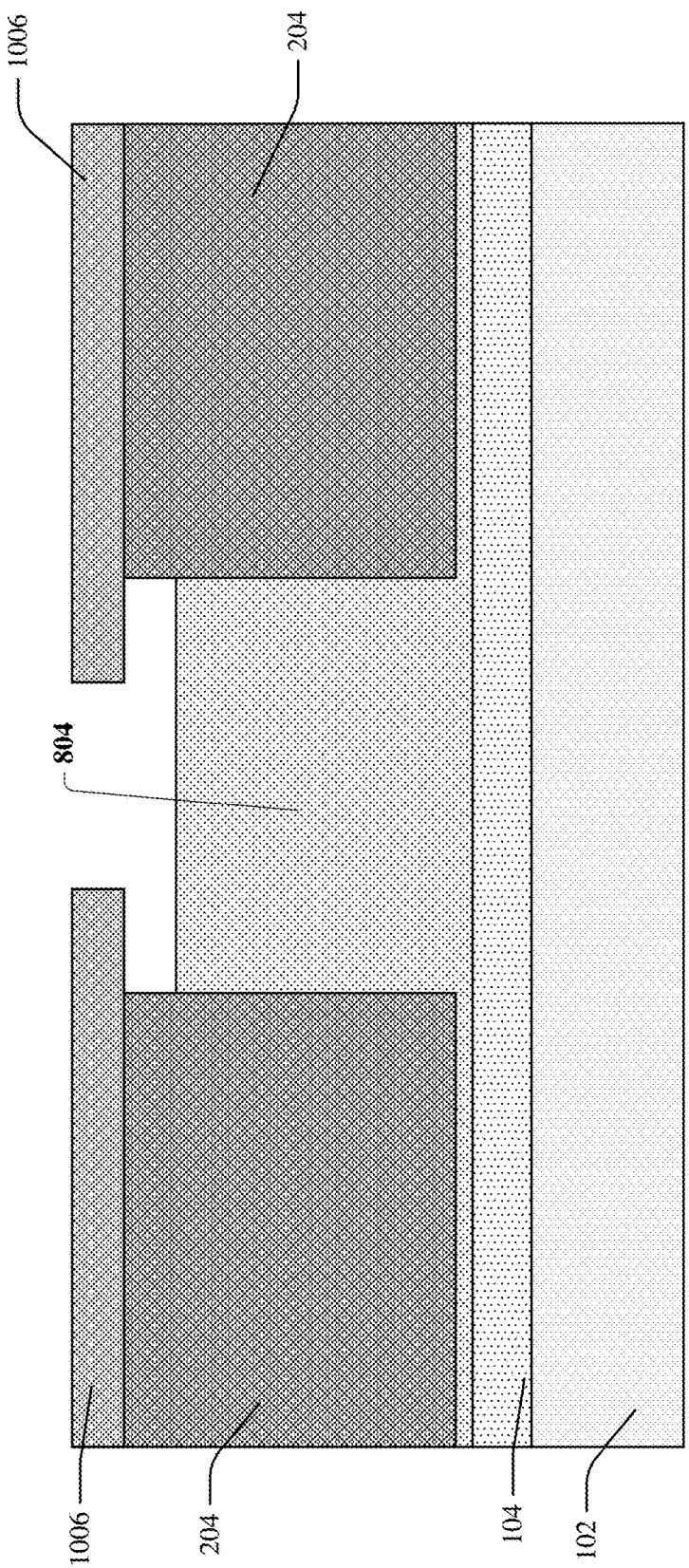
FIG. 17A
FIG. 17B

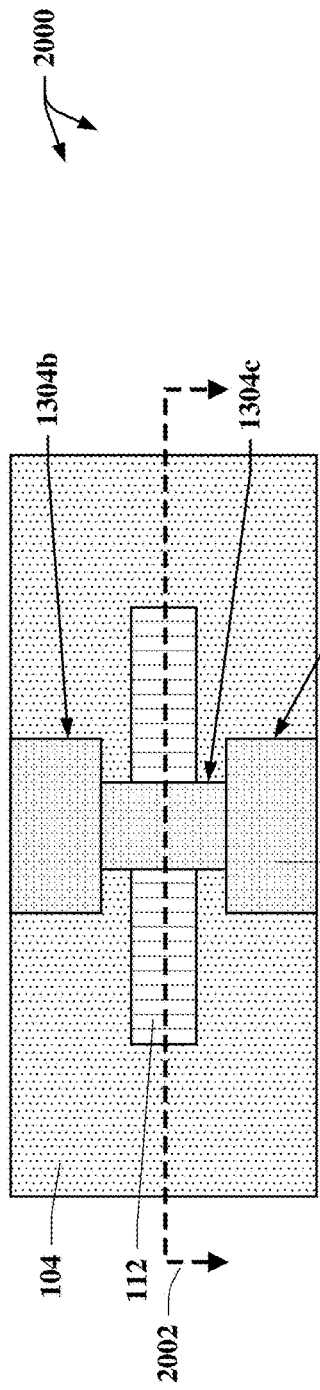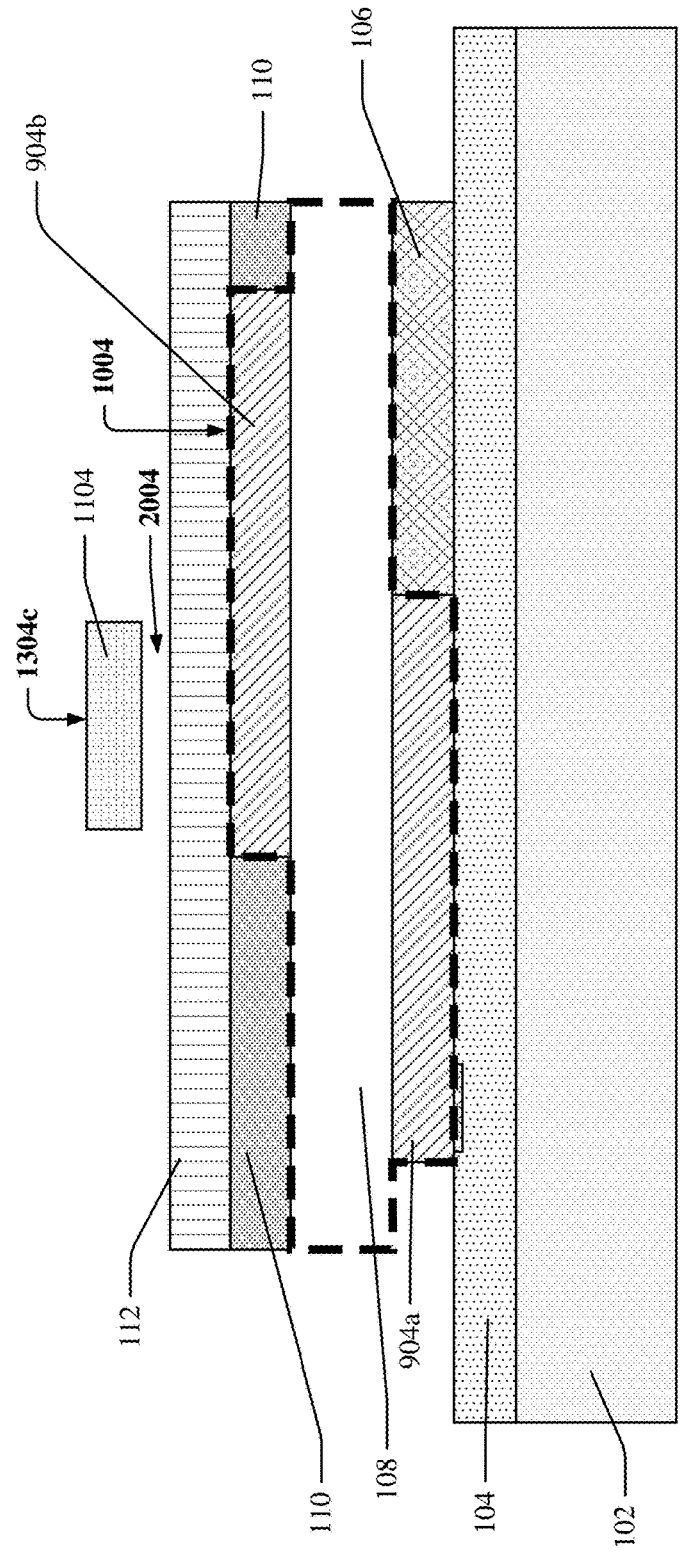
FIG. 20A
FIG. 20B

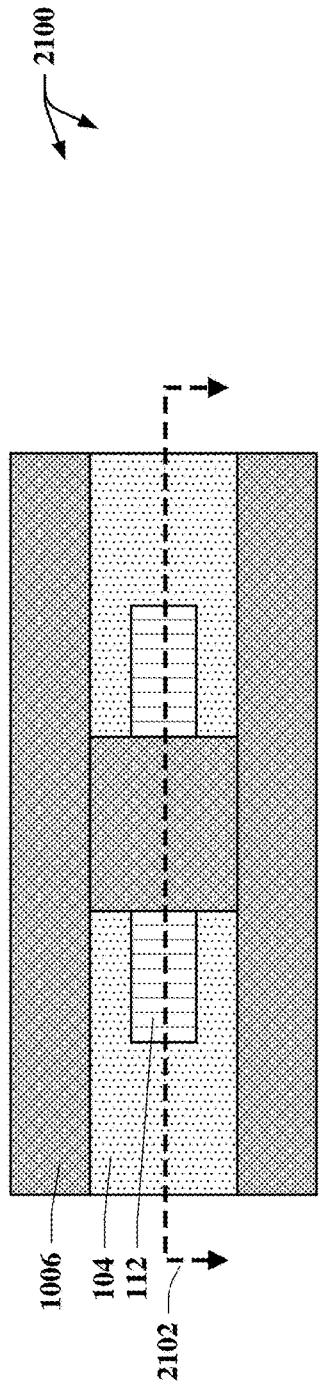
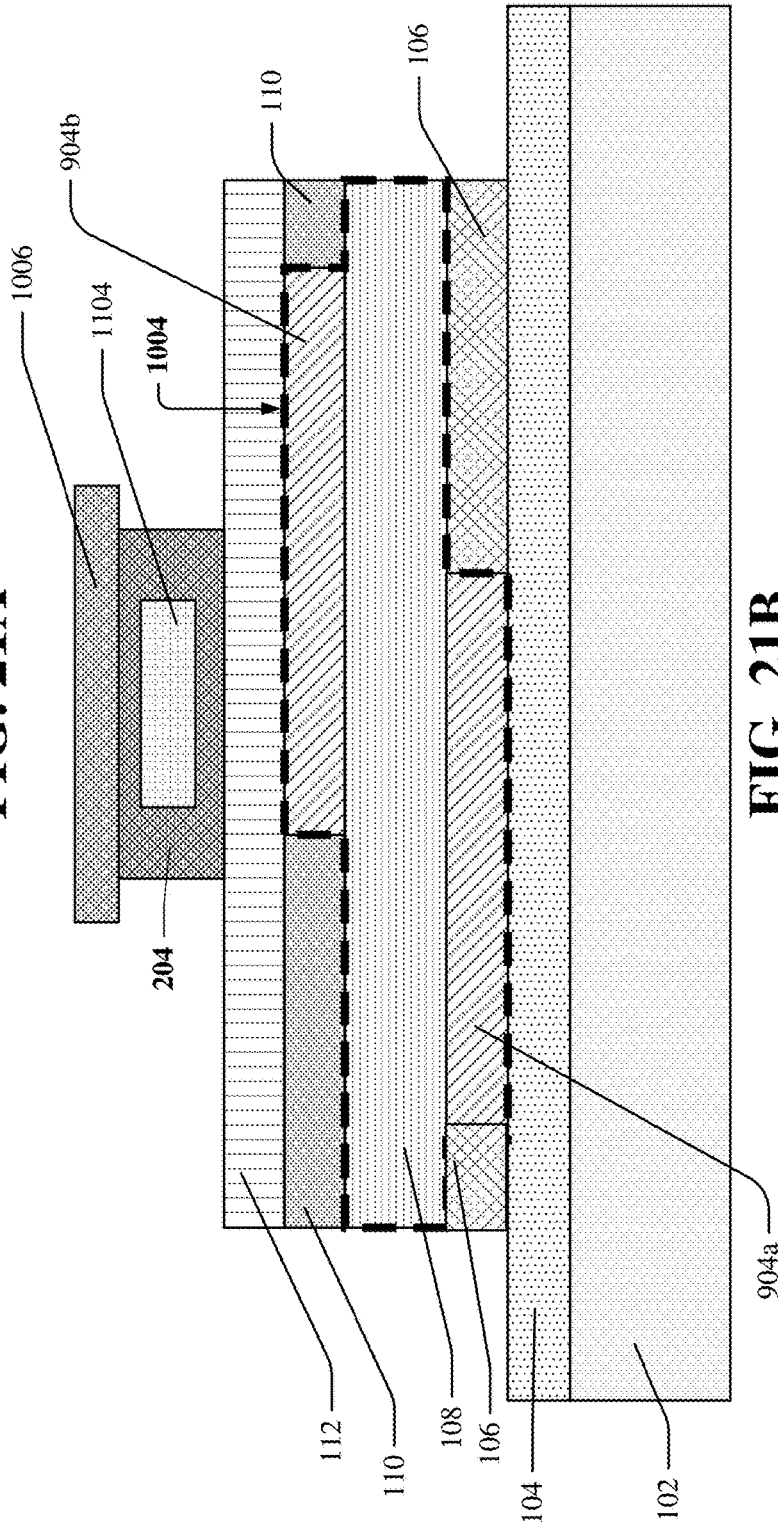
FIG. 21A
FIG. 21B

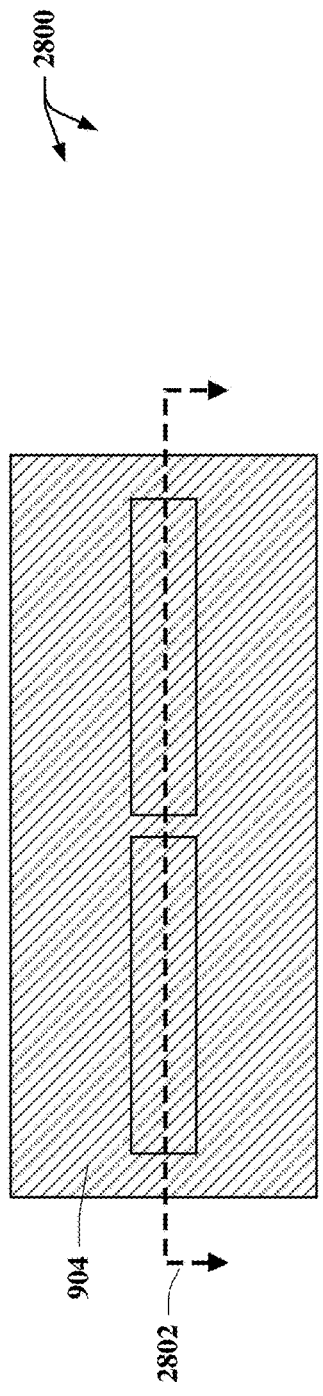
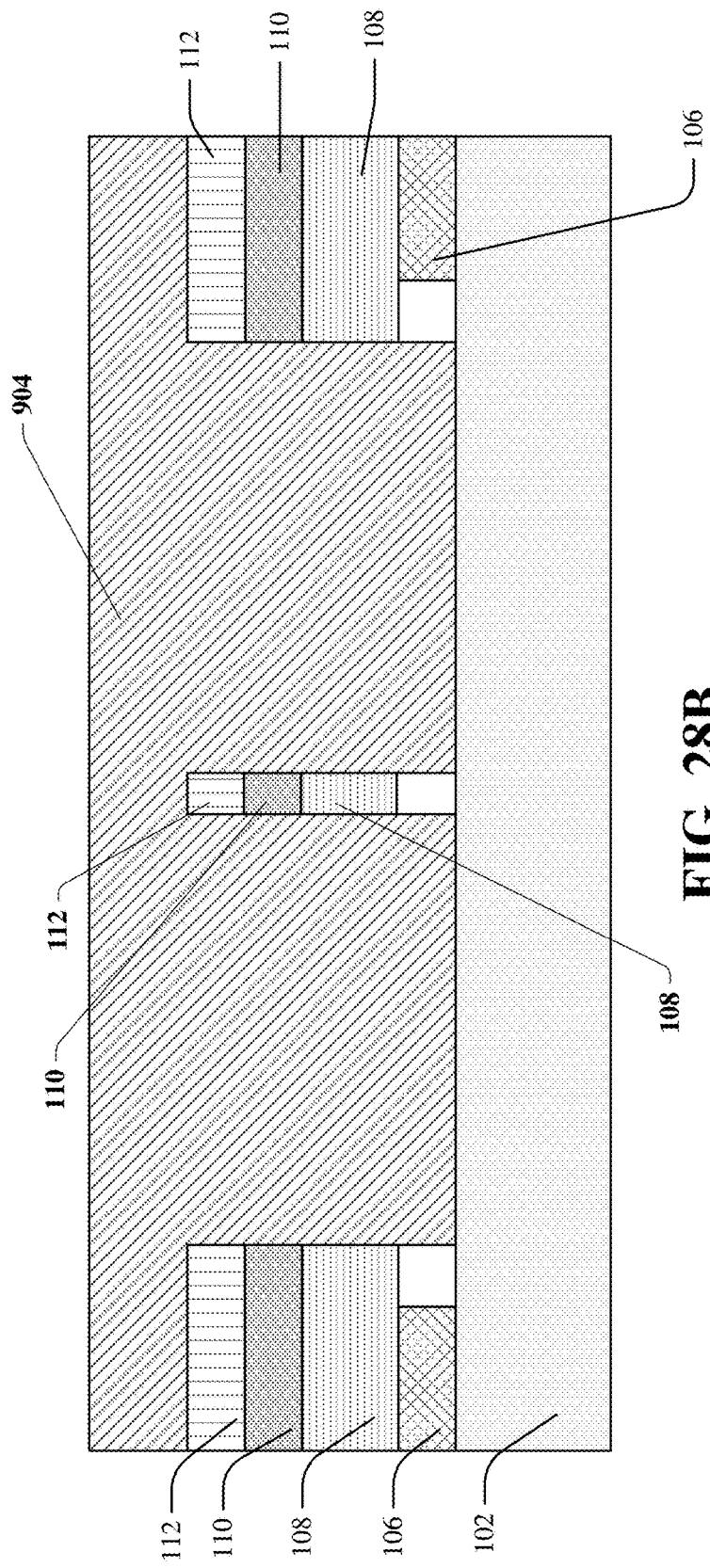
FIG. 28A
FIG. 28B

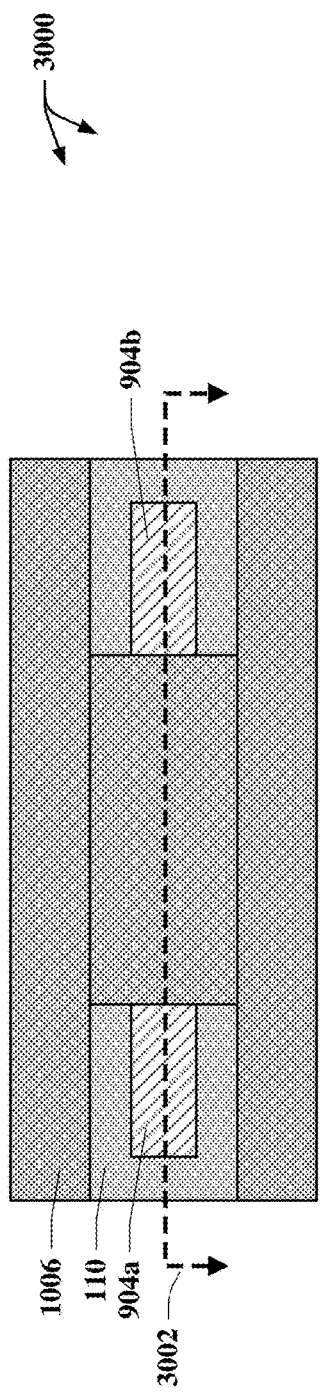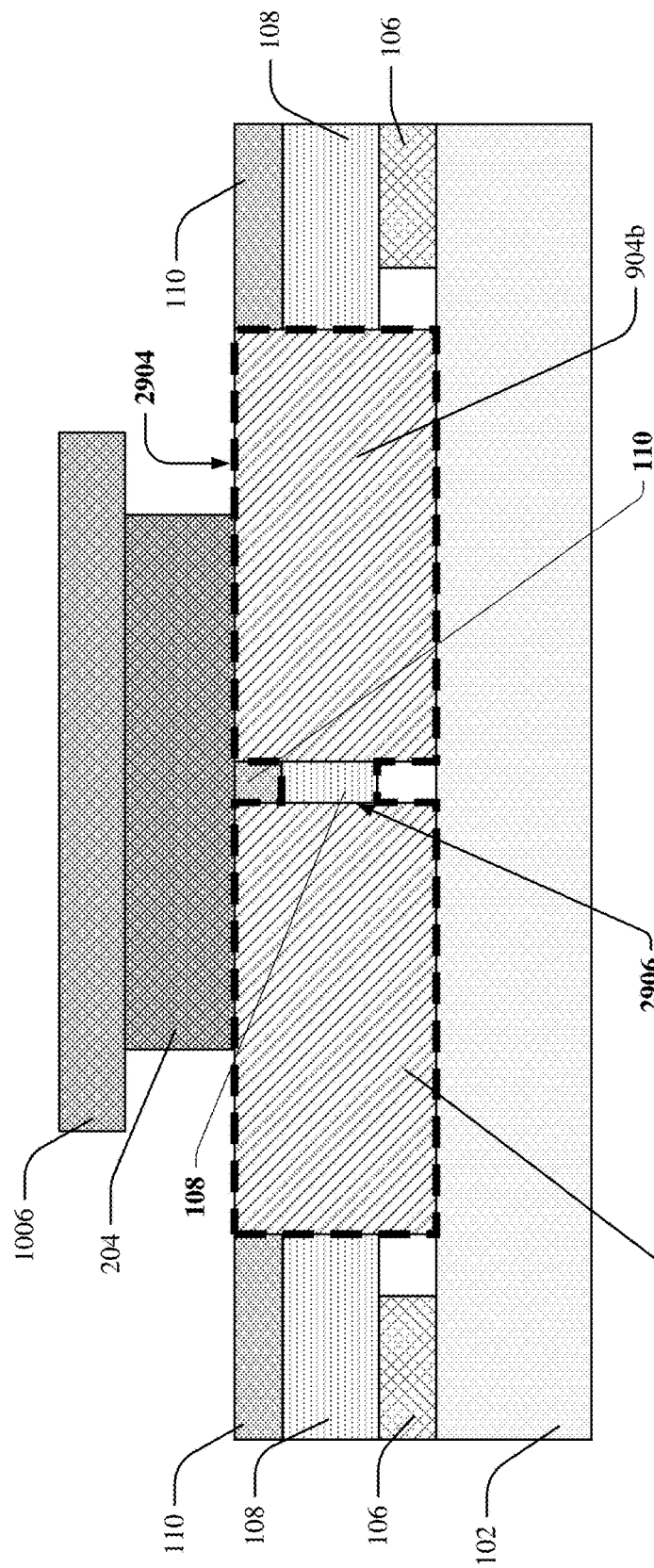
FIG. 30A
FIG. 30B

EPITAXIAL JOSEPHSON JUNCTION DEVICE

BACKGROUND

The subject disclosure relates to Josephson junction transmon devices and a method for forming the same. More specifically, the subject disclosure relates to an epitaxial Josephson junction transmon device and a method for forming the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, apparatus, and/or computer program products that facilitate an epitaxial Josephson junction transmon device are described.

According to an embodiment, a device can comprise a substrate. The device can further comprise an epitaxial Josephson junction transmon device coupled to the substrate.

According to an embodiment, a device can comprise an epitaxial Josephson junction transmon device coupled to a substrate. The device can further comprise a tuning gate coupled to the substrate and formed across the epitaxial Josephson junction transmon device.

According to an embodiment, a device can comprise a first superconducting region and a second superconducting region formed on a substrate. The device can further comprise an epitaxial Josephson junction tunneling channel coupled to the first superconducting region and the second superconducting region.

DESCRIPTION OF THE DRAWINGS

FIGS. 5A and 5B illustrate a top view and a cross-sectional view, respectively, of the example, non-limiting device of FIGS. 4A and 4B after selective removal of a portion of the first removable epitaxial layer of the device of FIGS. 4A and 4B and stripping the resist layer in accordance with one or more embodiments described herein.

FIGS. 6A and 6B illustrate a top view and a cross-sectional view, respectively, of the example, non-limiting device of FIGS. 5A and 5B after forming a resist layer on the device of FIGS. 5A and 5B in accordance with one or more embodiments described herein.

FIGS. 7A and 7B illustrate a top view and a cross-sectional view, respectively, of the example, non-limiting device of FIGS. 6A and 6B after selective removal of a portion of the second removable epitaxial layer of the device of FIGS. 6A and 6B and stripping the resist layer in accordance with one or more embodiments described herein.

FIGS. 9A and 9B illustrate a top view and a cross-sectional view, respectively, of the example, non-limiting device of FIGS. 8A and 8B after selectively depositing a superconducting material into one or more channels of the device of FIGS. 8A and 8B to form one or more superconducting regions of an epitaxial Josephson junction transmon device in accordance with one or more embodiments described herein.

FIGS. 11A and 11B illustrate a top view and a cross-sectional view, respectively, of the example, non-limiting device of FIGS. 10A and 10B after depositing a superconducting layer on the device of FIGS. 10A and 10B in accordance with one or more embodiments described herein.

FIGS. 12A and 12B illustrate a top view and a cross-sectional view, respectively, of the example, non-limiting device of FIGS. 11A and 11B after removing the lift off resist structure and portions of the superconducting layer to form conductive structures coupled to the epitaxial Josephson junction transmon device in accordance with one or more embodiments described herein.

FIGS. 13A and 13B illustrate a top view and a cross-sectional view, respectively, of the example, non-limiting device of FIGS. 12A and 12B after forming one or more additional conductive structures on the device of FIGS. 12A and 12B in accordance with one or more embodiments described herein.

FIGS. 15A and 15B illustrate a top view and a cross-sectional view, respectively, of the example, non-limiting device of FIGS. 14A and 14B after formation of a resist layer on the second mask layer of the device of FIGS. 14A and 14B in accordance with one or more embodiments described herein.

FIGS. 16A and 16B illustrate a top view and a cross-sectional view, respectively, of the example, non-limiting device of FIGS. 15A and 15B after removing one or more portions of the second mask layer from the device of FIGS.

15A and 15B and stripping the resist layer in accordance with one or more embodiments described herein.

FIGS. 17A and 17B illustrate a top view and a cross-sectional view, respectively, of the example, non-limiting device of FIGS. 16A and 16B after forming a lift off resist structure on the device of FIGS. 16A and 16B in accordance with one or more embodiments described herein.

Figure 18A:
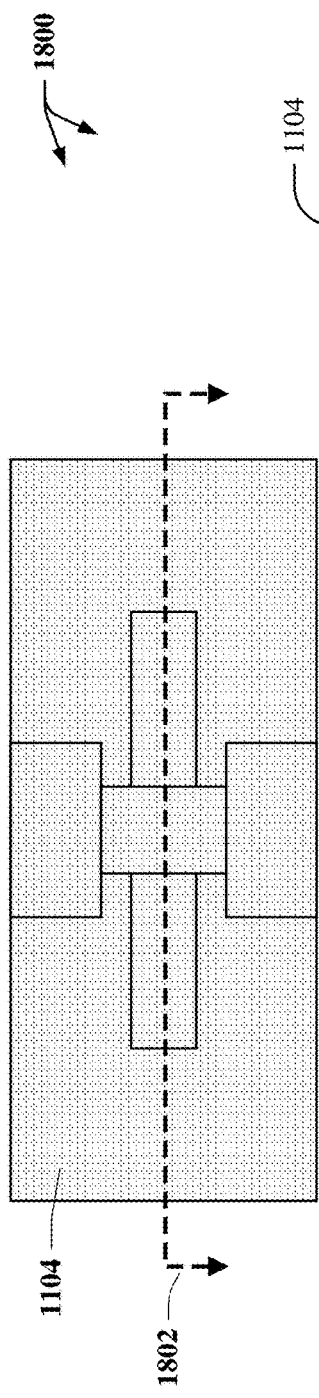
Figure 18B:
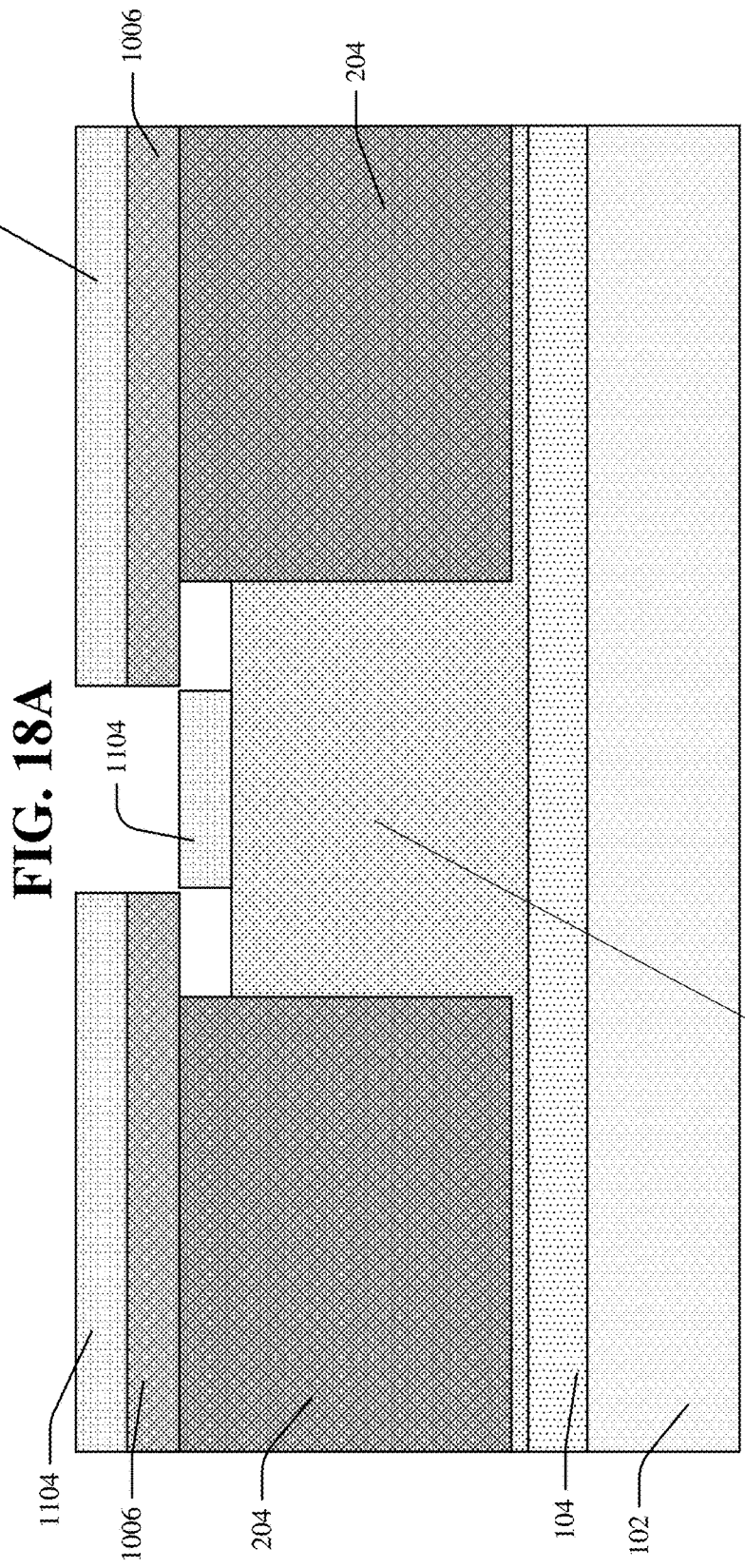

FIGS. 18A and 18B illustrate a top view and a cross-sectional view, respectively, of the example, non-limiting device of FIGS. 17A and 17B after depositing a superconducting layer on the lift off resist structure and the exposed surfaces of the device of FIGS. 17A and 17B in accordance with one or more embodiments described herein.

Figure 19A:
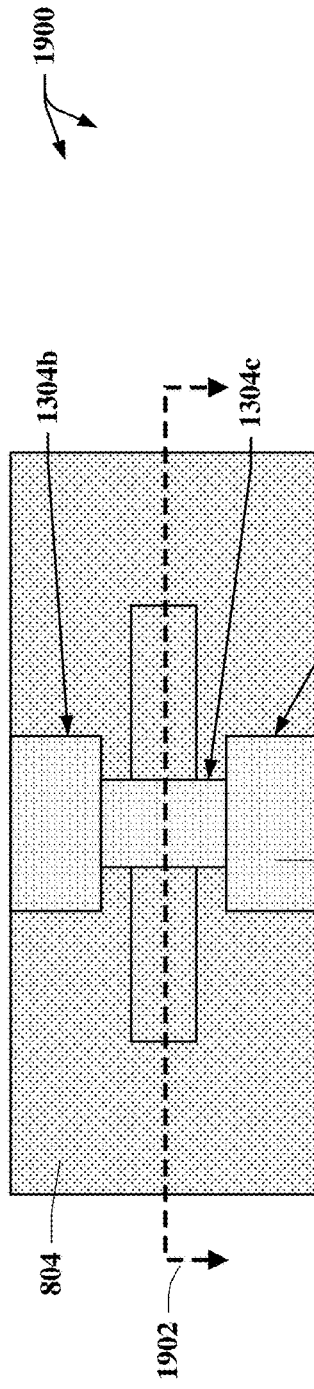
Figure 19B:
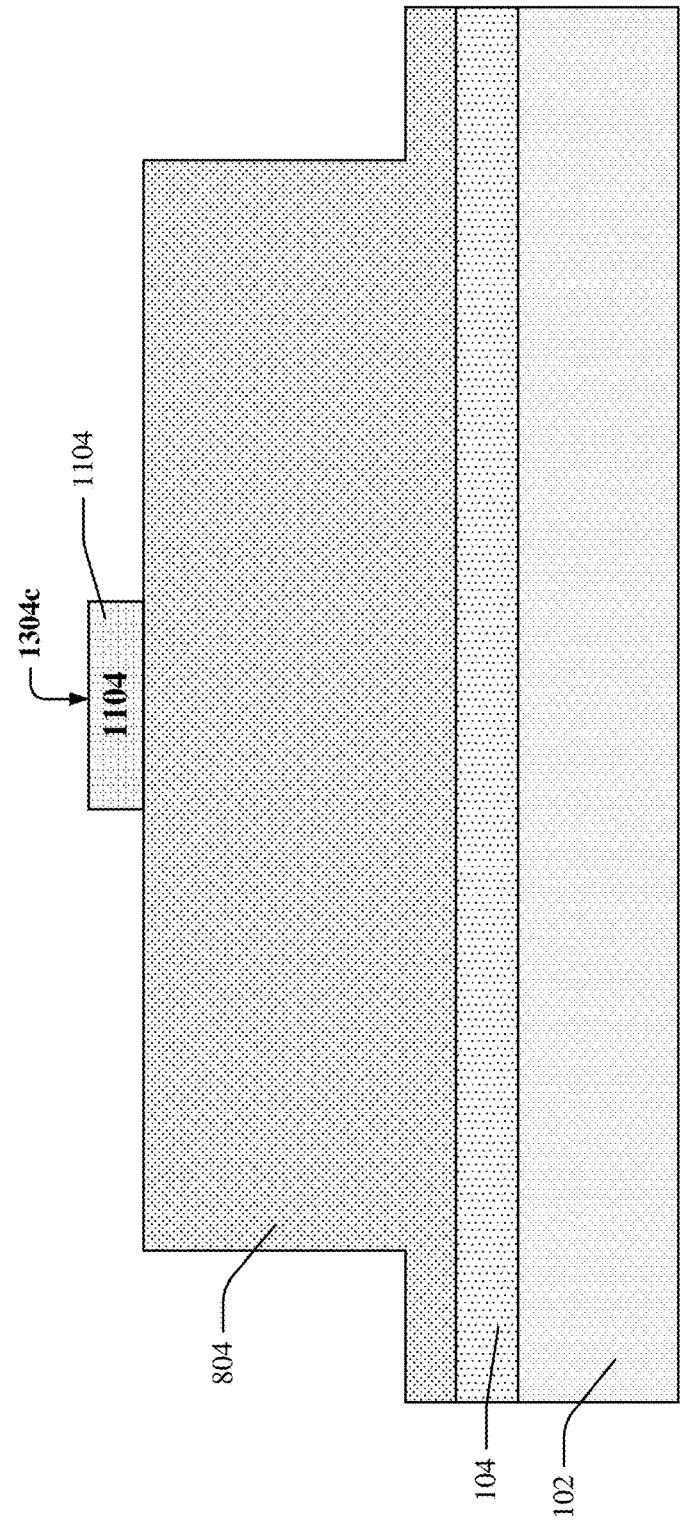

FIGS. 19A and 19B illustrate a top view and a cross-sectional view, respectively, of the example, non-limiting device of FIGS. 18A and 18B after removing the lift off resist structure and portions of the superconducting layer to form conductive structures in accordance with one or more embodiments described herein.

FIGS. 20A and 20B illustrate a top view and a cross-sectional view, respectively, of the example, non-limiting device of FIGS. 19A and 19B after removing both mask layers from the device of FIGS. 19A and 19B in accordance with one or more embodiments described herein.

FIGS. 21A and 21B illustrate a top view and a cross-sectional view, respectively, of the example, non-limiting device of FIGS. 20A and 20B after forming a lift off resist structure on the device of FIGS. 20A and 20B in accordance with one or more embodiments described herein.

Figure 22A:
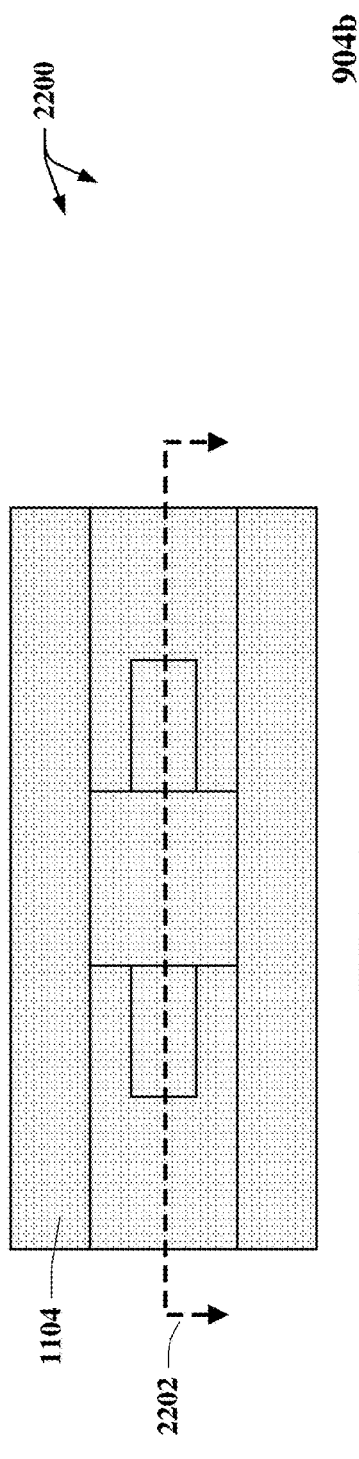
Figure 22B:
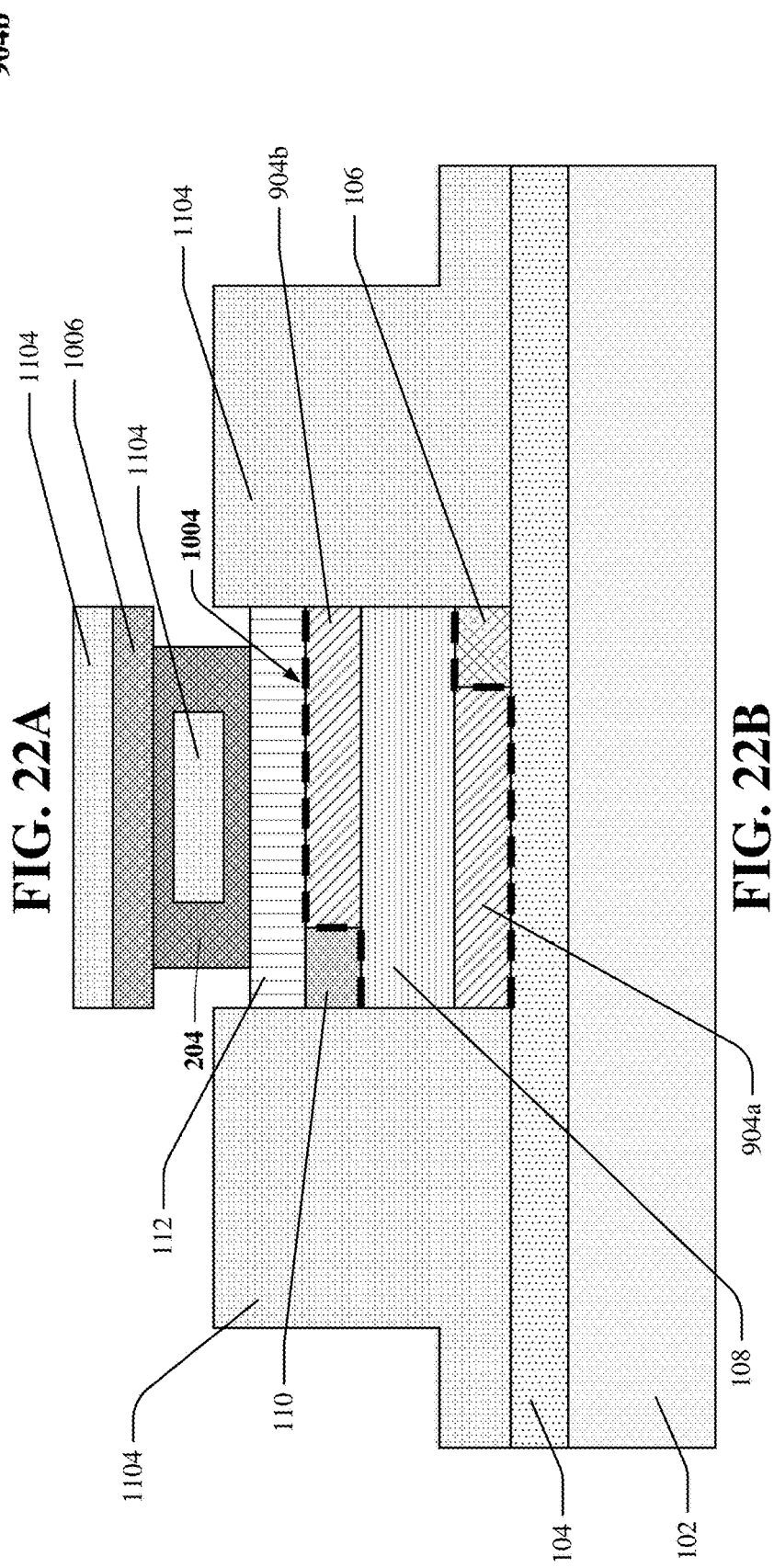

FIGS. 22A and 22B illustrate a top view and a cross-sectional view, respectively, of the example, non-limiting device of FIGS. 21A and 21B after depositing a superconducting layer on the device of FIGS. 21A and 21B in accordance with one or more embodiments described herein.

Figure 23A:
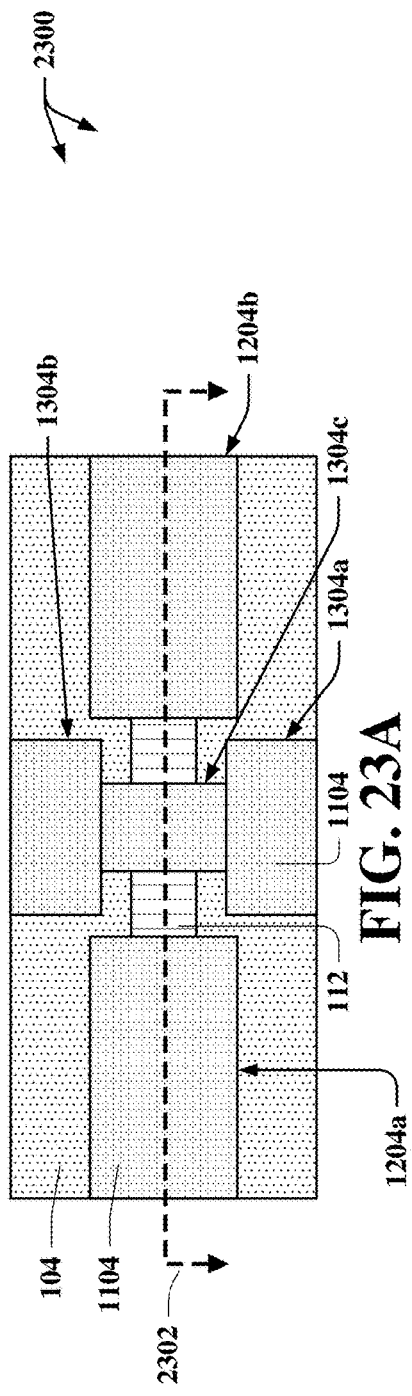
Figure 23B:
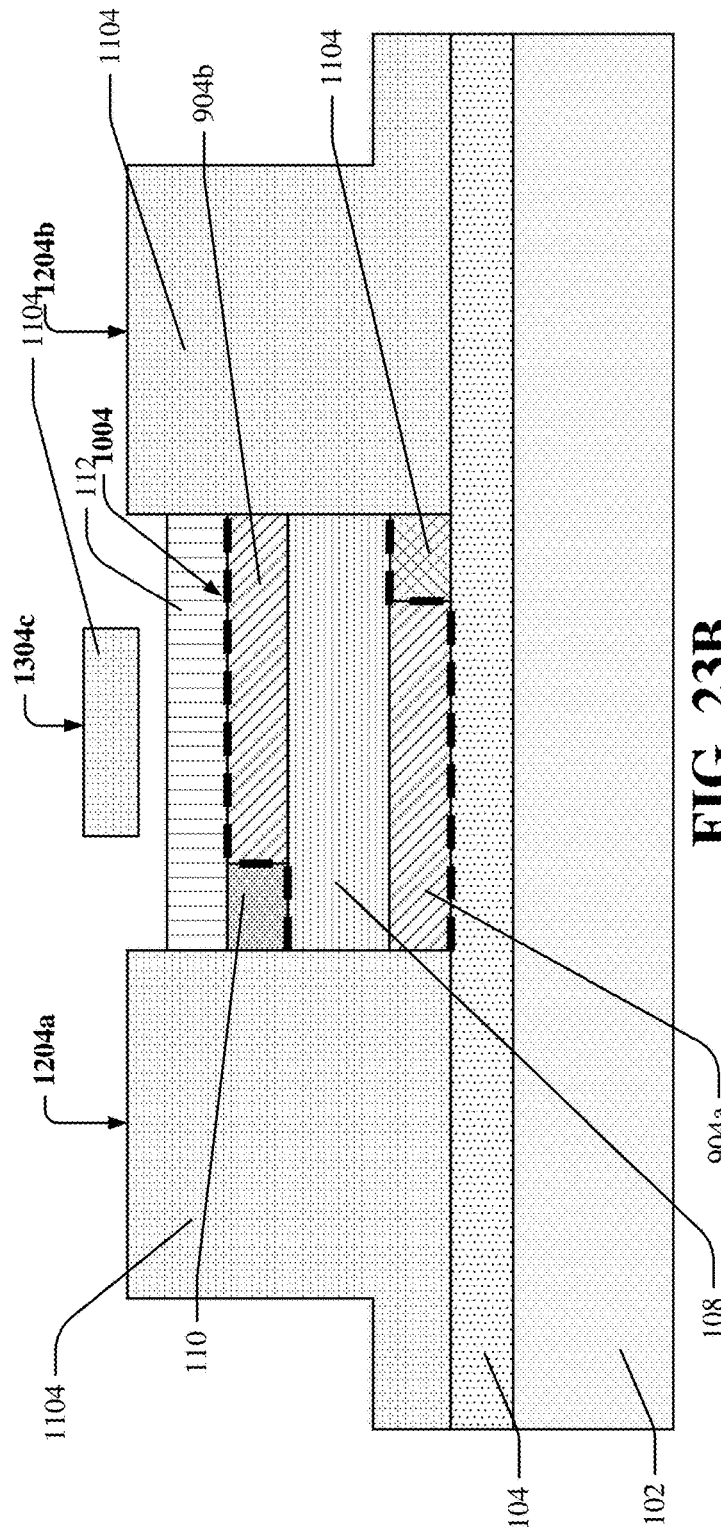

FIGS. 23A and 23B illustrate a top view and a cross-sectional view, respectively, of the example, non-limiting device of FIGS. 22A and 22B after removing the lift off resist structure and portions of the superconducting layer to form conductive structures coupled to the epitaxial Josephson junction transmon device in accordance with one or more embodiments described herein.

Figure 24:
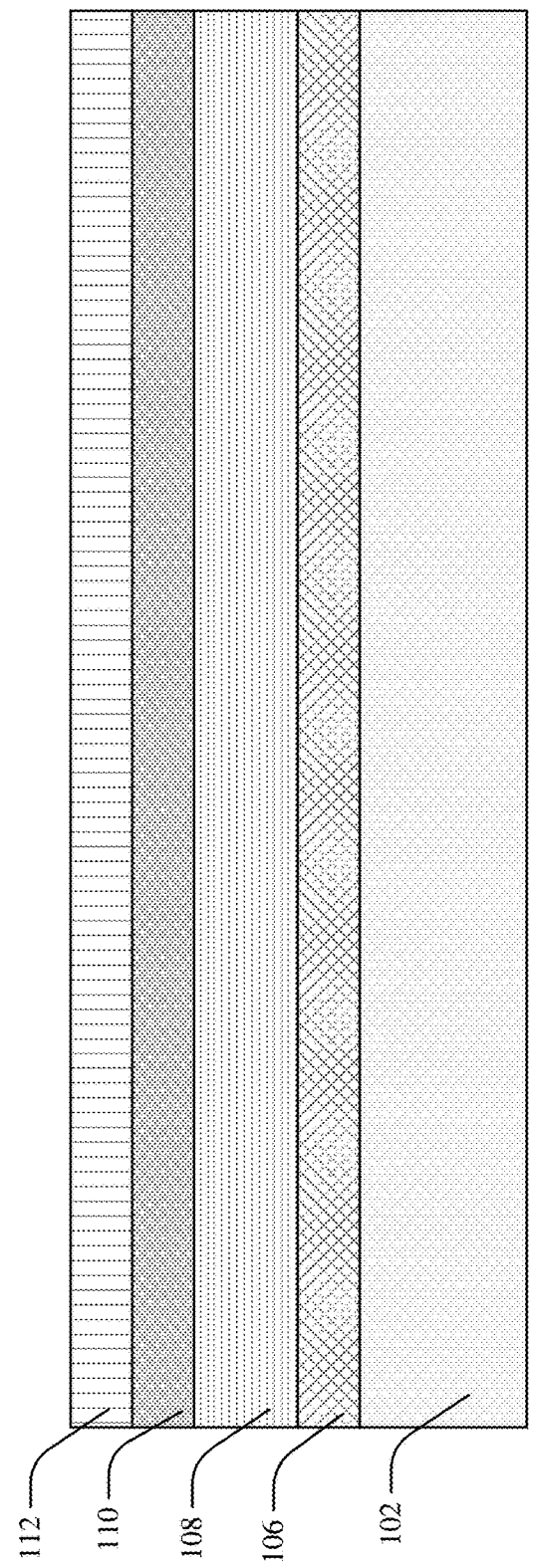

FIG. 24 illustrates a cross-sectional side view of an example, non-limiting device that can comprise multiple semiconductor layers formed on a substrate layer in accordance with one or more embodiments described herein.

Figure 25A:
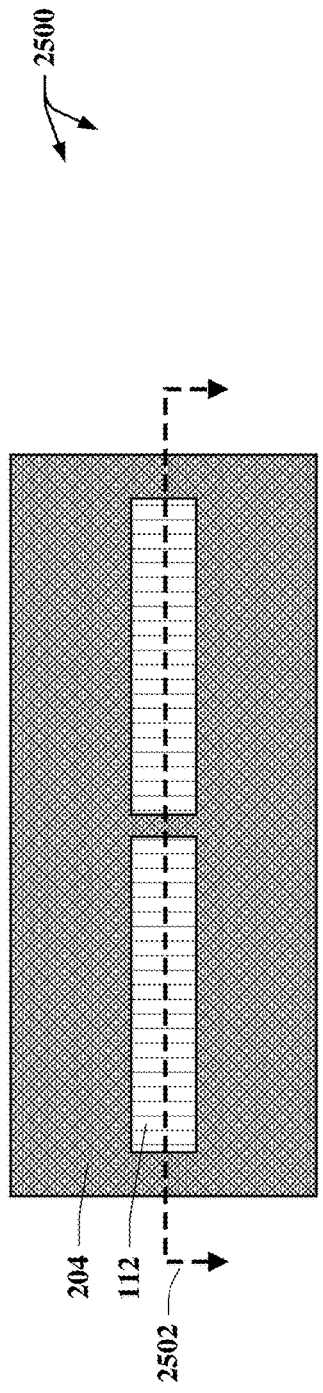
Figure 25B:
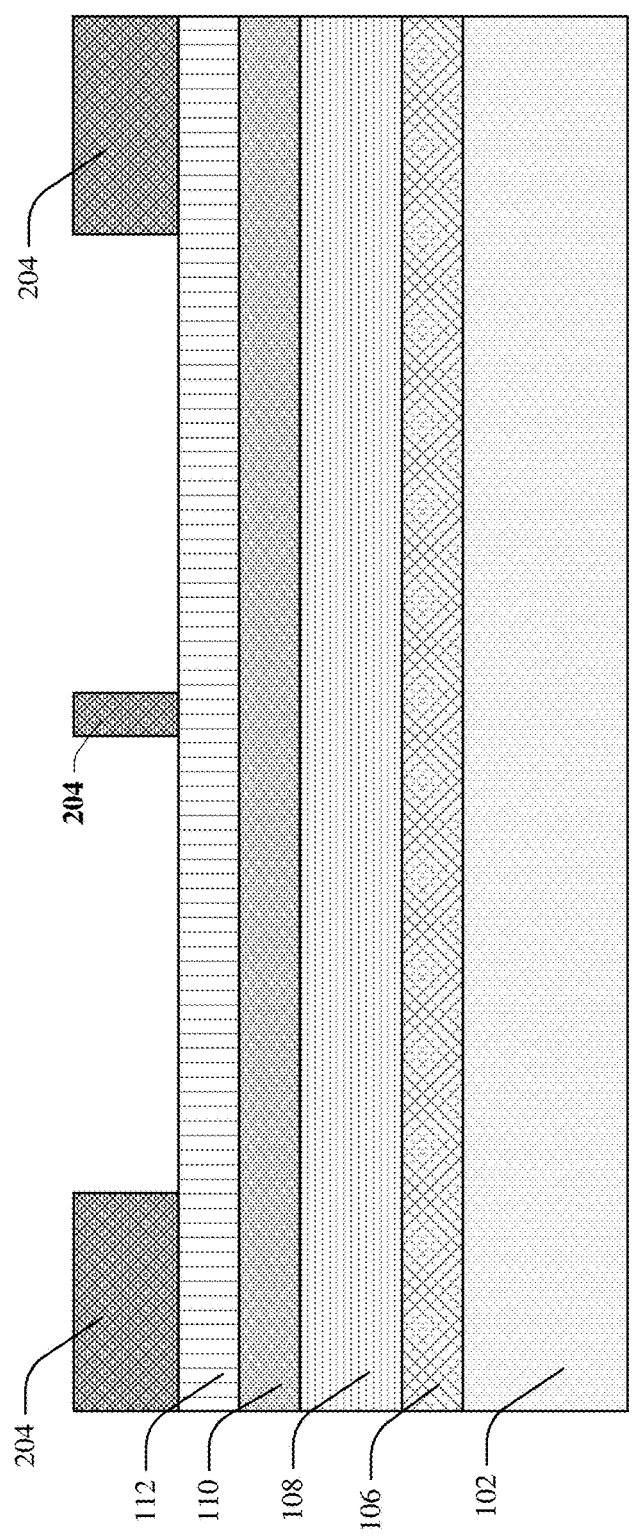

FIGS. 25A and 25B illustrate a top view and a cross-sectional view, respectively, of the example, non-limiting device of FIG. 24 after forming a resist layer on the cap layer of the device of FIG. 24 in accordance with one or more embodiments described herein.

Figure 26A:
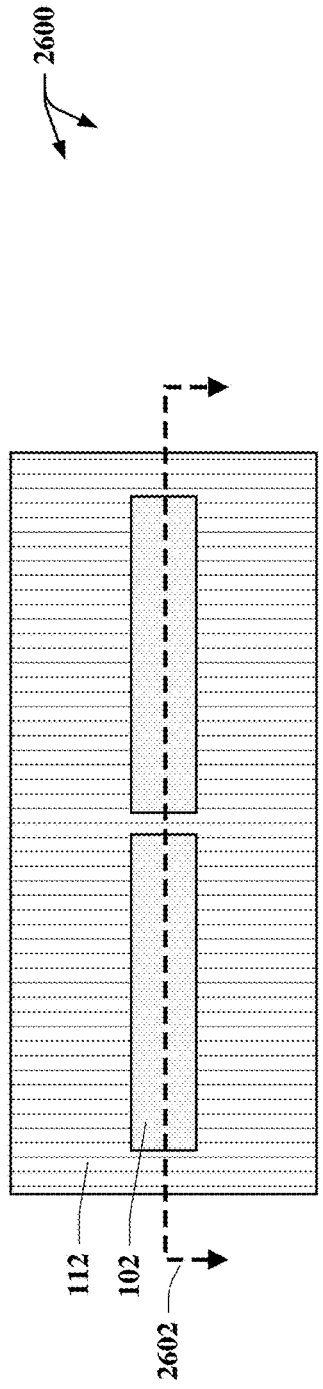
Figure 26B:
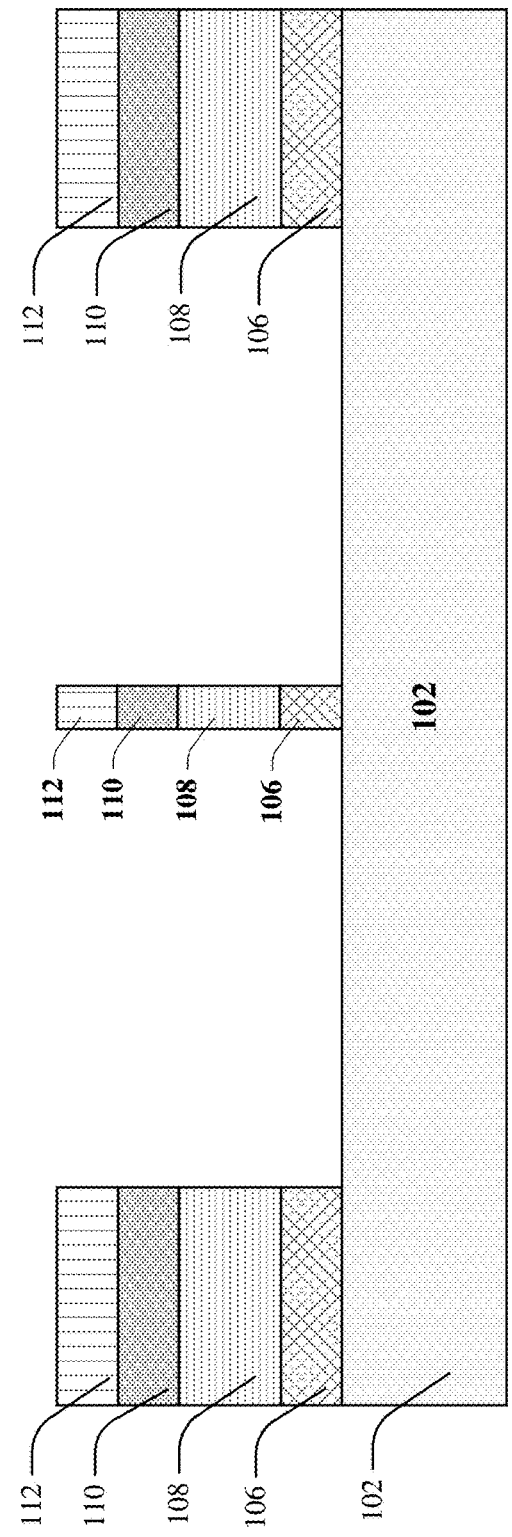

FIGS. 26A and 26B illustrate a top view and a cross-sectional view, respectively, of the example, non-limiting device of FIGS. 25A and 25B after removing portions of the first removable epitaxial layer, the epitaxial quantum well layer, the second removable epitaxial layer, and/or the cap layer of the device of FIGS. 25A and 25B and stripping the resist layer in accordance with one or more embodiments described herein.

Figure 27A:
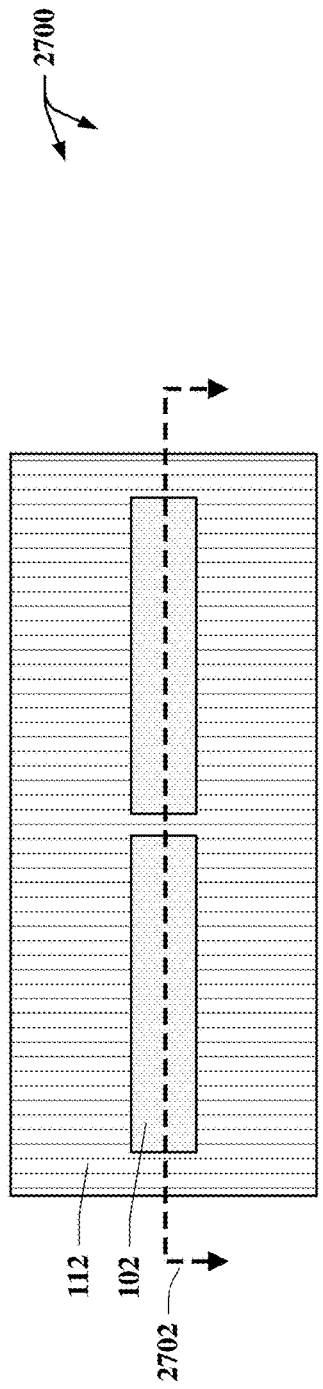
Figure 27B:
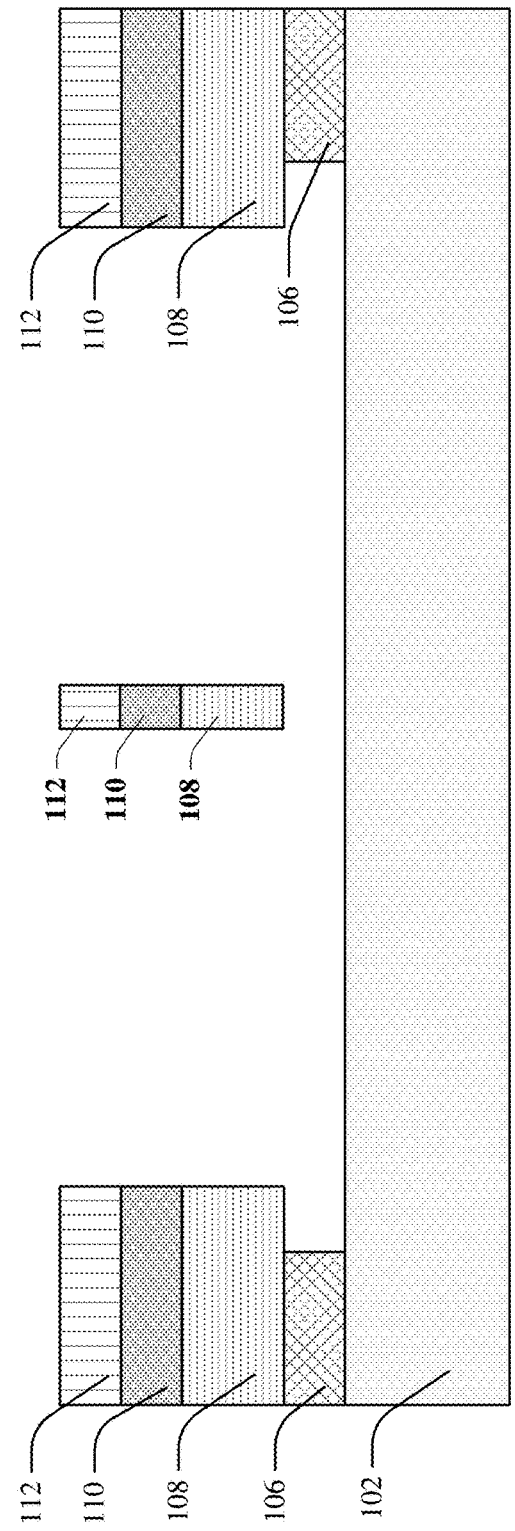

FIGS. 27A and 27B illustrate a top view and a cross-sectional view, respectively, of the example, non-limiting device of FIGS. 26A and 26B after removing additional portions of the first removable epitaxial layer of the device of FIGS. 26A and 26B in accordance with one or more embodiments described herein.

FIGS. 28A and 28B illustrate a top view and a cross-sectional view, respectively, of the example, non-limiting device of FIGS. 27A and 27B after depositing a superconducting material on the device of FIGS. 27A and 27B in accordance with one or more embodiments described herein.

Figure 29A:
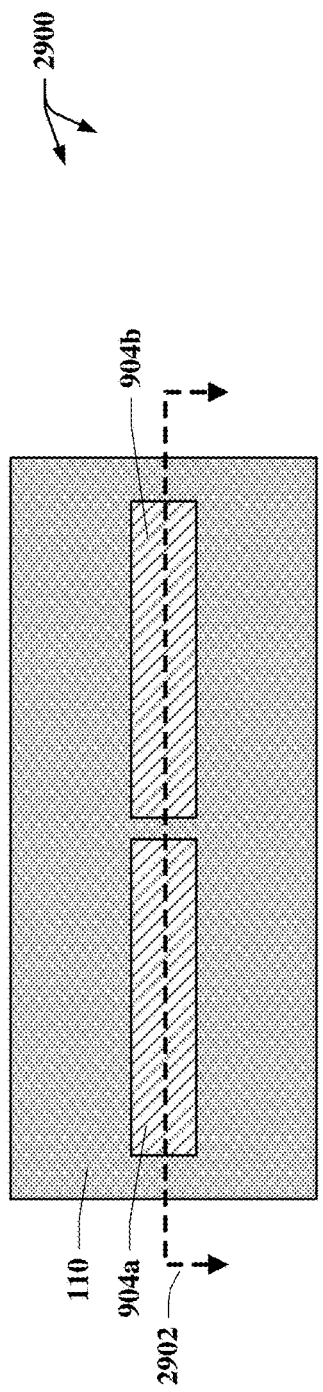
Figure 29B:
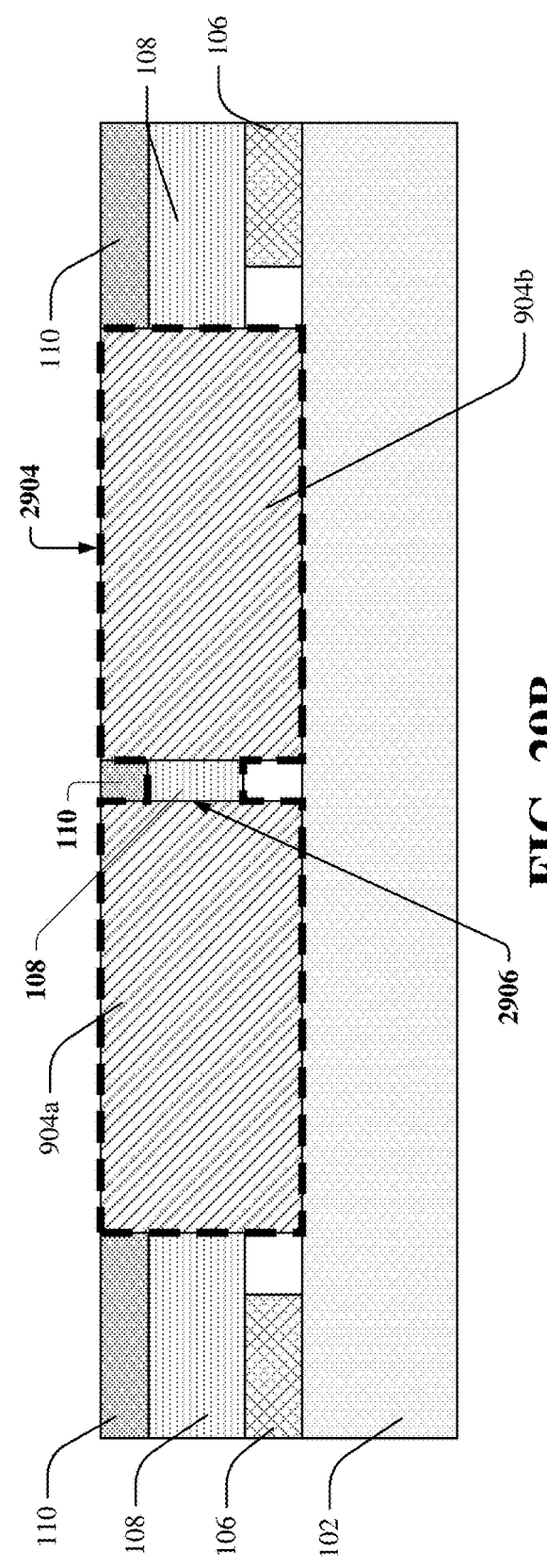

FIGS. 29A and 29B illustrate a top view and a cross-sectional view, respectively, of the example, non-limiting device of FIGS. 28A and 28B after removing portions of the superconducting material, all of the cap layer, and portions of the second removable epitaxial layer of the device of FIGS. 28A and 28B in accordance with one or more embodiments described herein.

FIGS. 30A and 30B illustrate a top view and a cross-sectional view, respectively, of the example, non-limiting device of FIGS. 29A and 29B after forming a lift off resist structure on the device of FIGS. 29A and 29B in accordance with one or more embodiments described herein.

Figure 31A:
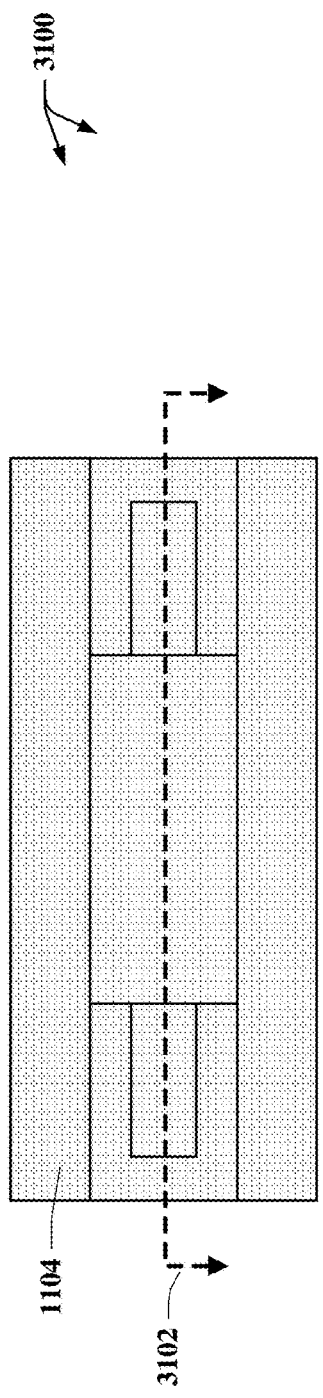
Figure 31B:
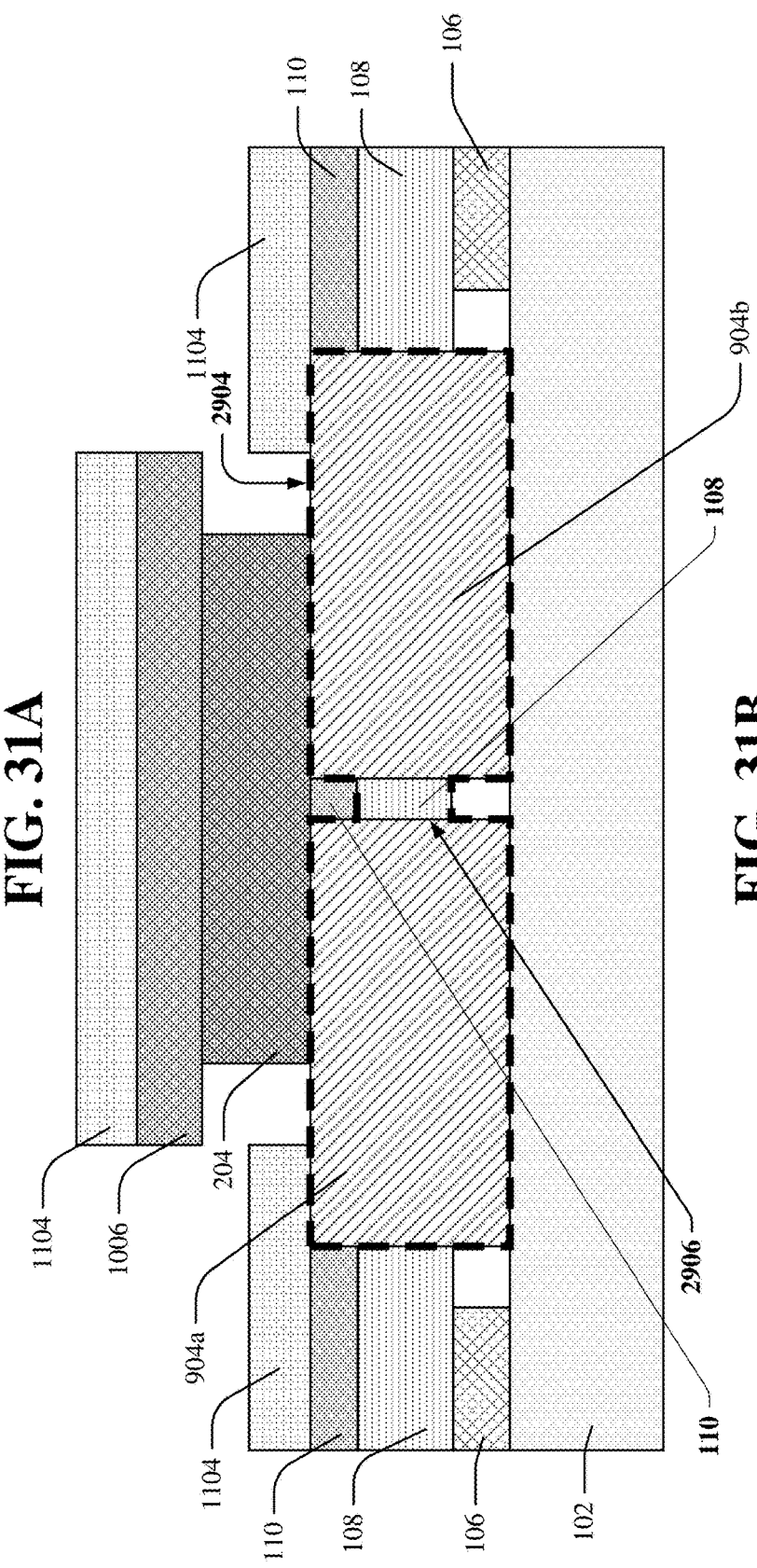

FIGS. 31A and 31B illustrate a top view and a cross-sectional view, respectively, of the example, non-limiting device of FIGS. 30A and 30B after depositing a superconducting layer on the device of FIGS. 30A and 30B in accordance with one or more embodiments described herein.

Figure 32A:
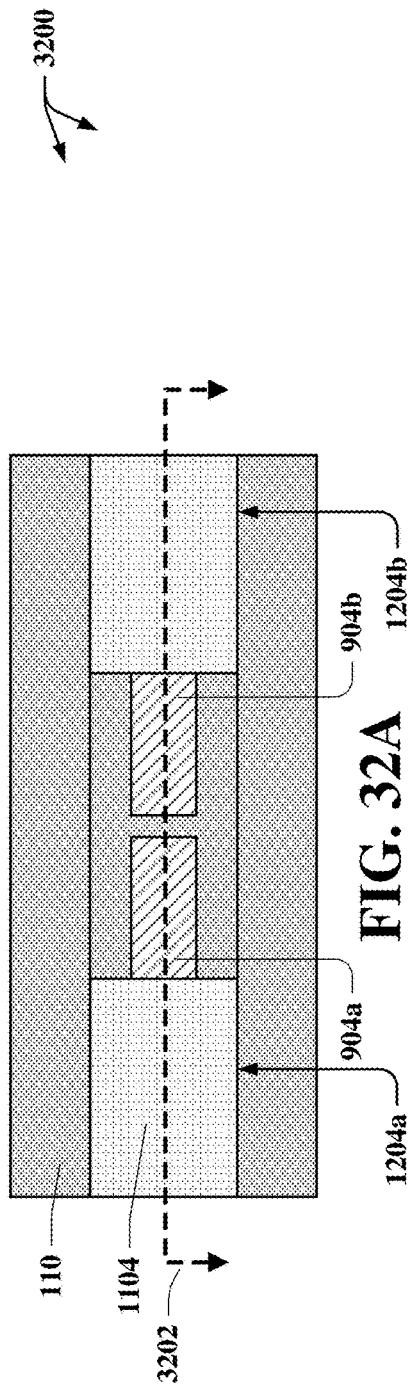
Figure 32B:
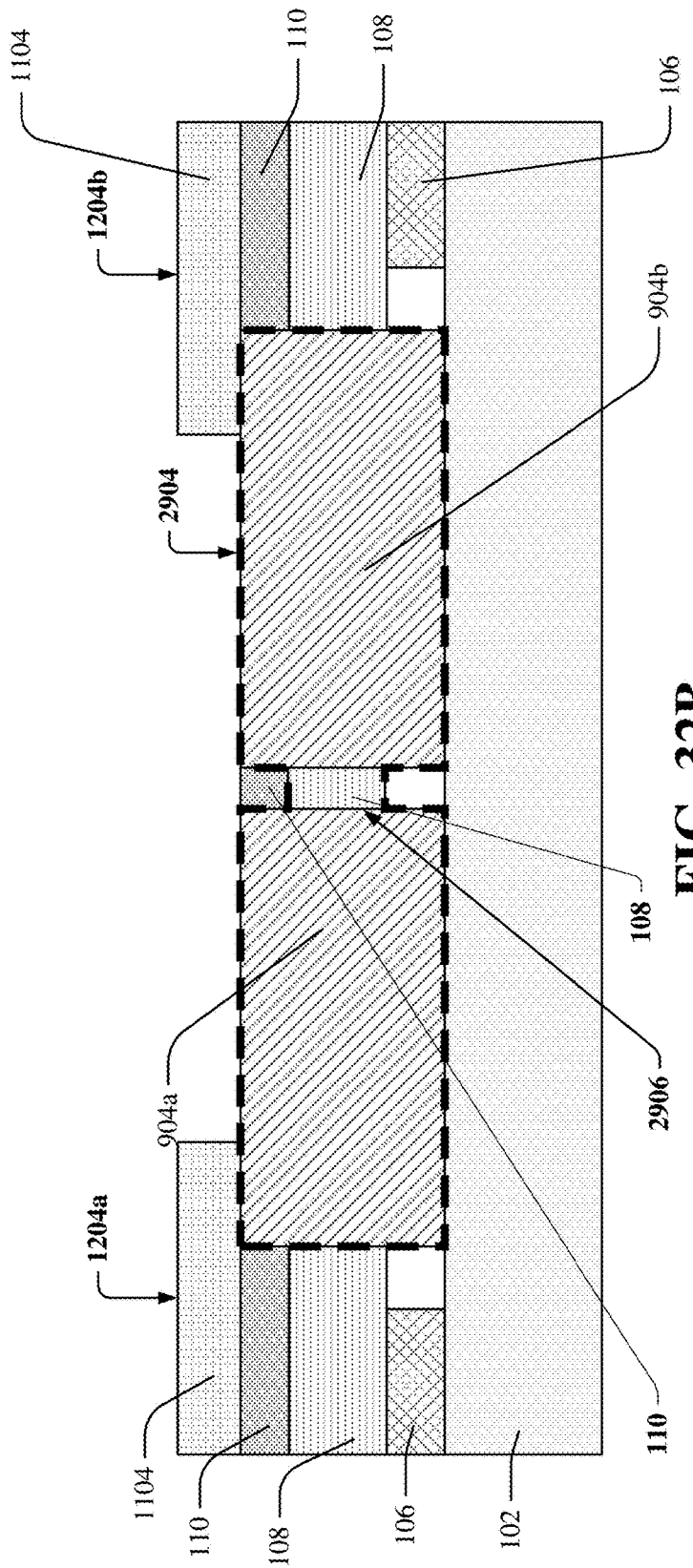

FIGS. 32A and 32B illustrate a top view and a cross-sectional view, respectively, of the example, non-limiting device of FIGS. 31A and 31B after removing the lift off resist structure and portions of the superconducting layer to form conductive structures coupled to the epitaxial Josephson junction transmon device in accordance with one or more embodiments described herein.

Figure 33A:
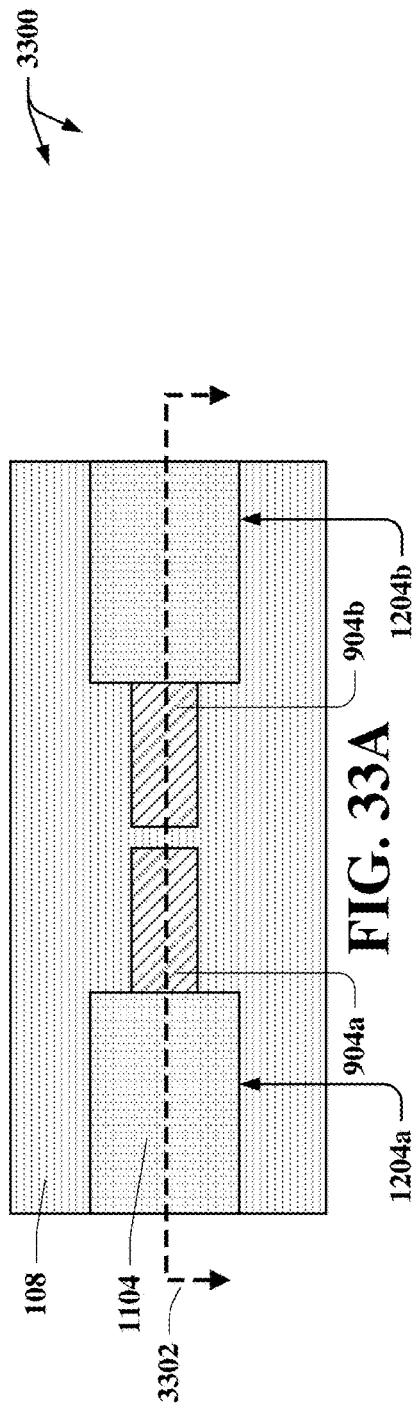
Figure 33B:
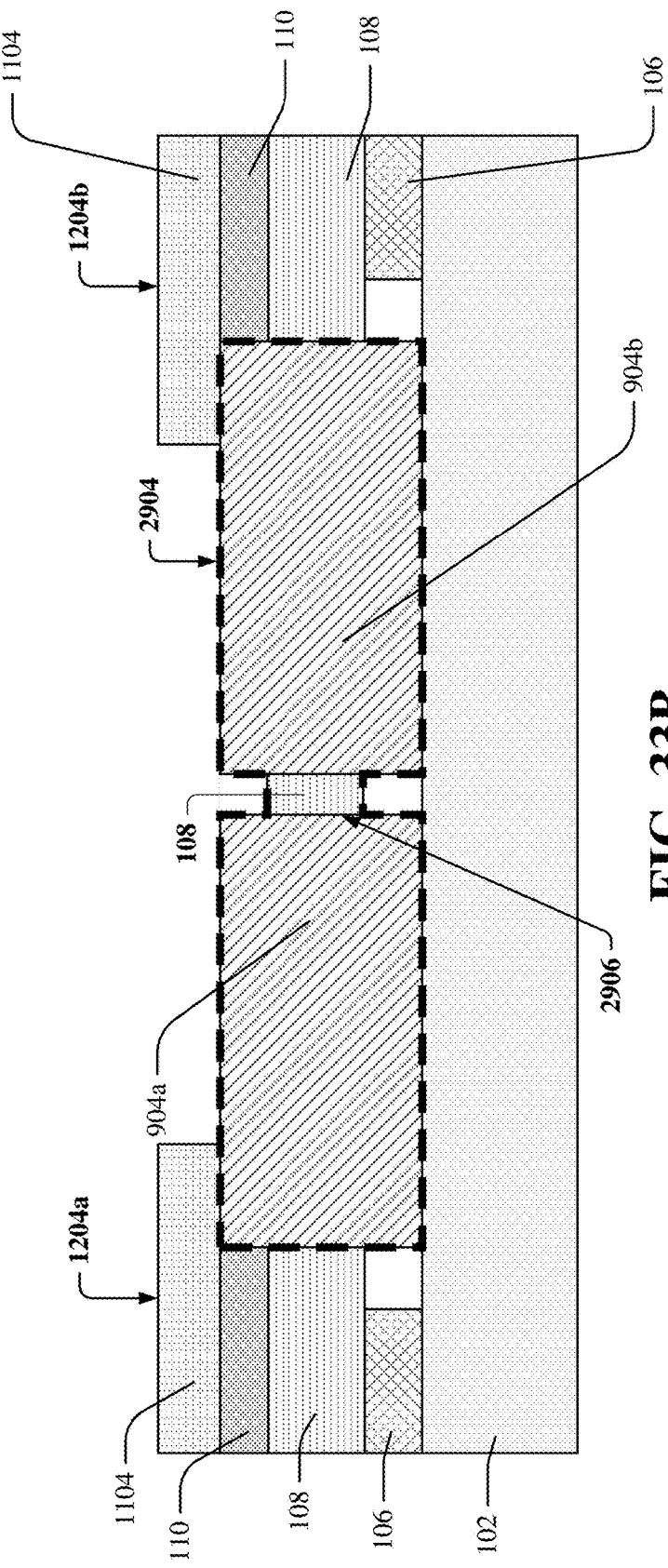

FIGS. 33A and 33B illustrate a top view and a cross-sectional view, respectively, of the example, non-limiting device of FIGS. 32A and 32B after removing most of the second removable epitaxial layer from the device of FIGS. 32A and 32B in accordance with one or more embodiments described herein.

Figure 34:
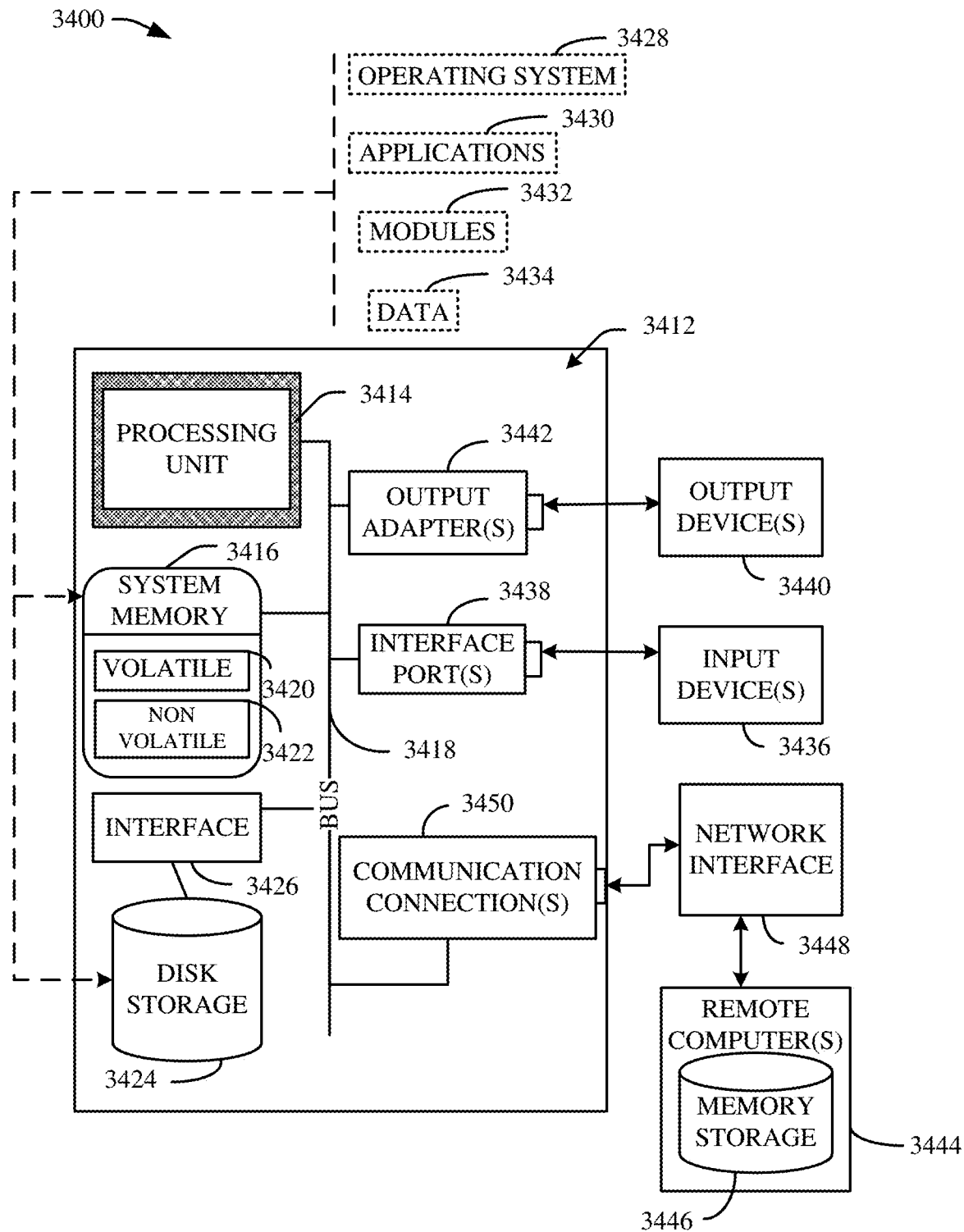

FIG. 34 illustrates a block diagram of an example, non-limiting operating environment in which one or more embodiments described herein can be facilitated.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

FIGS. 1-33B illustrate example, non-limiting multi-step fabrication sequences that can be implemented to fabricate one or more embodiments of the subject disclosure described herein and/or illustrated in the figures. For example, the non-limiting multi-step fabrication sequence illustrated in FIGS. 1-23B can be implemented to fabricate device 1200, device 1300, and/or device 2300, where device 1200 can comprise a semiconducting and superconducting device comprising an epitaxial Josephson junction transmon device 1004, and where device 1300 and device 2300 can comprise example, non-limiting alternative embodiments of device 1200. For instance, the non-limiting multi-step fabrication sequence illustrated in FIGS. 1-13B can be implemented to fabricate device 1200 and/or device 1300, where device 1300 can comprise an example, non-limiting alternative embodiment of device 1200. In another example, the non-limiting multi-step fabrication sequence illustrated in FIGS. 1-9B and FIGS. 14A-23B can be implemented to fabricate device 2300, where device 2300 can comprise an example, non-limiting alternative embodiment of device 1200. In another example, the non-limiting multi-step fabrication sequence illustrated in FIGS. 24-33B can be implemented to fabricate device 3200 and/or device 3300, where device 3200 can comprise a semiconducting and superconducting device comprising an epitaxial Josephson junction transmon device 2904, and where device 3300 can comprise an example, non-limiting alternative embodiment of device 3200.

In an example, devices 1200, 1300, and/or 2300 can be implemented in a quantum computing device (e.g., a quantum processor, a quantum computer, etc.), where epitaxial Josephson junction transmon device 1004 of device 1200, 1300, and/or 2300 can be implemented as a transmon quantum bit (qubit) in such a quantum computing device. In another example, devices 3200 and/or 3300 can be implemented in a quantum computing device (e.g., a quantum processor, a quantum computer, etc.), where epitaxial Josephson junction transmon device 2904 of device 3200 and/or 3300 can be implemented as a transmon qubit in such a quantum computing device.

As described below with reference to FIGS. 1-33B, fabrication of the various embodiments of the subject disclosure described herein and/or illustrated in the figures (e.g., epitaxial Josephson junction transmon device 1004 and/or 2904, device 1200, 1300, 2300, 3200, and/or 3300, etc.) can comprise multi-step sequences of, for example, photolithographic and/or chemical processing steps that facilitate gradual creation of electronic-based systems, devices, components, and/or circuits in a semiconducting and superconducting device (e.g., an integrated circuit). For instance, the various embodiments of the subject disclosure described herein and/or illustrated in the figures (e.g., epitaxial Josephson junction transmon device 1004 and/or 2904, device 1200, 1300, 2300, 3200, and/or 3300, etc.) can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

As described below with reference to FIGS. 1-33B, the various embodiments of the subject disclosure described herein and/or illustrated in the figures (e.g., epitaxial Josephson junction transmon device 1004 and/or 2904, device 1200, 1300, 2300, 3200, and/or 3300, etc.) can be fabricated using various materials. For example, the various embodiments of the subject disclosure described herein and/or illustrated in the figures (e.g., epitaxial Josephson junction transmon device 1004 and/or 2904, device 1200, 1300, 2300, 3200, and/or 3300, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

It will be understood that when an element as a layer (also referred to as a film), region, and/or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "coupled" to another element, it can describe one or more different types of coupling including, but not limited to, chemical coupling, communicative coupling, electrical coupling, physical coupling, operative coupling, optical coupling, thermal coupling, and/or another type of coupling.

Figure 1:
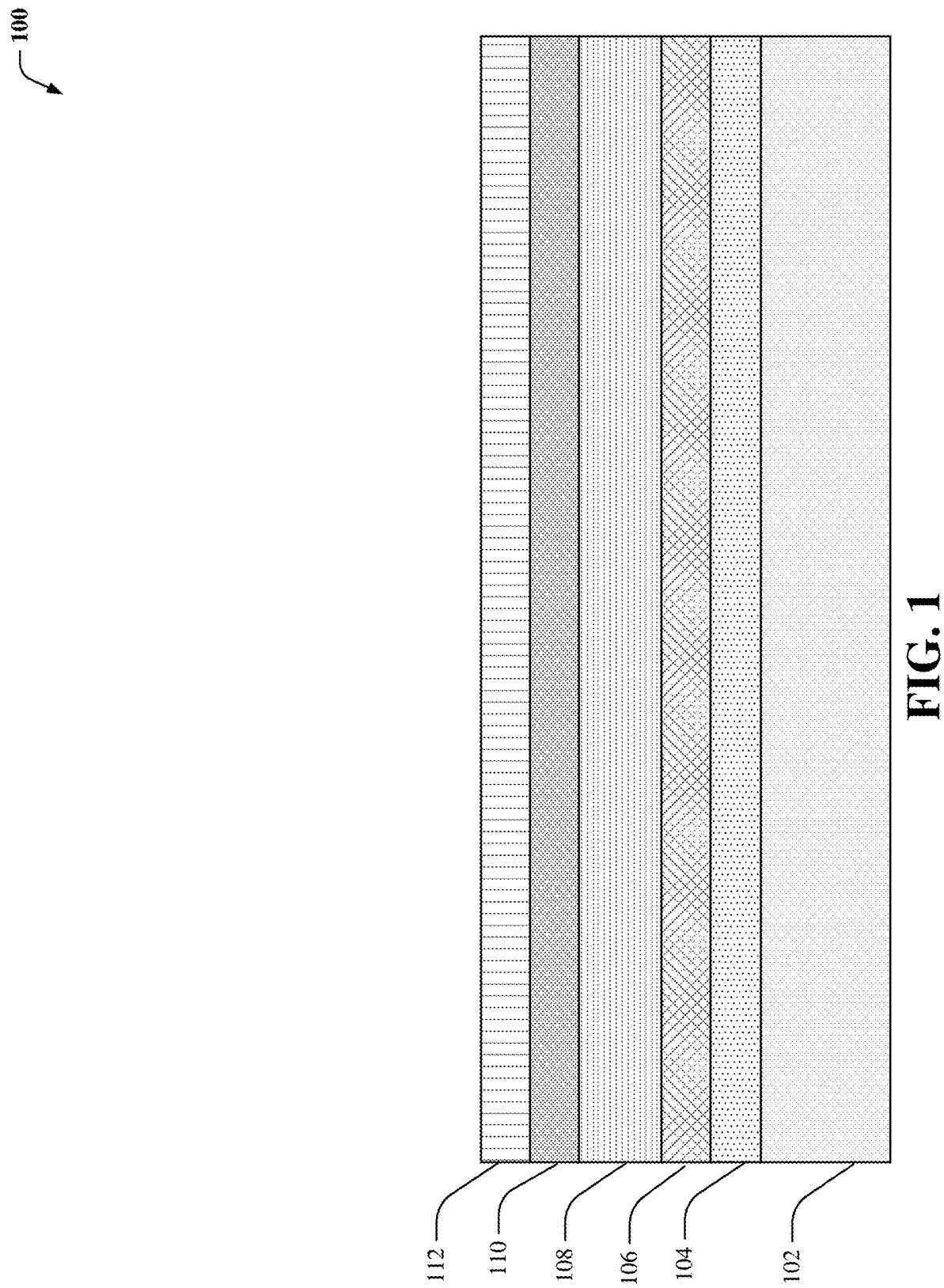
FIG. 1 illustrates a cross-sectional side view of an example, non-limiting device that can comprise multiple semiconductor layers formed on a substrate layer in accordance with one or more embodiments described herein.

FIG. 1 illustrates a cross-sectional side view of an example, non-limiting device 100 that can comprise multiple semiconductor layers formed on a substrate layer in accordance with one or more embodiments described herein. Such semiconductor layers can be formed on a substrate layer of device 100 as described below.

Device 100 can comprise a substrate 102. Substrate 102 can comprise any material having semiconductor properties including, but not limited to, silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, and/or another material. In some embodiments, substrate 102 can comprise a layered semiconductor including, but not limited to, silicon/silicon-germanium (Si/SiGe), silicon/silicon carbide (Si/SiC), silicon-on-insulators (SOIs), silicon germanium-on-insulators (SGOIs), and/or another layered semiconductor. Substrate 102 can comprise a thickness (e.g., height) ranging from approximately 50 micrometers (μm) to approximately 750 μm.

Device 100 can further comprise one or more semiconductor layers that can comprise one or more epitaxial films formed (e.g., grown) on substrate 102. For example, device 100 can comprise a buffer layer 104 formed on substrate 102, where buffer layer 104 can comprise an epitaxial film. In some embodiments, buffer layer 104 is not formed on substrate 102. In another example, device 100 can comprise a first removable epitaxial layer 106 formed on buffer layer 104 and/or substrate 102 (e.g., in embodiments where buffer layer 104 is not formed on substrate 102). In another example, device 100 can comprise an epitaxial quantum well layer 108 formed on first removable epitaxial layer 106. In another example, example, device 100 can comprise a second removable epitaxial layer 110 formed on epitaxial quantum well layer 108.

In some embodiments, buffer layer 104, first removable epitaxial layer 106, epitaxial quantum well layer 108, and/or second removable epitaxial layer 110 can each comprise an epitaxial film comprising a certain composition of silicon-germanium (SiGe). For example, buffer layer 104, first removable epitaxial layer 106, epitaxial quantum well layer 108, and/or second removable epitaxial layer 110 can each comprise an epitaxial film comprising a certain composition of silicon-germanium (SiGe), where the amount of germanium (Ge) in such a certain composition of silicon-germanium (SiGe) can be approximately equal to or greater than 30 percent (30%). In other embodiments, buffer layer 104, first removable epitaxial layer 106, epitaxial quantum well layer 108, and/or second removable epitaxial layer 110 can each comprise an epitaxial film comprising a composition of silicon-germanium (SiGe) that is different from that of one or more of the other epitaxial films. For example, in an embodiment, first removable epitaxial layer 106 can comprise an epitaxial film comprising a first composition of silicon-germanium (SiGe) and second removable epitaxial layer 110 can comprise an epitaxial film comprising a second composition of silicon-germanium (SiGe) that is different from that of the first composition of silicon-germanium (SiGe) in first removable epitaxial layer 106.

Buffer layer 104, first removable epitaxial layer 106, epitaxial quantum well layer 108, and/or second removable epitaxial layer 110 defined above that can comprise epitaxial films can be grown on substrate 102 using an epitaxial film growth process (e.g., epitaxial deposition) performed in an epitaxial growth furnace. For example, buffer layer 104, first removable epitaxial layer 106, epitaxial quantum well layer 108, and/or second removable epitaxial layer 110 can be grown on substrate 102 together in situ during the same fabrication phase (e.g., in situ epitaxial film growth performed in an epitaxial growth furnace).

Utilizing such an in situ epitaxial film growth process to grow buffer layer 104, first removable epitaxial layer 106, epitaxial quantum well layer 108, and/or second removable epitaxial layer 110 on substrate 102 in such a manner can facilitate desirable crystallinity of each layer (film), as well as prevent oxidation and/or defects at the interfaces between each of such layers (e.g., at the interfaces between buffer layer 104, first removable epitaxial layer 106, epitaxial quantum well layer 108, and/or second removable epitaxial layer 110) and/or at the interface between buffer layer 104 or substrate 102 and first removable epitaxial layer 106. Utilizing such an in situ epitaxial film growth process to grow buffer layer 104, first removable epitaxial layer 106, epitaxial quantum well layer 108, and/or second removable epitaxial layer 110 on substrate 102 in such a manner can further facilitate repeatable fabrication of each of such layers to a desirable dimension (e.g., height, thickness, etc.). Such repeatable fabrication of each of such layers to a desirable dimension (e.g., height, thickness, etc.) can facilitate: improved consistency of the desirable dimension in a plurality of epitaxial Josephson junction transmon devices fabricated using such an in situ epitaxial film growth process; and/or improved coherence time, improved performance, and/or improved lifespan of an epitaxial Josephson junction transmon device fabricated using such an in situ epitaxial film growth process.

In an example, as described below, first removable epitaxial layer 106, epitaxial quantum well layer 108, and/or second removable epitaxial layer 110 defined above can be formed into epitaxial Josephson junction transmon device 1004 of device 1200, 1300, and/or 2300. In another example, as described below, first removable epitaxial layer 106, epitaxial quantum well layer 108, and/or second removable epitaxial layer 110 defined above can be formed into epitaxial Josephson junction transmon device 2904 of device 3200 and/or 3300. In these examples, epitaxial quantum well layer 108 can comprise an active layer.

Buffer layer 104, an epitaxial semiconductor, can be epitaxially grown on substrate 102. Material for buffer layer 104 can be selected based on the composition of substrate 102 and first removable epitaxial layer 106. In one embodiment, buffer layer 104 can be formed using a certain composition of silicon-germanium (SiGe), to match the crystal lattice of adjacent first removable epitaxial layer 106. In one embodiment, buffer layer 104 can comprise a gradual change in composition from substrate 102 to first removable epitaxial layer 106 to avoid creating crystal defects (e.g. dislocations) in first removable epitaxial layer 106. In one embodiment, the gradual change in composition can be a linear change. For example, if substrate 102 comprises silicon (Si) and first removable epitaxial layer 106 comprises a certain composition of silicon-germanium (SiGe), buffer layer 104 can begin with silicon (Si) at the interface with substrate 102, and the amount of germanium (Ge) can gradually increase towards the interface of buffer layer 104 and first removable epitaxial layer 106 to match the composition of silicon-germanium (SiGe) of first removable epitaxial layer 106. These examples of materials are not intended to be limiting. From this disclosure those of ordinary skill in the art will be able to conceive of many other materials suitable for forming buffer layer 104 and the same are contemplated within the scope of the illustrative embodiments. Buffer layer 104 can comprise a thickness (e.g., height) ranging from approximately 10 nanometers (nm) to approximately 1,000 nm.

First removable epitaxial layer 106, an epitaxial semiconductor, can be epitaxially grown on buffer layer 104 and/or substrate 102 (e.g., in embodiments where buffer layer 104 is not formed on substrate 102). Materials for first removable epitaxial layer 106 can be selected based on the composition of epitaxial quantum well layer 108, to provide crystal quality above a particular quality threshold. In one embodiment, first removable epitaxial layer 106 can be formed using a certain composition of silicon-germanium (SiGe), to match the crystal lattice of one or more layers adjacent to first removable epitaxial layer 106. In one embodiment, first removable epitaxial layer 106 can comprise a gradual change in composition from the interface with buffer layer 104 to the interface with epitaxial quantum well layer 108 to avoid creating crystal defects (e.g. dislocations) in first removable epitaxial layer 106. In one embodiment, the gradual change in composition can be a linear change. In another embodiment, first removable epitaxial layer 106 can be formed using a certain composition of silicon-germanium (SiGe) that enables removal of a portion of first removable epitaxial layer 106 using a vapor hydrogen chloride (HCl) process to form channel 504 as described below with reference to FIG. 5B. These examples of materials are not intended to be limiting. From this disclosure those of ordinary skill in the art will be able to conceive of many other materials suitable for forming first removable epitaxial layer 106 and the same are contemplated within the scope of the illustrative embodiments. First removable epitaxial layer 106 can comprise a thickness (e.g., height) ranging from approximately 5 nm to approximately 500 nm.

Epitaxial quantum well layer 108 can be epitaxially grown on first removable epitaxial layer 106. In an embodiment, epitaxial quantum well layer 108 can be formed of silicon (Si). In another embodiment, epitaxial quantum well layer 108 can be formed of a certain composition of silicon-germanium (SiGe). These examples of materials are not intended to be limiting. From this disclosure those of ordinary skill in the art will be able to conceive of many other materials suitable for forming epitaxial quantum well layer 108 and the same are contemplated within the scope of the illustrative embodiments. Epitaxial quantum well layer 108 can comprise a thickness (e.g., height) ranging from approximately 0.5 nm to approximately 5 nm. In an example, epitaxial quantum well layer 108 can be doped with a doping material such as, for instance, boron (B), arsenic (As), phosphorous (P), and/or another doping material that can enable conductivity of epitaxial quantum well layer 108. In this example where epitaxial quantum well layer 108 can be doped using, for instance, one or more of the doping materials defined above, epitaxial quantum well layer 108 can comprise a thickness (e.g., height) ranging from approximately 5 nm to approximately 400 nm.

Second removable epitaxial layer 110, an epitaxial semiconductor, can be epitaxially grown on epitaxial quantum well layer 108. Materials for second removable epitaxial layer 110 can be selected based on the composition of epitaxial quantum well layer 108, to provide crystal quality above a particular quality threshold. In one embodiment, second removable epitaxial layer 110 can be formed using a certain composition of silicon-germanium (SiGe), to match the crystal lattice of one or more layers adjacent to second removable epitaxial layer 110. In one embodiment, second removable epitaxial layer 110 can comprise a gradual change in composition from the interface with epitaxial quantum well layer 108 to the interface with cap layer 112 to avoid creating crystal defects (e.g. dislocations) in second removable epitaxial layer 110. In one embodiment, the gradual change in composition can be a linear change. In another embodiment, second removable epitaxial layer 110 can be formed using a certain composition of silicon-germanium (SiGe) that enables removal of a portion of second removable epitaxial layer 110 using a vapor hydrogen chloride (HCl) process to form channel 704 as described below with reference to FIG. 7B. These examples of materials are not intended to be limiting. From this disclosure those of ordinary skill in the art will be able to conceive of many other materials suitable for forming second removable epitaxial layer 110 and the same are contemplated within the scope of the illustrative embodiments. Second removable epitaxial layer 110 can comprise a thickness (e.g., height) ranging from approximately 5 nm to approximately 500 nm.

First removable epitaxial layer 106 and second removable epitaxial layer 110 can protect surfaces of epitaxial quantum well layer 108 from damage during fabrication. A damaged portion of epitaxial quantum well layer 108 could degrade device properties.

Device 100 can further comprise a cap layer 112 coupled (e.g., bonded) to second removable epitaxial layer 110. Cap layer 112 can comprise a protective layer that can be bonded to second removable epitaxial layer 110 using, for instance, a wafer bonding process (e.g., direct bonding, plasma-activated bonding, anodic bonding, eutectic bonding, glass frit bonding, adhesive bonding, thermocompression bonding, transient liquid phase diffusion bonding, surface activated bonding, etc.). In an embodiment, cap layer 112 can comprise one or more of the same materials as substrate 102 defined above (e.g., Si, $Al_2O_3$, SiGe, SiGeC, SiC, Ge alloys, III/V compound semiconductors, II/VI compound semiconductors, etc.). Cap layer 112 can comprise a thickness (e.g., height) ranging from approximately 5 nm to approximately 500 nm.

Figure 2A:
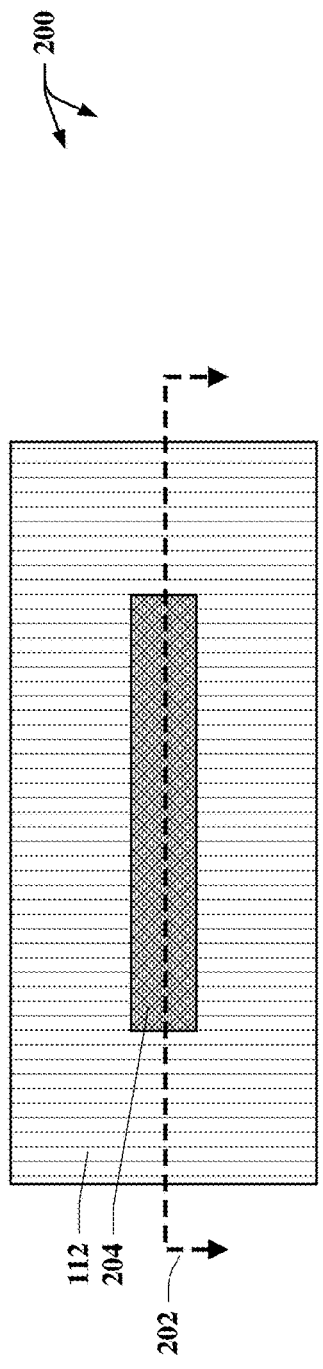
FIGS. 2A and 2B illustrate a top view and a cross-sectional view, respectively, of the example, non-limiting device of FIG. 1 after forming a resist layer on the cap layer of the device of FIG. 1 in accordance with one or more embodiments described herein.
Figure 2B:
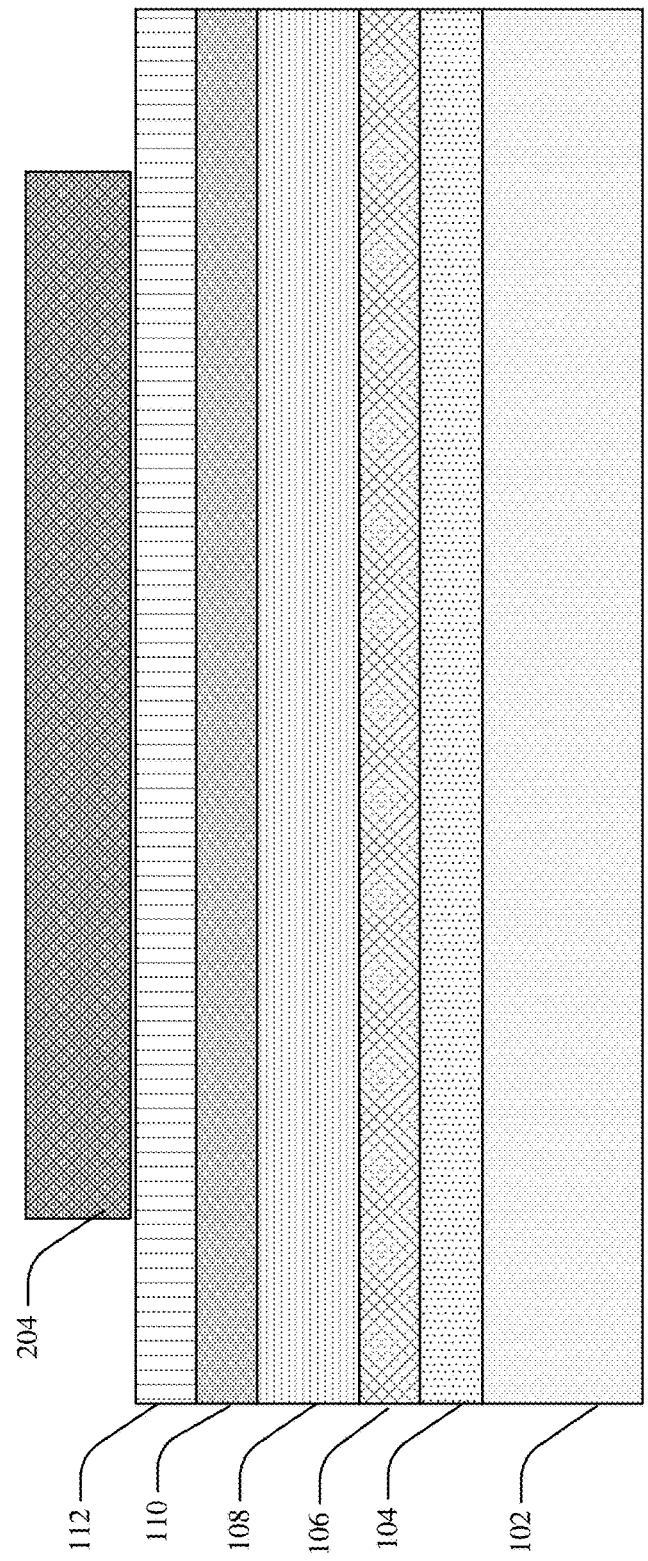

FIG. 2A illustrates a top view of the example, non-limiting device 100 of FIG. 1 after forming a resist layer on the cap layer of device 100 in accordance with one or more embodiments described herein. FIG. 2B illustrates a cross-sectional side view of device 200 as viewed along a plane defined by line 202. Repetitive description of like elements and/or processes employed in other embodiments described herein is omitted for sake of brevity.

Device 200 can comprise an example, non-limiting alternative embodiment of device 100 after formation of a resist layer 204 on cap layer 112. Resist layer 204 can comprise a photoresist material that can be formed on cap layer 112 using one or more photolithography, patterning, and/or photoresist techniques defined above (e.g., a lithographic patterning process). Resist layer 204 can comprise a photoresist including, but not limited to, a positive-tone photoresist, a negative-tone photoresist, a hybrid-tone photoresist, and/or another photoresist.

Figure 3A:
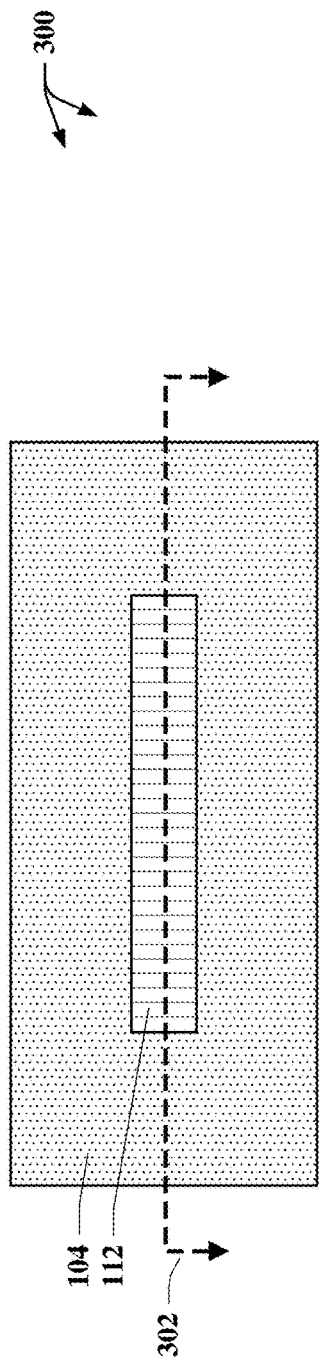
FIGS. 3A and 3B illustrate a top view and a cross-sectional view, respectively, of the example, non-limiting device of FIGS. 2A and 2B after removing portions of the first removable epitaxial layer, the epitaxial quantum well layer, the second removable epitaxial layer, and/or the cap layer of the device of FIGS. 2A and 2B and stripping the resist layer in accordance with one or more embodiments described herein.
Figure 3B:
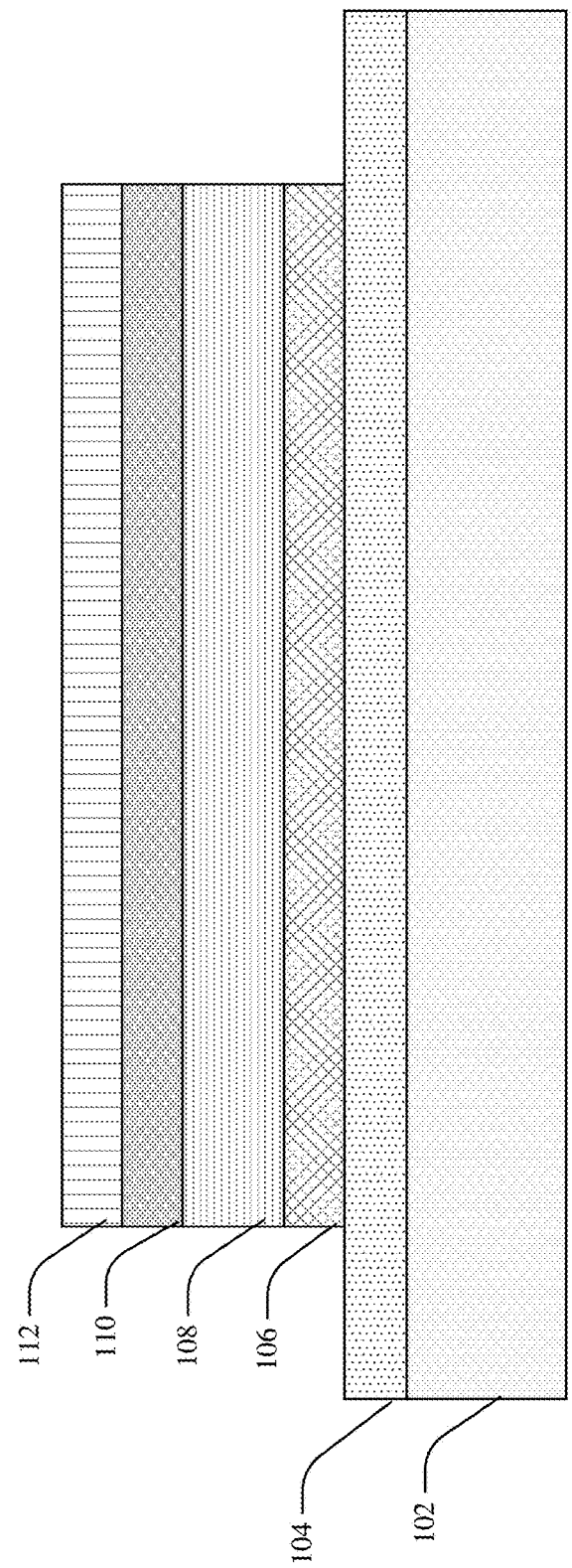

FIG. 3A illustrates a top view of the example, non-limiting device 200 of FIGS. 2A and 2B after removing portions of the first removable epitaxial layer, the epitaxial quantum well layer, the second removable epitaxial layer, and/or the cap layer of device 200 and stripping the resist layer in accordance with one or more embodiments described herein. FIG. 3B illustrates a cross-sectional side view of device 300 as viewed along a plane defined by line 302. Repetitive description of like elements and/or processes employed in other embodiments described herein is omitted for sake of brevity.

Device 300 can comprise an example, non-limiting alternative embodiment of device 200 after removal of portions of first removable epitaxial layer 106, epitaxial quantum well layer 108, second removable epitaxial layer 110, and/or cap layer 112 and stripping resist layer 204. For example, portions of first removable epitaxial layer 106, epitaxial quantum well layer 108, second removable epitaxial layer 110, and/or cap layer 112 can be removed from device 200 to form device 300 as illustrated in FIGS. 3A and 3B using reactive ion etching (RIE).

Figure 4A:
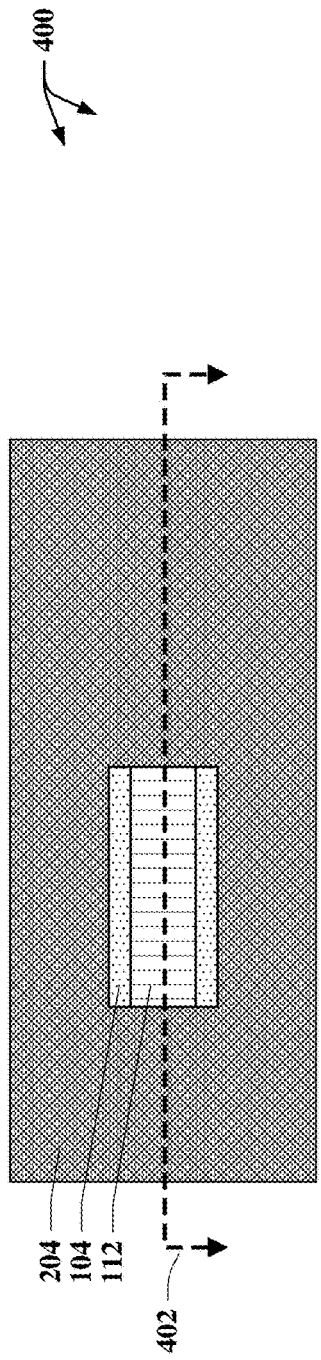
FIGS. 4A and 4B illustrate a top view and a cross-sectional view, respectively, of the example, non-limiting device of FIGS. 3A and 3B after forming a resist layer on the device of FIGS. 3A and 3B in accordance with one or more embodiments described herein.
Figure 4B:
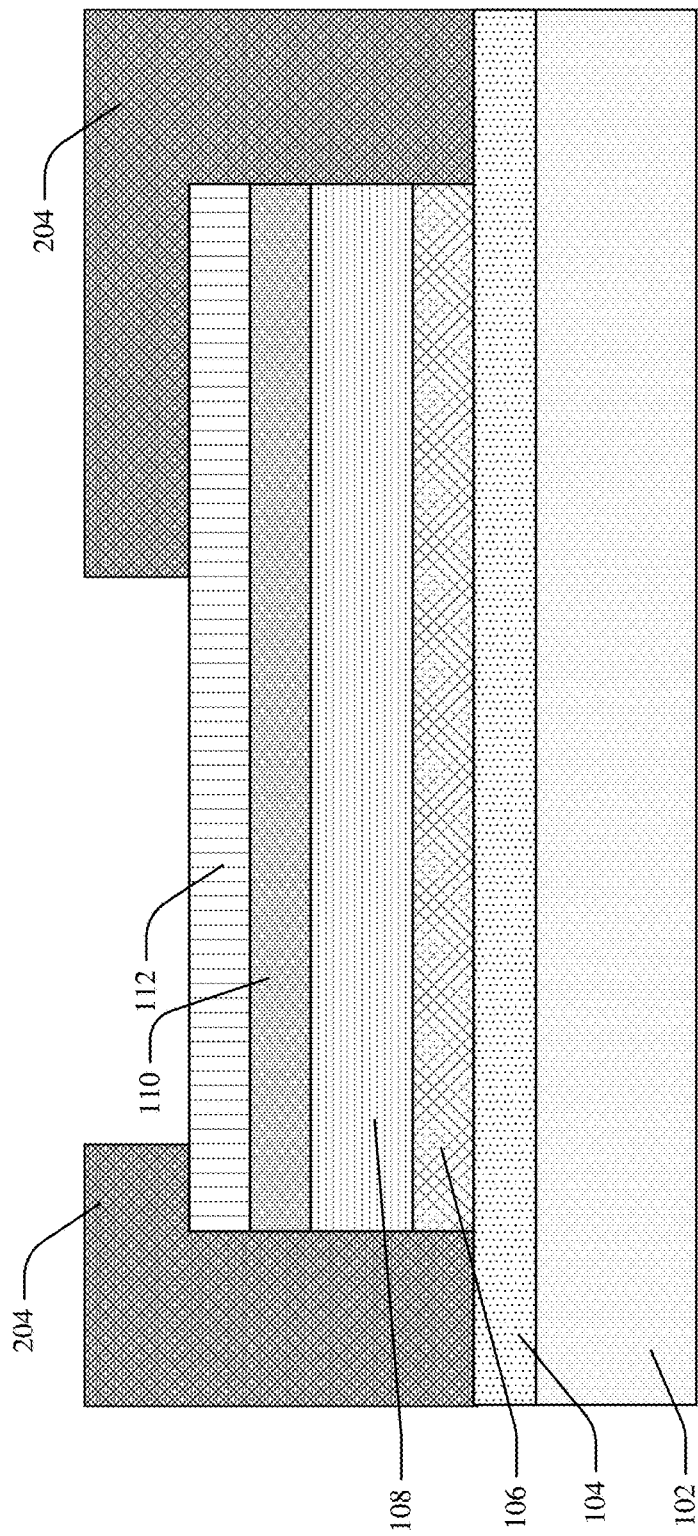

FIG. 4A illustrates a top view of the example, non-limiting device 300 of FIGS. 3A and 3B after forming a resist layer on device 300 in accordance with one or more embodiments described herein. FIG. 4B illustrates a cross-sectional side view of device 400 as viewed along a plane defined by line 402. Repetitive description of like elements and/or processes employed in other embodiments described herein is omitted for sake of brevity.

Device 400 can comprise an example, non-limiting alternative embodiment of device 300 after formation of resist layer 204 on device 300 as illustrated in FIGS. 4A and 4B. As described above, resist layer 204 can comprise a photoresist material that can be formed on device 300 using one or more photolithography, patterning, and/or photoresist techniques defined above (e.g., a lithographic patterning process), where resist layer 204 can comprise a positive-tone photoresist, a negative-tone photoresist, a hybrid-tone photoresist, and/or another photoresist. Resist layer 204 can be formed on device 300 as illustrated in FIGS. 4A and 4B to enable selective removal of a portion of first removable epitaxial layer 106 as described below.

FIG. 5A illustrates a top view of the example, non-limiting device 400 of FIGS. 4A and 4B after selective removal of a portion of the first removable epitaxial layer of device 400 and stripping the resist layer in accordance with one or more embodiments described herein. FIG. 5B illustrates a cross-sectional side view of device 500 as viewed along a plane defined by line 502. Repetitive description of like elements and/or processes employed in other embodiments described herein is omitted for sake of brevity.

Device 500 can comprise an example, non-limiting alternative embodiment of device 400 after selective removal of a portion of first removable epitaxial layer 106 to form a channel 504 as illustrated in FIG. 5B and stripping resist layer 204. For example, a portion of first removable epitaxial layer 106 can be selectively removed from device 400 to form channel 504 as illustrated in FIG. 5B using an etching process, for instance, using vapor hydrogen chloride (HCl), chlorine (Cl), fluorine (F), and/or another vapor etching process. In an example, a portion of first removable epitaxial layer 106 can be selectively removed from device 400 to form channel 504 as illustrated in FIG. 5B by performing a lateral selective etching process using hydrogen chloride (HCl) at a partial pressure of approximately 0.4 Torr and at a temperature between approximately 600 degrees Celsius (° C.) and 700° C.

FIG. 6A illustrates a top view of the example, non-limiting device 500 of FIGS. 5A and 5B after forming a resist layer on device 500 in accordance with one or more embodiments described herein. FIG. 6B illustrates a cross-sectional side view of device 600 as viewed along a plane defined by line 602. Repetitive description of like elements and/or processes employed in other embodiments described herein is omitted for sake of brevity.

Device 600 can comprise an example, non-limiting alternative embodiment of device 500 after formation of resist layer 204 on device 500 as illustrated in FIGS. 6A and 6B. As described above, resist layer 204 can comprise a photoresist material that can be formed on device 500 using one or more photolithography, patterning, and/or photoresist techniques defined above (e.g., a lithographic patterning process), where resist layer 204 can comprise a positive-tone photoresist, a negative-tone photoresist, a hybrid-tone photoresist, and/or another photoresist. Resist layer 204 can be formed on device 500 as illustrated in FIGS. 6A and 6B to enable selective removal of a portion of second removable epitaxial layer 110 as described below.

FIG. 7A illustrates a top view of the example, non-limiting device 600 of FIGS. 6A and 6B after selective removal of a portion of the second removable epitaxial layer of device 600 and stripping the resist layer in accordance with one or more embodiments described herein. FIG. 7B illustrates a cross-sectional side view of device 700 as viewed along a plane defined by line 702. Repetitive description of like elements and/or processes employed in other embodiments described herein is omitted for sake of brevity.

Device 700 can comprise an example, non-limiting alternative embodiment of device 600 after selective removal of a portion of second removable epitaxial layer 110 to form a channel 704 as illustrated in FIG. 7B and stripping resist layer 204. For example, a portion of second removable epitaxial layer 110 can be selectively removed from device 600 to form channel 704 as illustrated in FIG. 7B using an etching process, for instance, using vapor hydrogen chloride (HCl), chlorine (Cl), fluorine (F), and/or another vapor etching process. In an example, a portion of second removable epitaxial layer 110 can be selectively removed from device 600 to form channel 704 as illustrated in FIG. 7B by performing a lateral selective etching process using hydrogen chloride (HCl) at a partial pressure of approximately 0.4 Torr and at a temperature between approximately 600 degrees Celsius (° C.) and 700° C.

Figure 8A:
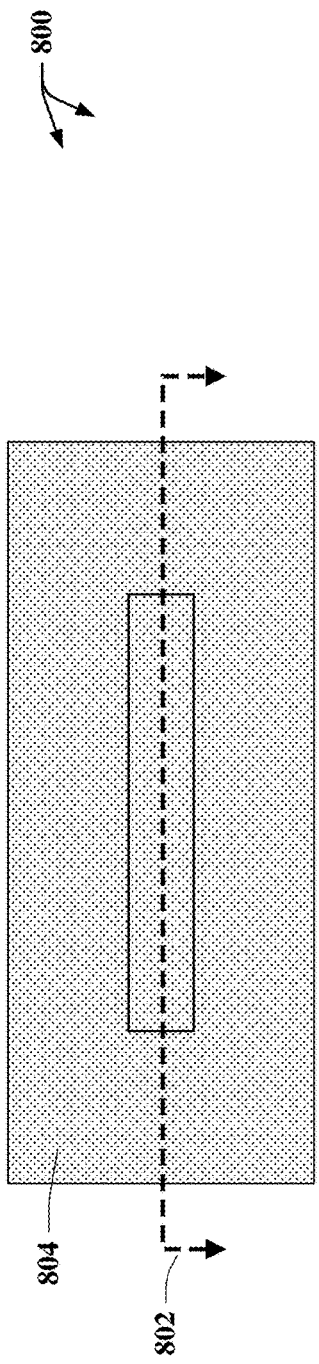
FIGS. 8A and 8B illustrate a top view and a cross-sectional view, respectively, of the example, non-limiting device of FIGS. 7A and 7B after depositing a mask layer on the device of FIGS. 7A and 7B in accordance with one or more embodiments described herein.
Figure 8B:
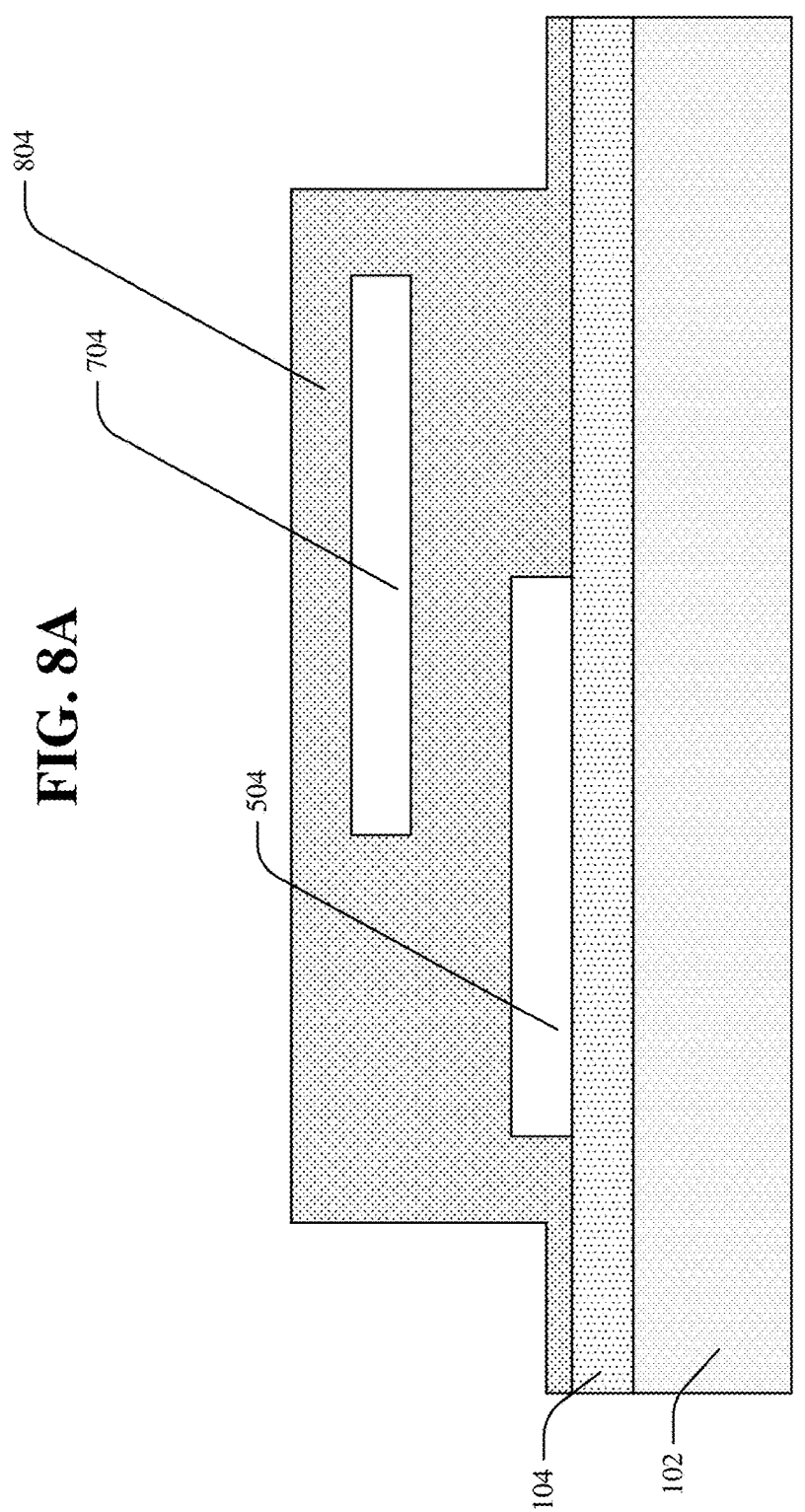

FIG. 8A illustrates a top view of the example, non-limiting device 700 of FIGS. 7A and 7B after depositing a mask layer on device 700 in accordance with one or more embodiments described herein. FIG. 8B illustrates a cross-sectional side view of device 800 as viewed along a plane defined by line 802. Repetitive description of like elements and/or processes employed in other embodiments described herein is omitted for sake of brevity.

Device 800 can comprise an example, non-limiting alternative embodiment of device 700 after depositing a mask layer 804 on device 700 as illustrated in FIGS. 8A and 8B. Mask layer 804 can be deposited on device 700 using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Mask layer 804 can be formed using a dielectric material including, but not limited to, zinc oxide (ZnO), a zinc peroxide (ZnO$_2$), and/or another material that enables selective deposition of superconducting material 904 into channel 504 and/or channel 704 and onto non-dielectric surfaces of channel 504 and/or channel 704 as described below and illustrated in FIGS. 9A and 9B. Mask layer 804 can comprise a thickness (e.g., height) ranging from approximately 1 nm to approximately 50 nm.

FIG. 9A illustrates a top view of the example, non-limiting device 800 of FIGS. 8A and 8B after selectively depositing a superconducting material into one or more channels of device 800 to form one or more superconducting regions of an epitaxial Josephson junction transmon device in accordance with one or more embodiments described herein. FIG. 9B illustrates a cross-sectional side view of device 900 as viewed along a plane defined by line 902. Repetitive description of like elements and/or processes employed in other embodiments described herein is omitted for sake of brevity.

Figure 10A:
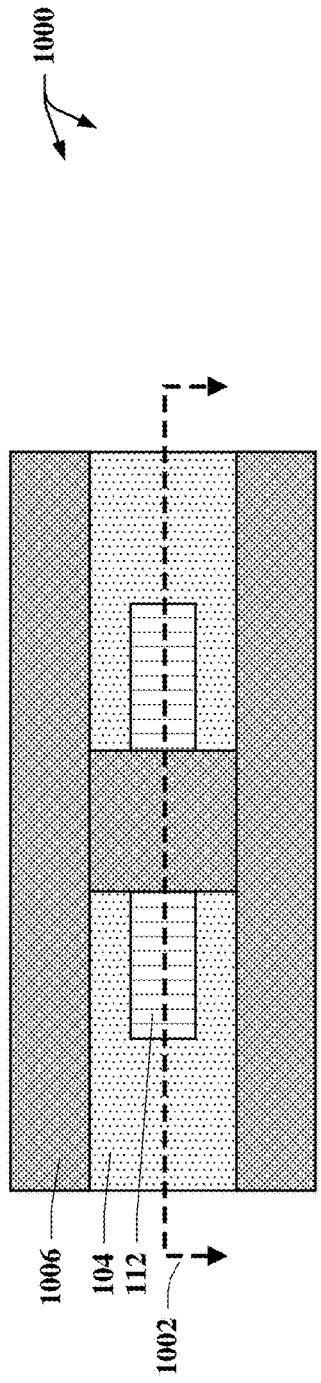
FIGS. 10A and 10B illustrate a top view and a cross-sectional view, respectively, of the example, non-limiting device of FIGS. 9A and 9B after removing the mask layer and forming a lift off resist structure on the cap layer of the device of FIGS. 9A and 9B in accordance with one or more embodiments described herein.
Figure 10B:
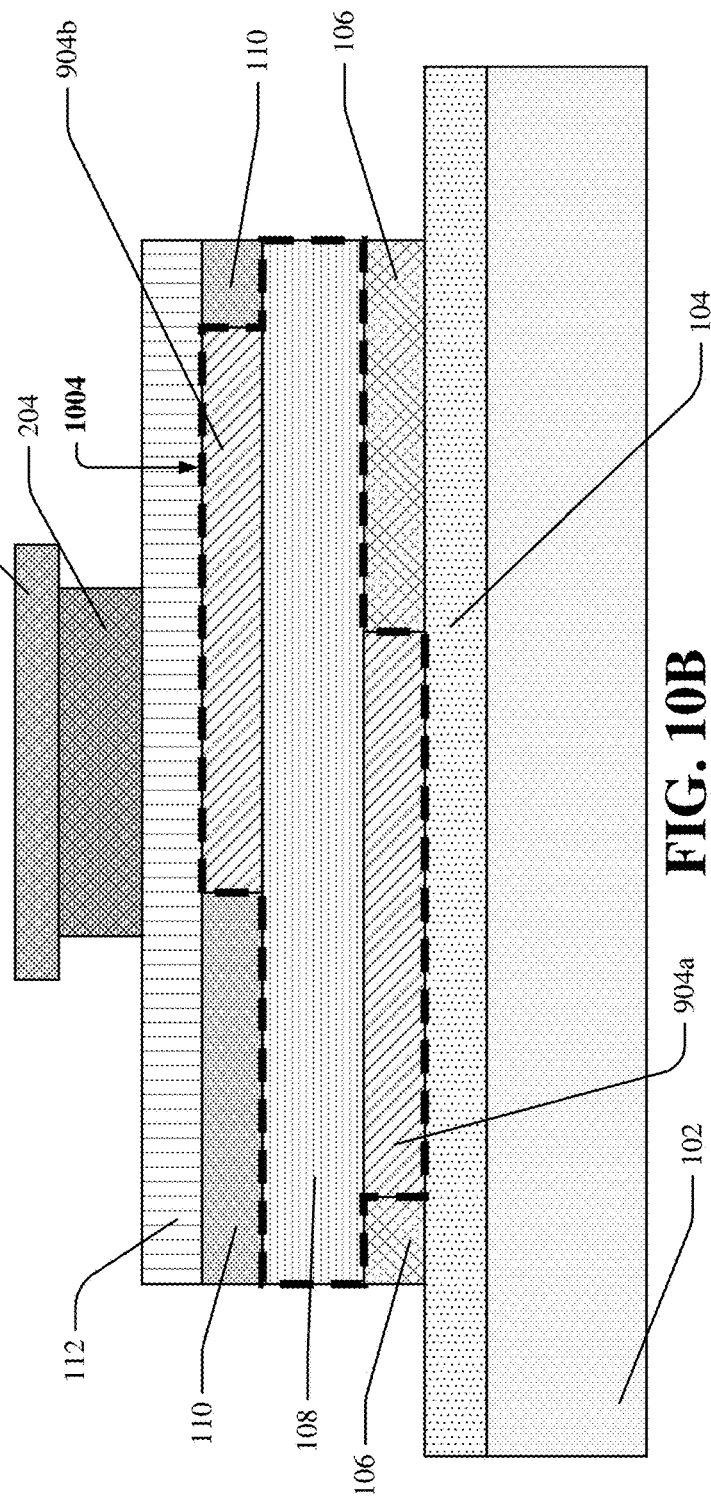

Device 900 can comprise an example, non-limiting alternative embodiment of device 800 after selectively depositing a superconducting material 904 into channel 504 and/or channel 704 of device 800 to form superconducting regions 904a, 904b of epitaxial Josephson junction transmon device 1004 as illustrated in FIGS. 9B and 10B (epitaxial Josephson junction transmon device 1004 is denoted in FIG. 10B by the bold dashed line). Superconducting material 904 including, but not limited to, aluminum (Al), niobium (Nb), vanadium (V), tantalum (Ta), and/or another superconducting material can be selectively deposited into channel 504 and/or channel 704 using a selective deposition technique. For example, superconducting material 904 can be selectively deposited into channels 504, 704 and onto non-oxidized, non-dielectric surfaces of channels 504, 704 using a selective deposition technique that comprises use of, for instance, dimethylallene (Me$_2$AlH) or dimethylaluminum hydride (C$_2$H$_7$Al) with dihydrogen (H$_2$) plasma (e.g., in a dihydrogen (H$_2$) plasma).

Such selective deposition of superconducting material 904 into channels 504, 704 as described above can facilitate formation of epitaxial Josephson junction transmon device 1004 as illustrated in FIGS. 9B and 10B (epitaxial Josephson junction transmon device 1004 is denoted in FIG. 10B by the bold dashed line). Epitaxial quantum well layer 108 can comprise a dielectric of epitaxial Josephson junction transmon device 1004 that can serve to separate superconducting regions 904a, 904b, which can comprise superconducting electrodes of epitaxial Josephson junction transmon device 1004.

FIG. 10A illustrates a top view of the example, non-limiting device 900 of FIGS. 9A and 9B after removing the mask layer and forming a lift off resist structure on the cap layer of device 900 in accordance with one or more embodiments described herein. FIG. 10B illustrates a cross-sectional side view of device 1000 as viewed along a plane defined by line 1002. Repetitive description of like elements and/or processes employed in other embodiments described herein is omitted for sake of brevity.

Device 1000 can comprise an example, non-limiting alternative embodiment of device 900 after removing mask layer 804 and forming a lift off resist structure on cap layer 112 of device 900. In an example, mask layer 804 can be removed using, for instance, a dilute hydrogen chloride (HCl) rinse technique to remove zinc oxide (ZnO), zinc peroxide ($ZnO_2$), and/or another material used to form mask layer 804. Such a lift off resist structure described above can comprise a lift off stack having a resist profile layer 1006 with an undercut profile that can comprise resist layer 204. In an example, resist profile layer 1006 can be formed using the same material and/or the same photolithography, patterning, and/or photoresist techniques defined above (e.g., a lithographic patterning process) that can be used to form resist layer 204. In another example, resist profile layer 1006 can be formed using different material from that used to form resist layer 204. For example, resist profile layer 1006 can comprise a hard mask formed using materials such as, for instance, silicon (Si) or titanium (Ti) and resist layer 204 can be formed using an organic material that can be developed out using, for example, solvent or tetramethylammonium hydroxide to create the undercut profile illustrated in FIG. 10B. The lift off resist structure can be formed on device 900 as illustrated in FIGS. 10A and 10B to enable formation of, for instance, one or more wires, electrodes, capacitors, resonators, tuning gates, and/or another conductor on device 1000 that can be coupled to epitaxial Josephson junction transmon device 1004 as described below and illustrated in FIGS. 11A, 11B, 12A, 12B, 13A, and 13B.

FIG. 11A illustrates a top view of the example, non-limiting device 1000 of FIGS. 10A and 10B after depositing a superconducting layer on device 1000 in accordance with one or more embodiments described herein. FIG. 11B illustrates a cross-sectional side view of device 1100 as viewed along a plane defined by line 1102. Repetitive description of like elements and/or processes employed in other embodiments described herein is omitted for sake of brevity.

Device 1100 can comprise an example, non-limiting alternative embodiment of device 1000 after depositing superconducting layer 1104 on device 1000 as illustrated in FIGS. 11A and 11B. Superconducting layer 1104 can be deposited on device 1000 using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Superconducting layer 1104 can be formed using a superconducting material including, but not limited to, aluminum (Al), niobium (Nb), vanadium (V), tantalum (Ta), and/or another superconducting material. Superconducting layer 1104 can comprise a thickness (e.g., height) ranging from approximately 5 nm to approximately 300 nm. Superconducting layer 1104 can be deposited on device 1000 as illustrated in FIGS. 11A and 11B to form, for instance, one or more wires, electrodes, capacitors, resonators, tuning gates, and/or another conductor on device 1000 that can be coupled to epitaxial Josephson junction transmon device 1004 as described below and illustrated in FIGS. 12A, 12B, 13A, and 13B.

FIG. 12A illustrates a top view of the example, non-limiting device 1100 of FIGS. 11A and 11B after removing the lift off resist structure and portions of the superconducting layer to form conductive structures coupled to the epitaxial Josephson junction transmon device in accordance with one or more embodiments described herein. FIG. 12B illustrates a cross-sectional side view of device 1200 as viewed along a plane defined by line 1202. Repetitive description of like elements and/or processes employed in other embodiments described herein is omitted for sake of brevity.

Device 1200 can comprise an example, non-limiting alternative embodiment of device 1100 after removing the lift off resist structure comprising resist profile layer 1006 and resist layer 204 and portions of superconducting layer 1104 to form one or more conductive structures 1204a, 1204b that can be coupled to epitaxial Josephson junction transmon device 1004 as illustrated in FIG. 12B. The lift off resist structure and portions of superconducting layer 1104 formed on resist profile layer 1006 of the lift off resist structure can be removed using a lift off technique (e.g., washing with a solvent, stripping, etc.) to define conductive structures 1204a, 1204b that can be coupled to epitaxial Josephson junction transmon device 1004 as illustrated in FIG. 12B. In an example, conductive structures 1204a, 1204b can comprise the portions of superconducting layer 1104 remaining after removing resist profile layer 1006 and resist layer 204 as described above, where conductive structures 1204a, 1204b can comprise wires, electrodes, capacitors, resonators, tuning gates, and/or another conductor that can be coupled to epitaxial Josephson junction transmon device 1004. For instance, conductive structures 1204a, 1204b can comprise capacitors that can be coupled to first removable epitaxial layer 106, epitaxial quantum well layer 108, second removable epitaxial layer 110, and/or superconducting regions 904a, 904b. In an example, conductive structure 1204a can be coupled to superconducting region 904a and/or epitaxial quantum well layer 108 as illustrated in FIG. 12B. In another example, conductive structure 1204b can be coupled to superconducting region 904b and/or epitaxial quantum well layer 108 as illustrated in FIG. 12B.

FIG. 13A illustrates a top view of the example, non-limiting device 1200 of FIGS. 12A and 12B after forming one or more additional conductive structures on device 1200 in accordance with one or more embodiments described herein. FIG. 13B illustrates a cross-sectional side view of device 1300 as viewed along a plane defined by line 1302. Repetitive description of like elements and/or processes employed in other embodiments described herein is omitted for sake of brevity.

Device 1300 can comprise an example, non-limiting alternative embodiment of device 1200 after forming one or more conductive structures 1304a, 1304b on device 1200 as illustrated in FIG. 13A (e.g., on buffer layer 104 or on substrate 102 in embodiments where buffer layer 104 is not formed on substrate 102). In an example, conductive structures 1304a, 1304b can be formed at the same time conductive structures 1204a, 1204b are formed, using the same materials, and/or process described above with reference to FIGS. 11A, 11B, 12A, and 12B, where the lift off resist structure described above can be used to define conductive structures 1204a, 1204b and conductive structures 1304a, 1304b. In another example, conductive structures 1304a, 1304b can be formed at a different time (e.g., after) conductive structures 1204a, 1204b are formed, using the same materials, and/or process described above with reference to FIGS. 11A, 11B, 12A, and 12B, where the lift off resist structure described above can be used to define conductive structures 1304a, 1304b.

Conductive structures 1304*a*, 1304*b* can comprise tuning gates (e.g., junction tuning gates) that can be coupled (e.g., via capacitive coupling, inductive coupling, etc.) to epitaxial Josephson junction transmon device 1004. For example, conductive structures 1304*a*, 1304*b* can be coupled to epitaxial Josephson junction transmon device 1004 by applying a voltage source to conductive structures 1304*a*, 1304*b*. In this example, conductive structures 1304*a*, 1304*b* can be coupled to epitaxial Josephson junction transmon device 1004 to alter one or more parameters of epitaxial Josephson junction transmon device 1004 (e.g., frequency, etc.).

Figure 14A:
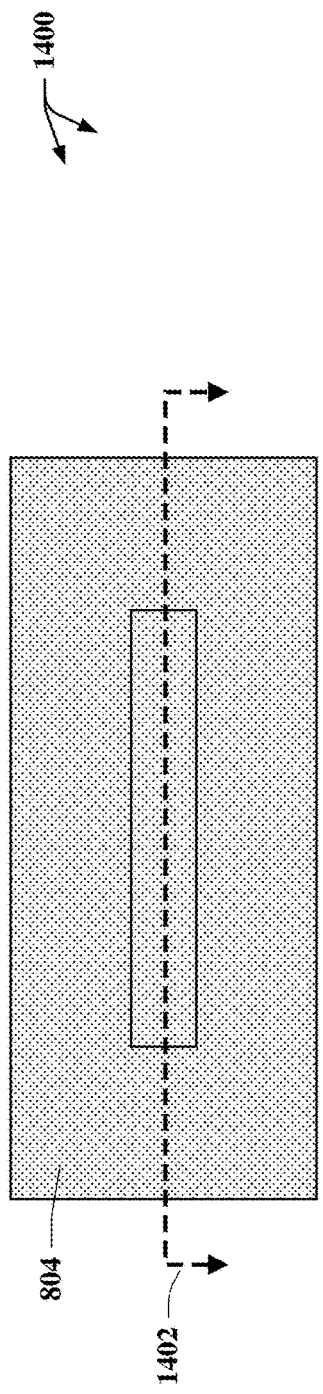
FIGS. 14A and 14B illustrate a top view and a cross-sectional view, respectively, of the example, non-limiting device of FIGS. 9A and 9B after depositing a second mask layer on the device of FIGS. 9A and 9B in accordance with one or more embodiments described herein.
Figure 14B:
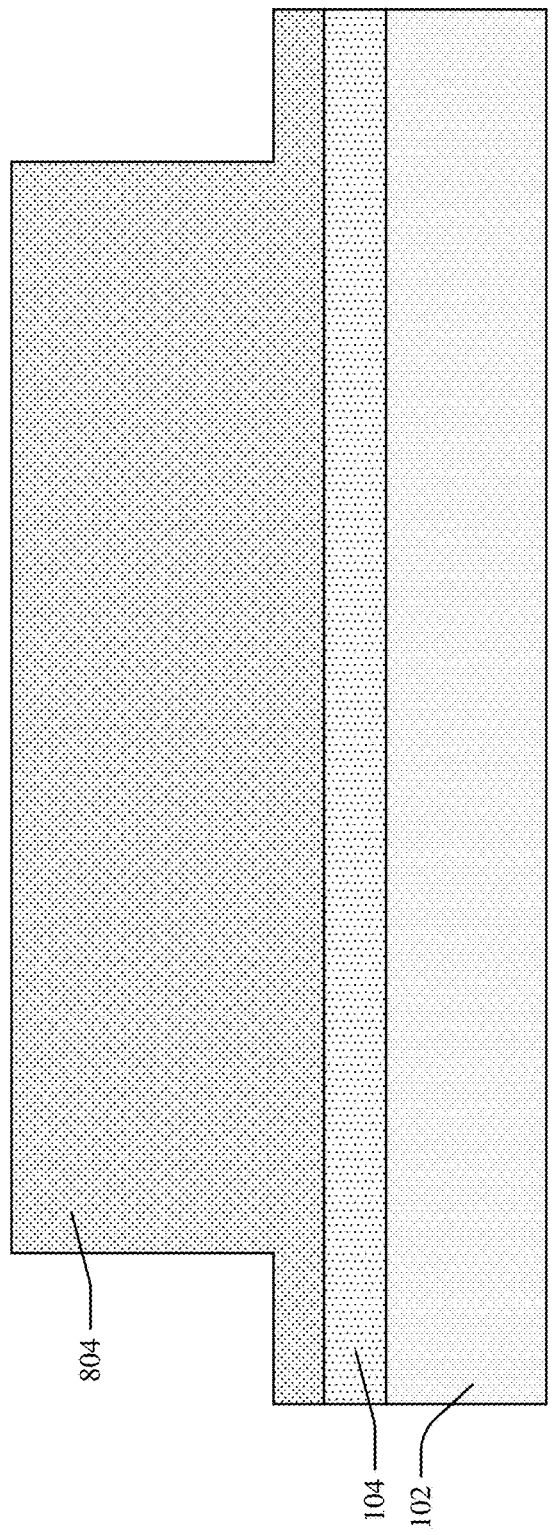

FIG. 14A illustrates a top view of the example, non-limiting device 900 of FIGS. 9A and 9B after depositing a second mask layer on device 900 in accordance with one or more embodiments described herein. FIG. 14B illustrates a cross-sectional side view of device 1400 as viewed along a plane defined by line 1402. Repetitive description of like elements and/or processes employed in other embodiments described herein is omitted for sake of brevity.

As described above, the non-limiting multi-step fabrication sequence illustrated in FIGS. 1-23B can be implemented to fabricate device 1200, device 1300, and/or device 2300, where device 1200 can comprise a semiconducting and superconducting device comprising an epitaxial Josephson junction transmon device 1004, and where device 1300 and device 2300 can comprise example, non-limiting alternative embodiments of device 1200. For example, the non-limiting multi-step fabrication sequence illustrated in FIGS. 1-9B and FIGS. 14A-23B can be implemented to fabricate device 2300, where device 2300 can comprise an example, non-limiting alternative embodiment of device 1200.

Device 1400 can comprise an example, non-limiting alternative embodiment of device 900 after depositing a second mask layer 804 on device 900 as illustrated in FIGS. 14A and 14B. A second mask layer 804 can be deposited on device 900 using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). The second mask layer 804 can be formed using a dielectric material including, but not limited to, zinc oxide (ZnO), a zinc peroxide (ZnO$_2$), and/or another material. The second mask layer 804 can comprise a thickness (e.g., height) ranging from approximately 5 nanometers (nm) to approximately 10 nm.

FIG. 15A illustrates a top view of the example, non-limiting device 1400 of FIGS. 14A and 14B after formation of a resist layer on the second mask layer of device 1400 in accordance with one or more embodiments described herein. FIG. 15B illustrates a cross-sectional side view of device 1500 as viewed along a plane defined by line 1502. Repetitive description of like elements and/or processes employed in other embodiments described herein is omitted for sake of brevity.

Device 1500 can comprise an example, non-limiting alternative embodiment of device 1400 after formation of resist layer 204 on the second mask layer 804 of device 1400 as illustrated in FIGS. 15A and 15B. As described above, resist layer 204 can comprise a photoresist material that can be formed on the second mask layer 804 of device 1400 using one or more photolithography, patterning, and/or photoresist techniques defined above (e.g., a lithographic patterning process), where resist layer 204 can comprise a positive-tone photoresist, a negative-tone photoresist, a hybrid-tone photoresist, and/or another photoresist. Resist layer 204 can be formed on the second mask layer 804 of device 1400 as illustrated in FIGS. 15A and 15B to enable removal of one or more portions of the second mask layer 804 from device 1500 to define the shape of one or more conductive structures that can be formed as described below.

FIG. 16A illustrates a top view of the example, non-limiting device 1500 of FIGS. 15A and 15B after removing one or more portions of the second mask layer from device 1500 and stripping the resist layer in accordance with one or more embodiments described herein. FIG. 16B illustrates a cross-sectional side view of device 1600 as viewed along a plane defined by line 1602. Repetitive description of like elements and/or processes employed in other embodiments described herein is omitted for sake of brevity.

Device 1600 can comprise an example, non-limiting alternative embodiment of device 1500 after removing one or more portions of the second mask layer 804 from device 1500 as illustrated in FIGS. 16A and 16B and stripping resist layer 204. In an example, the one or more portions of the second mask layer 804 can be removed using, for instance, a dilute hydrogen chloride (HCl) rinse technique to remove zinc oxide (ZnO), zinc peroxide (ZnO$_2$), and/or another material used to form mask layer 804. Removal of such one or more portions of the second mask layer 804 from device 1500 as illustrated in FIGS. 16A and 16B can enable formation of one or more conductive structures on device 1600 such as, for instance, one or more wires, electrodes, capacitors, resonators, tuning gates, and/or another conductor. For example, removal of such one or more portions of the second mask layer 804 from device 1500 as illustrated in FIGS. 16A and 16B can enable formation of conductive structures 1304*a*, 1304*b* on buffer layer 104 as described below.

FIG. 17A illustrates a top view of the example, non-limiting device 1600 of FIGS. 16A and 16B after forming a lift off resist structure on device 1600 in accordance with one or more embodiments described herein. FIG. 17B illustrates a cross-sectional side view of device 1700 as viewed along a plane defined by line 1702. Repetitive description of like elements and/or processes employed in other embodiments described herein is omitted for sake of brevity.

Device 1700 can comprise an example, non-limiting alternative embodiment of device 1600 after forming a lift off resist structure on device 1600 as illustrated in FIGS. 17A and 17B. Such a lift off resist structure described above can comprise a lift off stack having a resist profile layer 1006 with an undercut profile that can comprise resist layer 204. In an example, resist profile layer 1006 can be formed using the same material and/or the same photolithography, patterning, and/or photoresist techniques defined above (e.g., a lithographic patterning process) that can be used to form resist layer 204. In another example, resist profile layer 1006 can be formed using different material from that used to form resist layer 204. For example, resist profile layer 1006 can comprise a hard mask formed using materials such as, for instance, silicon (Si) or titanium (Ti) and resist layer 204 can be formed using an organic material that can be developed out using, for example, solvent or tetramethylammonium hydroxide to create the undercut profile illustrated in FIG. 17B. The lift off resist structure can be formed on device 1600 as illustrated in FIGS. 17A and 17B to enable deposition of superconducting layer 1104 onto one or more exposed surfaces of device 1700. For example, the lift off resist structure can be formed on device 1600 as illustrated in FIGS. 17A and 17B to enable deposition of superconducting layer 1104 on the exposed surface of the second mask layer 804 and/or the exposed surfaces of buffer layer 104 as illustrated in FIGS. 17A, 17B, 18A, and 18B.

FIG. 18A illustrates a top view of the example, non-limiting device 1700 of FIGS. 17A and 17B after depositing a superconducting layer on the lift off resist structure and the exposed surfaces of device 1700 in accordance with one or more embodiments described herein. FIG. 18B illustrates a cross-sectional side view of device 1800 as viewed along a plane defined by line 1802. Repetitive description of like elements and/or processes employed in other embodiments described herein is omitted for sake of brevity.

Device 1800 can comprise an example, non-limiting alternative embodiment of device 1700 after depositing superconducting layer 1104 on the lift off resist structure formed on device 1700 as described above and the exposed surfaces of buffer layer 104 and/or the second mask layer 804 of device 1700 as illustrated in FIGS. 17A, 17B, 18A, and 18B. Superconducting layer 1104 can be deposited on the lift off resist structure formed on device 1700, as well as the exposed surfaces of buffer layer 104 and/or the second mask layer 804 of device 1700 using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Superconducting layer 1104 can be formed using a superconducting material including, but not limited to, aluminum (Al), niobium (Nb), vanadium (V), tantalum (Ta), and/or another superconducting material. Superconducting layer 1104 can comprise a thickness (e.g., height) ranging from approximately 5 nm to approximately 300 nm. Superconducting layer 1104 can be deposited on the lift off resist structure formed on device 1700, as well as the exposed surfaces of buffer layer 104 and/or the second mask layer 804 of device 1700 as illustrated in FIGS. 17A, 17B, 18A, and 18B to form, for instance, one or more wires, electrodes, capacitors, resonators, tuning gates, and/or another conductor. For example, superconducting layer 1104 can be deposited on the lift off resist structure formed on device 1700, as well as the exposed surfaces of buffer layer 104 and/or the second mask layer 804 of device 1700 as illustrated in FIGS. 17A, 17B, 18A, and 18B to form, for instance, conductive structures 1304a, 1304b on buffer layer 104 and/or conductive structure 1304c on the second mask layer 804 as described below and illustrated in FIGS. 19A, 19B, 20A, and 20B.

FIG. 19A illustrates a top view of the example, non-limiting device 1800 of FIGS. 18A and 18B after removing the lift off resist structure and portions of the superconducting layer to form conductive structures in accordance with one or more embodiments described herein. FIG. 19B illustrates a cross-sectional side view of device 1900 as viewed along a plane defined by line 1902. Repetitive description of like elements and/or processes employed in other embodiments described herein is omitted for sake of brevity.

Device 1900 can comprise an example, non-limiting alternative embodiment of device 1800 after removing the lift off resist structure (e.g., comprising resist profile layer 1006 and resist layer 204) and portions of superconducting layer 1104 to form one or more conductive structures 1304a, 1304b, 1304c as illustrated in FIG. 19B. The lift off resist structure and portions of superconducting layer 1104 formed on resist profile layer 1006 of the lift off resist structure can be removed using a lift off technique (e.g., washing with a solvent, stripping, etc.) to form conductive structures 1304a, 1304b, 1304c as illustrated in FIGS. 19A and 19B. In an example, conductive structures 1304a, 1304b, 1304c can comprise the portions of superconducting layer 1104 remaining after removing the lift off resist structure and the portions of superconducting layer 1104 deposited on resist profile layer 1006 of the lift off resist structure as described above, where conductive structures 1304a, 1304b, 1304c can comprise wires, electrodes, capacitors, resonators, tuning gates, and/or another conductor. For instance, conductive structures 1304a, 1304b, 1304c can collectively constitute a tuning electrode and/or a tuning gate that can be coupled to buffer layer 104 and/or substrate 102 (e.g., in embodiments where buffer layer 104 is not formed) and/or formed across epitaxial Josephson junction transmon device 1004 as described below and illustrated in FIGS. 20A and 20B. For example, conductive structures 1304a, 1304b, 1304c can collectively constitute a tuning gate (e.g., junction tuning gate, a tuning electrode, etc.) that can be coupled (e.g., via capacitive coupling, inductive coupling, etc.) to epitaxial Josephson junction transmon device 1004 illustrated in FIG. 20B. In an example, conductive structures 1304a, 1304b, 1304c can be coupled to epitaxial Josephson junction transmon device 1004 by applying a voltage source to conductive structures 1304a, 1304b, 1304c. In this example, conductive structures 1304a, 1304b, 1304c can be coupled to epitaxial Josephson junction transmon device 1004 to alter one or more parameters of epitaxial Josephson junction transmon device 1004 (e.g., frequency, etc.).

FIG. 20A illustrates a top view of the example, non-limiting device 1900 of FIGS. 19A and 19B after removing both mask layers from device 1900 in accordance with one or more embodiments described herein. FIG. 20B illustrates a cross-sectional side view of device 2000 as viewed along a plane defined by line 2002. Repetitive description of like elements and/or processes employed in other embodiments described herein is omitted for sake of brevity.

Device 2000 can comprise an example, non-limiting alternative embodiment of device 1900 after removing both mask layers 804 from device 1900. For example, device 2000 can comprise an example, non-limiting alternative embodiment of device 1900 after removing mask layer 804 formed on device 700 and the second mask layer 804 formed on device 900 as described above with reference to FIGS. 8A and 8B and FIGS. 14A and 14B, respectively. In an example, both mask layers 804 can be removed using, for instance, a dilute hydrogen chloride (HCl) rinse technique to remove zinc oxide (ZnO), zinc peroxide ($ZnO_2$), and/or another material used to form each mask layer 804. Such removal of both mask layers 804 as described above can enable formation of a gap 2004 between conductive structures 1304a, 1304b, 1304c and epitaxial Josephson junction transmon device 1004 as illustrated FIG. 20B. As described above, conductive structures 1304a, 1304b, 1304c can collectively constitute a tuning gate that can be coupled to buffer layer 104 and/or substrate 102 (e.g., in embodiments where buffer layer 104 is not formed) and/or formed across epitaxial Josephson junction transmon device 1004 as illustrated in FIGS. 20A and 20B. Formation of gap 2004 can prevent direct contact of the tuning gate described above comprising conductive structures 1304a, 1304b, 1304c with epitaxial Josephson junction transmon device 1004, thereby facilitating at least one of improved coherence time, improved performance, or improved lifespan of epitaxial Josephson junction transmon device 1004.

FIG. 21A illustrates a top view of the example, non-limiting device 2000 of FIGS. 20A and 20B after forming a lift off resist structure on device 2000 in accordance with one or more embodiments described herein. FIG. 21B illustrates a cross-sectional side view of device 2100 as viewed along a plane defined by line 1002. Repetitive description of like elements and/or processes employed in other embodiments described herein is omitted for sake of brevity.

Device 2100 can comprise an example, non-limiting alternative embodiment of device 2000 after forming a lift off resist structure on device 2000 as illustrated in FIGS. 21A and 21B. Such a lift off resist structure can be formed on device 2000 using the same materials and/or the same process that can be used to form the lift off resist structure on device 900 as described above with reference to FIGS. 10A and 10B. For example, the lift off resist structure illustrated in FIGS. 21A and 21B can comprise a lift off stack having a resist profile layer 1006 with an undercut profile that can comprise resist layer 204. In an example, resist profile layer 1006 can be formed using the same material and/or the same photolithography, patterning, and/or photoresist techniques defined above (e.g., a lithographic patterning process) that can be used to form resist layer 204. In another example, resist profile layer 1006 can be formed using different material from that used to form resist layer 204. For example, resist profile layer 1006 can comprise a hard mask formed using materials such as, for instance, silicon (Si) or titanium (Ti) and resist layer 204 can be formed using an organic material that can be developed out using, for example, solvent or tetramethylammonium hydroxide to create the undercut profile illustrated in FIG. 21B. The lift off resist structure can be formed on device 2000 as illustrated in FIGS. 21A and 21B to enable formation of, for instance, one or more wires, electrodes, capacitors, resonators, tuning gates, and/or another conductor on device 2100 that can be coupled to epitaxial Josephson junction transmon device 1004 as described below and illustrated in FIGS. 22A, 22B, 23A, and 23B. For example, the lift off resist structure can be formed on device 2000 as illustrated in FIGS. 21A and 21B to enable formation of, for instance, conductive structures 1204a, 1204b on device 2100 that can be coupled to epitaxial Josephson junction transmon device 1004 as described below and illustrated in FIGS. 22A, 22B, 23A, and 23B.

FIG. 22A illustrates a top view of the example, non-limiting device 2100 of FIGS. 21A and 21B after depositing a superconducting layer on device 2100 in accordance with one or more embodiments described herein. FIG. 22B illustrates a cross-sectional side view of device 2200 as viewed along a plane defined by line 2202. Repetitive description of like elements and/or processes employed in other embodiments described herein is omitted for sake of brevity.

Device 2200 can comprise an example, non-limiting alternative embodiment of device 2100 after depositing superconducting layer 1104 on device 2100 as illustrated in FIGS. 22A and 22B. Superconducting layer 1104 can be deposited on device 2100 using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Superconducting layer 1104 can be formed using a superconducting material including, but not limited to, aluminum (Al), niobium (Nb), vanadium (V), tantalum (Ta), and/or another superconducting material. Superconducting layer 1104 can comprise a thickness (e.g., height) ranging from approximately 5 nm to approximately 300 nm. Superconducting layer 1104 can be deposited on device 2100 as illustrated in FIGS. 22A and 22B to form, for instance, one or more wires, electrodes, capacitors, resonators, tuning gates, and/or another conductor on device 2200 that can be coupled to epitaxial Josephson junction transmon device 1004 as described below and illustrated in FIGS. 12A, 12B, 13A, and 13B. For example, superconducting layer 1104 can be deposited on device 2100 as illustrated in FIGS. 22A and 22B to form conductive structures 1204a, 1204b on device 2200 that can be coupled to epitaxial Josephson junction transmon device 1004 as described below and illustrated in FIGS. 23A and 23B.

FIG. 23A illustrates a top view of the example, non-limiting device 2200 of FIGS. 22A and 22B after removing the lift off resist structure and portions of the superconducting layer to form conductive structures coupled to the epitaxial Josephson junction transmon device in accordance with one or more embodiments described herein. FIG. 23B illustrates a cross-sectional side view of device 2300 as viewed along a plane defined by line 2302. Repetitive description of like elements and/or processes employed in other embodiments described herein is omitted for sake of brevity.

Device 2300 can comprise an example, non-limiting alternative embodiment of device 2200 after removing the lift off resist structure comprising resist profile layer 1006 and resist layer 204 and portions of superconducting layer 1104 to form one or more conductive structures 1204a, 1204b that can be coupled to epitaxial Josephson junction transmon device 1004 as illustrated in FIG. 23B. The lift off resist structure and portions of superconducting layer 1104 formed on resist profile layer 1006 of the lift off resist structure can be removed using a lift off technique (e.g., washing with a solvent, stripping, etc.) to define conductive structures 1204a, 1204b that can be coupled to epitaxial Josephson junction transmon device 1004 as illustrated in FIG. 23B. In an example, conductive structures 1204a, 1204b can comprise the portions of superconducting layer 1104 remaining after removing resist profile layer 1006 and resist layer 204 as described above, where conductive structures 1204a, 1204b can comprise wires, electrodes, capacitors, resonators, tuning gates, and/or another conductor that can be coupled to epitaxial Josephson junction transmon device 1004. For instance, conductive structures 1204a, 1204b can comprise capacitors that can be coupled to first removable epitaxial layer 106, epitaxial quantum well layer 108, second removable epitaxial layer 110, and/or superconducting regions 904a, 904b. In an example, conductive structure 1204a can be coupled to superconducting region 904a and/or epitaxial quantum well layer 108 as illustrated in FIG. 23B. In another example, conductive structure 1204b can be coupled to superconducting region 904b and/or epitaxial quantum well layer 108 as illustrated in FIG. 23B.

FIG. 24 illustrates a cross-sectional side view of an example, non-limiting device 2400 that can comprise multiple semiconductor layers formed on a substrate layer in accordance with one or more embodiments described herein. Repetitive description of like elements and/or processes employed in other embodiments described herein is omitted for sake of brevity.

Device 2400 can comprise an example, non-limiting alternative embodiment of device 100 described above with reference to FIG. 1, where buffer layer 104 that can be formed on substrate 102 of device 100 is not formed on substrate 102 of device 2400. As described above, the non-limiting multi-step fabrication sequence illustrated in FIGS. 24-33B can be implemented to fabricate device 3200 and/or device 3300, where device 3200 can comprise a semiconducting and superconducting device comprising an epitaxial Josephson junction transmon device 2904, and where device 3300 can comprise an example, non-limiting alternative embodiment of device 3200.

FIG. 25A illustrates a top view of the example, non-limiting device 2400 of FIG. 24 after forming a resist layer on the cap layer of device 2400 in accordance with one or more embodiments described herein. FIG. 25B illustrates a cross-sectional side view of device 2500 as viewed along a plane defined by line 2502. Repetitive description of like elements and/or processes employed in other embodiments described herein is omitted for sake of brevity.

Device 2500 can comprise an example, non-limiting alternative embodiment of device 2400 after formation of resist layer 204 on cap layer 112. As described above, resist layer 204 can comprise a photoresist material that can be formed on cap layer 112 using one or more photolithography, patterning, and/or photoresist techniques defined above (e.g., a lithographic patterning process), where resist layer 204 can comprise a positive-tone photoresist, a negative-tone photoresist, a hybrid-tone photoresist, and/or another photoresist. In an example, resist layer 204 can be formed on cap layer 112 using fin field effect transistors (FinFET) patterning technology. In another example, resist layer 204 can be formed on cap layer 112 as described above (e.g., via FinFET patterning technology) to define the shape of superconducting regions 904a, 904b that can be formed on substrate 102 and/or the shape of an epitaxial Josephson junction tunneling channel 2906 that can be coupled to such superconducting regions 904a, 904b as described below and illustrated in FIGS. 29A and 29B. In this example, resist layer 204 can be formed on cap layer 112 as described above (e.g., via FinFET patterning technology) to define the shape of epitaxial Josephson junction tunneling channel 2906 such that epitaxial Josephson junction tunneling channel 2906 comprises a width of approximately 5 nm.

FIG. 26A illustrates a top view of the example, non-limiting device 2500 of FIGS. 25A and 25B after removing portions of the first removable epitaxial layer, the epitaxial quantum well layer, the second removable epitaxial layer, and/or the cap layer of device 2500 and stripping the resist layer in accordance with one or more embodiments described herein. FIG. 26B illustrates a cross-sectional side view of device 2600 as viewed along a plane defined by line 2602. Repetitive description of like elements and/or processes employed in other embodiments described herein is omitted for sake of brevity.

Device 2600 can comprise an example, non-limiting alternative embodiment of device 2500 after removal of portions of first removable epitaxial layer 106, epitaxial quantum well layer 108, second removable epitaxial layer 110, and/or cap layer 112 and stripping resist layer 204. For example, portions of first removable epitaxial layer 106, epitaxial quantum well layer 108, second removable epitaxial layer 110, and/or cap layer 112 can be removed from device 2500 to form device 2600 as illustrated in FIGS. 26A and 26B using reactive ion etching (RIE) and/or FinFET patterning technology.

FIG. 27A illustrates a top view of the example, non-limiting device 2600 of FIGS. 26A and 26B after removing additional portions of the first removable epitaxial layer of device 2600 in accordance with one or more embodiments described herein. FIG. 27B illustrates a cross-sectional side view of device 2700 as viewed along a plane defined by line 2702. Repetitive description of like elements and/or processes employed in other embodiments described herein is omitted for sake of brevity.

Device 2700 can comprise an example, non-limiting alternative embodiment of device 2600 after removal of additional portions of first removable epitaxial layer 106 from device 2600 as illustrated in FIG. 27B. For example, such additional portions of first removable epitaxial layer 106 can be removed from device 2600 to form device 2700 as illustrated in FIGS. 27A and 27B using a wet etching technique.

FIG. 28A illustrates a top view of the example, non-limiting device 2700 of FIGS. 27A and 27B after depositing a superconducting material on device 2700 in accordance with one or more embodiments described herein. FIG. 28B illustrates a cross-sectional side view of device 2800 as viewed along a plane defined by line 2802. Repetitive description of like elements and/or processes employed in other embodiments described herein is omitted for sake of brevity.

Device 2800 can comprise an example, non-limiting alternative embodiment of device 2700 after depositing superconducting material 904 on device 2700 as illustrated in FIGS. 28A and 28B. Superconducting material 904 can be deposited on device 2700 using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electro-chemical deposition (ECD), etc.). Superconducting material 904 can comprise a superconducting material including, but not limited to, aluminum (Al), niobium (Nb), vanadium (V), tantalum (Ta), and/or another superconducting material. Superconducting material 904 can be deposited on device 2700 as illustrated in FIGS. 28A and 28B to form superconducting regions 904a, 904b of epitaxial Josephson junction tunneling channel 2906 as described below and illustrated in FIGS. 29A and 29B.

FIG. 29A illustrates a top view of the example, non-limiting device 2800 of FIGS. 28A and 28B after removing portions of the superconducting material, all of the cap layer, and portions of the second removable epitaxial layer of device 2800 in accordance with one or more embodiments described herein. FIG. 29B illustrates a cross-sectional side view of device 2900 as viewed along a plane defined by line 2902. Repetitive description of like elements and/or processes employed in other embodiments described herein is omitted for sake of brevity.

Device 2900 can comprise an example, non-limiting alternative embodiment of device 2800 after removing portions of superconducting material 904, all of cap layer 112, and portions of second removable epitaxial layer 110 from device 2800 as illustrated in FIGS. 29A and 29B. For example, such portions of superconducting material 904, all of cap layer 112, and portions of second removable epitaxial layer 110 can be removed from device 2800 to form device 2900 as illustrated in FIGS. 29A and 29B using a chemical-mechanical planarization (CMP) process. Such removal of portions of superconducting material 904, all of cap layer 112, and portions of second removable epitaxial layer 110 as described above (e.g., via CMP) can result in formation of epitaxial Josephson junction transmon device 2904 (denoted in FIGS. 29A and 29B by the bold dashed line). Epitaxial Josephson junction transmon device 2904 can comprise epitaxial Josephson junction tunneling channel 2906 coupled to superconducting regions 904a, 904b as illustrated in FIGS. 29A and 29B.

FIG. 30A illustrates a top view of the example, non-limiting device 2900 of FIGS. 29A and 29B after forming a lift off resist structure on device 2900 in accordance with one or more embodiments described herein. FIG. 30B illustrates a cross-sectional side view of device 3000 as viewed along a plane defined by line 3002. Repetitive description of like elements and/or processes employed in other embodiments described herein is omitted for sake of brevity.

Device 3200 can comprise an example, non-limiting alternative embodiment of device 2900 after forming a lift off resist structure on device 2900 as illustrated in FIGS. 30A and 30B. Such a lift off resist structure can be formed on device 2900 using the same materials and/or the same process that can be used to form the lift off resist structure on device 900 as described above with reference to FIGS. 10A and 10B. For example, the lift off resist structure illustrated in FIGS. 30A and 30B can comprise a lift off stack having a resist profile layer 1006 with an undercut profile that can comprise resist layer 204. In an example, resist profile layer 1006 can be formed using the same material and/or the same photolithography, patterning, and/or photoresist techniques defined above (e.g., a lithographic patterning process) that can be used to form resist layer 204. In another example, resist profile layer 1006 can be formed using different material from that used to form resist layer 204. For example, resist profile layer 1006 can comprise a hard mask formed using materials such as, for instance, silicon (Si) or titanium (Ti) and resist layer 204 can be formed using an organic material that can be developed out using, for example, solvent or tetramethylammonium hydroxide to create the undercut profile illustrated in FIG. 30B. The lift off resist structure can be formed on device 2900 as illustrated in FIGS. 30A and 30B to enable formation of, for instance, one or more wires, electrodes, capacitors, resonators, tuning gates, and/or another conductor on device 3000 that can be coupled to epitaxial Josephson junction transmon device 2904 as described below and illustrated in FIGS. 31A, 31B, 32A, 32B, 33A, and 33B. For example, the lift off resist structure can be formed on device 2900 as illustrated in FIGS. 30A and 30B to enable formation of, for instance, conductive structures 1204a, 1204b on device 3000 that can be coupled to epitaxial Josephson junction transmon device 2904 as described below and illustrated in FIGS. 31A, 31B, 32A, 32B, 33A, and 33B. For instance, the lift off resist structure can be formed on device 2900 as illustrated in FIGS. 30A and 30B to enable formation of, for instance, conductive structures 1204a, 1204b on device 3000 that can be coupled to superconducting region 904a and/or superconducting region 904b of epitaxial Josephson junction transmon device 2904 as described below and illustrated in FIGS. 31A, 31B, 32A, 32B, 33A, and 33B.

FIG. 31A illustrates a top view of the example, non-limiting device 3000 of FIGS. 30A and 30B after depositing a superconducting layer on device 3000 in accordance with one or more embodiments described herein. FIG. 31B illustrates a cross-sectional side view of device 3100 as viewed along a plane defined by line 3102. Repetitive description of like elements and/or processes employed in other embodiments described herein is omitted for sake of brevity.

Device 3100 can comprise an example, non-limiting alternative embodiment of device 3000 after depositing superconducting layer 1104 on device 3000 as illustrated in FIGS. 31A and 31B. Superconducting layer 1104 can be deposited on device 3000 using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Superconducting layer 1104 can be formed using a superconducting material including, but not limited to, aluminum (Al), niobium (Nb), vanadium (V), tantalum (Ta), and/or another superconducting material. Superconducting layer 1104 can comprise a thickness (e.g., height) ranging from approximately 5 nm to approximately 300 nm. Superconducting layer 1104 can be deposited on device 3000 as illustrated in FIGS. 31A and 31B to form, for instance, one or more wires, electrodes, capacitors, resonators, tuning gates, and/or another conductor on device 3100 that can be coupled to epitaxial Josephson junction transmon device 2904 as described below and illustrated in FIGS. 32A, 32B, 33A, and 33B. For example, superconducting layer 1104 can be deposited on device 3000 as illustrated in FIGS. 31A and 31B to form conductive structures 1204a, 1204b on device 3100 that can be coupled to epitaxial Josephson junction transmon device 2904 as described below and illustrated in FIGS. FIGS. 32A, 32B, 33A, and 33B. For instance, superconducting layer 1104 can be deposited on device 3000 as illustrated in FIGS. 31A and 31B to form conductive structures 1204a, 1204b on device 3100 that can be coupled to superconducting region 904a and/or superconducting region 904b of epitaxial Josephson junction transmon device 2904 as described below and illustrated in FIGS. 32A, 32B, 33A, and 33B.

FIG. 32A illustrates a top view of the example, non-limiting device 3100 of FIGS. 31A and 31B after removing the lift off resist structure and portions of the superconducting layer to form conductive structures coupled to the epitaxial Josephson junction transmon device in accordance with one or more embodiments described herein. FIG. 32B illustrates a cross-sectional side view of device 3200 as viewed along a plane defined by line 3202. Repetitive description of like elements and/or processes employed in other embodiments described herein is omitted for sake of brevity.

Device 3200 can comprise an example, non-limiting alternative embodiment of device 3100 after removing the lift off resist structure comprising resist profile layer 1006 and resist layer 204 and portions of superconducting layer 1104 to form one or more conductive structures 1204a, 1204b that can be coupled to epitaxial Josephson junction transmon device 2904 as illustrated in FIGS. 32A, 32B, 33A, and 33B. The lift off resist structure and portions of superconducting layer 1104 formed on resist profile layer 1006 of the lift off resist structure can be removed using a lift off technique (e.g., washing with a solvent, stripping, etc.) to define conductive structures 1204a, 1204b that can be coupled to epitaxial Josephson junction transmon device 2904 as illustrated in FIGS. 32A, 32B, 33A, and 33B. In an example, conductive structures 1204a, 1204b can comprise the portions of superconducting layer 1104 remaining after removing resist profile layer 1006 and resist layer 204 as described above, where conductive structures 1204a, 1204b can comprise wires, electrodes, capacitors, resonators, tuning gates, and/or another conductor that can be coupled to epitaxial Josephson junction transmon device 2904. For instance, conductive structures 1204a, 1204b can comprise capacitors that can be coupled to superconducting regions 904a, 904b of epitaxial Josephson junction transmon device 2904. In an example, conductive structure 1204a can be coupled to superconducting region 904a of epitaxial Josephson junction transmon device 2904 as illustrated in FIGS. 32A, 32B, 33A, and 33B. In another example, conductive structure 1204b can be coupled to superconducting region 904b of epitaxial Josephson junction transmon device 2904 as illustrated in FIGS. 32A, 32B, 33A, and 33B.

FIG. 33A illustrates a top view of the example, non-limiting device 3200 of FIGS. 32A and 32B after removing most of the second removable epitaxial layer from device 3200 in accordance with one or more embodiments described herein. FIG. 33B illustrates a cross-sectional side view of device 3300 as viewed along a plane defined by line 3302. Repetitive description of like elements and/or processes employed in other embodiments described herein is omitted for sake of brevity.

Device 3300 can comprise an example, non-limiting alternative embodiment of device 3200 after removing most of second removable epitaxial layer 110 from device 3200 as illustrated in FIGS. 33A and 33B. For example, all of second removable epitaxial layer 110 except the portions of second removable epitaxial layer 110 positioned under conductive structures 1204*a*, 1204*b* can be removed from device 3200 to form device 3300 as illustrated in FIGS. 33A and 33B using a wet etching technique.

Epitaxial Josephson junction transmon device 1004 and/or epitaxial Josephson junction transmon device 2904 can be associated with various technologies. For example, epitaxial Josephson junction transmon device 1004 and/or epitaxial Josephson junction transmon device 2904 can be associated with semiconductor and/or superconductor device technologies, semiconductor and/or superconductor device fabrication technologies, quantum computing device technologies, quantum computing device fabrication technologies, epitaxial film growth technologies, Josephson junction transmon device technologies, Josephson junction transmon device fabrication technologies, transmon qubit technologies, transmon qubit fabrication technologies, and/or other technologies.

Epitaxial Josephson junction transmon device 1004 and/or epitaxial Josephson junction transmon device 2904 can provide technical improvements to the various technologies listed above. For example, formation of epitaxial Josephson junction transmon device 1004 and/or epitaxial Josephson junction transmon device 2904 can be performed using an epitaxial film growth process. In an example, utilizing such an in situ epitaxial film growth process to grow the various layers of epitaxial Josephson junction transmon device 1004 and/or epitaxial Josephson junction transmon device 2904 as described herein can facilitate desirable crystallinity of each layer (film), as well as prevent oxidation and/or defects at the interfaces between each of such layers and/or at the interface between at least one of such layers and a substrate upon which such layers are formed. In another example, utilizing such an in situ epitaxial film growth process to grow the various layers of epitaxial Josephson junction transmon device 1004 and/or epitaxial Josephson junction transmon device 2904 as described herein can further facilitate repeatable fabrication of each of such layers to a desirable dimension (e.g., height, thickness, etc.). Such repeatable fabrication of each of such layers to a desirable dimension (e.g., height, thickness, etc.) can facilitate: improved consistency of the desirable dimension in a plurality of epitaxial Josephson junction transmon devices fabricated using such an in situ epitaxial film growth process; and/or improved coherence time, improved performance, and/or improved lifespan of an epitaxial Josephson junction transmon device fabricated using such an in situ epitaxial film growth process. In another example, formation of gap 2004 described above and illustrated in FIG. 20B can prevent direct contact of the tuning gate described above comprising conductive structures 1304*a*, 1304*b*, 1304*c* with epitaxial Josephson junction transmon device 1004, thereby facilitating at least one of improved coherence time, improved performance, or improved lifespan of epitaxial Josephson junction transmon device 1004.

Epitaxial Josephson junction transmon device 1004 and/or epitaxial Josephson junction transmon device 2904 can provide technical improvements to a processing unit associated with epitaxial Josephson junction transmon device 1004 and/or epitaxial Josephson junction transmon device 2904. For example, based on the examples provided above describing fabrication of epitaxial Josephson junction transmon device 1004 and/or epitaxial Josephson junction transmon device 2904 using methods and/or materials that protect the elements of such devices from defects and/or damage (e.g., first removable epitaxial layer 106, epitaxial quantum well layer 108, second removable epitaxial layer 110, superconducting regions 904*a*, 904*b*, conductive structures 1204*a*, 1204*b*, 1304*a*, 1304*b*, 1304*c*, etc.), epitaxial Josephson junction transmon device 1004 and/or epitaxial Josephson junction transmon device 2904 can facilitate improved (e.g., longer) coherence times, thereby facilitating improved processing performance of a quantum computing device (e.g., a quantum processor) comprising epitaxial Josephson junction transmon device 1004 and/or epitaxial Josephson junction transmon device 2904.

A practical application of epitaxial Josephson junction transmon device 1004 and/or epitaxial Josephson junction transmon device 2904 is they can be implemented in a quantum computing device (e.g., a quantum computer) to improve processing performance of such a device, which can facilitate fast and/or possibly universal quantum computing. Such a practical application can improve the output (e.g., computation and/or processing results) of one or more compilation jobs (e.g., quantum computing jobs) that are executed on such a device(s).

It should be appreciated that epitaxial Josephson junction transmon device 1004 and/or epitaxial Josephson junction transmon device 2904 provide a new approach for fabricating superconducting devices which is driven by relatively new quantum computing technologies. For example, epitaxial Josephson junction transmon device 1004 and/or epitaxial Josephson junction transmon device 2904 provide a new approach for fabricating transmon devices (e.g., transmon qubits) that can improve coherence time, performance, and/or lifespan of such a transmon device.

Epitaxial Josephson junction transmon device 1004 and/or epitaxial Josephson junction transmon device 2904 can be coupled to hardware and/or software to solve problems that are highly technical in nature, that are not abstract and that cannot be performed as a set of mental acts by a human. For example, epitaxial Josephson junction transmon device 1004 and/or epitaxial Josephson junction transmon device 2904 can be employed in a semiconductor and/or a superconductor device (e.g., integrated circuit) used to implement a quantum computing device that can process information and/or execute calculations that are not abstract and that cannot be performed as a set of mental acts by a human.

It should be appreciated that epitaxial Josephson junction transmon device 1004 and/or epitaxial Josephson junction transmon device 2904 can utilize various combinations of electrical components, mechanical components, and circuitry that cannot be replicated in the mind of a human or performed by a human. For example, facilitating an epitaxial Josephson junction transmon device 1004 and/or epitaxial Josephson junction transmon device 2904 in a semiconducting and superconducting device can enable operation of a quantum computing device (e.g., a quantum processor of a quantum computing device) is an operation that is greater than the capability of a human mind. For instance, the amount of data processed, the speed of processing such data, and/or the types of data processed over a certain period of time by such a quantum computing device utilizing epitaxial Josephson junction transmon device 1004 and/or epitaxial Josephson junction transmon device 2904 can be greater, faster, and/or different than the amount, speed, and/or data type that can be processed by a human mind over the same period of time.

According to several embodiments, epitaxial Josephson junction transmon device 1004 and/or epitaxial Josephson junction transmon device 2904 can also be fully operational towards performing one or more other functions (e.g., fully powered on, fully executed, etc.) while also performing the above-referenced operations. It should also be appreciated that such simultaneous multi-operational execution is beyond the capability of a human mind. It should also be appreciated that epitaxial Josephson junction transmon device 1004 and/or epitaxial Josephson junction transmon device 2904 can include information that is impossible to obtain manually by an entity, such as a human user. For example, the type, amount, and/or variety of information included in epitaxial Josephson junction transmon device 1004 and/or epitaxial Josephson junction transmon device 2904 can be more complex than information obtained manually by a human user.

The example, non-limiting multi-step fabrication sequences described above with reference to FIGS. 1-33B, which can be implemented to fabricate one or more embodiments of the subject disclosure described herein and/or illustrated in the figures, can be implemented by a computing system (e.g., operating environment 3400 illustrated in FIG. 34 and described below) and/or a computing device (e.g., computer 3412 illustrated in FIG. 34 and described below). In non-limiting example embodiments, such computing system (e.g., operating environment 3400) and/or such computing device (e.g., computer 3412) can comprise one or more processors and one or more memory devices that can store executable instructions thereon that, when executed by the one or more processors, can facilitate performance of the example, non-limiting multi-step fabrication operations described herein with reference to FIGS. 1-33B. As a non-limiting example, the one or more processors can facilitate performance of the example, non-limiting multi-step fabrication operations described herein with reference to FIGS. 1-33B by directing and/or controlling one or more systems and/or equipment operable to perform semiconductor and/or superconductor device fabrication.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

In order to provide a context for the various aspects of the disclosed subject matter, FIG. 34 as well as the following discussion are intended to provide a general description of a suitable environment in which the various aspects of the disclosed subject matter can be implemented. FIG. 34 illustrates a block diagram of an example, non-limiting operating environment in which one or more embodiments described herein can be facilitated. For example, operating environment 3400 can be used to implement the example, non-limiting multi-step fabrication operations described herein with reference to FIGS. 1-33B which can facilitate implementation of one or more embodiments of the subject disclosure described herein. Repetitive description of like elements and/or processes employed in other embodiments described herein is omitted for sake of brevity.

With reference to FIG. 34, a suitable operating environment 3400 for implementing various aspects of this disclosure can also include a computer 3412. The computer 3412 can also include a processing unit 3414, a system memory 3416, and a system bus 3418. The system bus 3418 couples system components including, but not limited to, the system memory 3416 to the processing unit 3414. The processing unit 3414 can be any of various available processors. Dual microprocessors and other multiprocessor architectures also can be employed as the processing unit 3414. The system bus 3418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 3416 can also include volatile memory 3420 and nonvolatile memory 3422. The basic input/output system (BIOS), containing the basic routines to transfer information between elements within the computer 3412, such as during start-up, is stored in nonvolatile memory 3422. Computer 3412 can also include removable/non-removable, volatile/non-volatile computer storage media. FIG. 34 illustrates, for example, a disk storage 3424. Disk storage 3424 can also include, but is not limited to, devices like a magnetic disk drive, floppy disk drive, tape drive, Jaz drive, Zip drive, LS-100 drive, flash memory card, or memory stick. The disk storage 3424 also can include storage media separately or in combination with other storage media. To facilitate connection of the disk storage 3424 to the system bus 3418, a removable or non-removable interface is typically used, such as interface 3426. FIG. 34 also depicts software that acts as an intermediary between users and the basic computer resources described in the suitable operating environment 3400. Such software can also include, for example, an operating system 3428. Operating system 3428, which can be stored on disk storage 3424, acts to control and allocate resources of the computer 3412.

System applications 3430 take advantage of the management of resources by operating system 3428 through program modules 3432 and program data 3434, e.g., stored either in system memory 3416 or on disk storage 3424. It is to be appreciated that this disclosure can be implemented with various operating systems or combinations of operating systems. A user enters commands or information into the computer 3412 through input device(s) 3436. Input devices 3436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 3414 through the system bus 3418 via interface port(s) 3438. Interface port(s) 3438 include, for example, a serial port, a parallel port, a game port, and a universal serial bus (USB). Output device(s) 3440 use some of the same type of ports as input device(s) 3436. Thus, for example, a USB port can be used to provide input to computer 3412, and to output information from computer 3412 to an output device 3440. Output adapter 3442 is provided to illustrate that there are some output devices 3440 like monitors, speakers, and printers, among other output devices 3440, which require special adapters. The output adapters 3442 include, by way of illustration and not limitation, video and sound cards that provide a means of connection between the output device 3440 and the system bus 3418. It should be noted that other devices and/or systems of devices provide both input and output capabilities such as remote computer(s) 3444.

Computer 3412 can operate in a networked environment using logical connections to one or more remote computers, such as remote computer(s) 3444. The remote computer(s) 3444 can be a computer, a server, a router, a network PC, a workstation, a microprocessor based appliance, a peer device or other common network node and the like, and typically can also include many or all of the elements described relative to computer 3412. For purposes of brevity, only a memory storage device 3446 is illustrated with remote computer(s) 3444. Remote computer(s) 3444 is logically connected to computer 3412 through a network interface 3448 and then physically connected via communication connection 3450. Network interface 3448 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 3450 refers to the hardware/software employed to connect the network interface 3448 to the system bus 3418. While communication connection 3450 is shown for illustrative clarity inside computer 3412, it can also be external to computer 3412. The hardware/software for connection to the network interface 3448 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a first superconducting region and a second superconducting region formed on a substrate, wherein the first superconducting region and the second superconducting region each have a side formed on and adjacent to the substrate;
   an epitaxial Josephson junction tunneling channel coupled to the first superconducting region and the second superconducting region; and
   a first removable epitaxial layer coupled to the substrate, wherein the first removable epitaxial layer is distinct from the first superconducting layer and the second superconducting layer.

2. The device of claim 1, further comprising:
   an epitaxial quantum well layer coupled to the first superconducting region and the second superconducting region.

3. The device of claim 2, wherein the first superconducting region and the second superconducting region extend through the epitaxial quantum well layer to define the epitaxial Josephson junction tunneling channel.

4. The device of claim 1, further comprising:
   an epitaxial quantum well layer coupled to the first removable epitaxial layer.

5. The device of claim 1, further comprising:
   an epitaxial quantum well layer coupled to the first removable epitaxial layer, wherein the epitaxial quantum well layer defines a dimension of the epitaxial Josephson junction tunneling channel, thereby facilitating at least one of consistency of the dimension in a plurality of epitaxial Josephson junction tunneling channels on the device, coherence time of the device, performance of the device, or lifespan of the device.

6. The device of claim 1, further comprising:
   an epitaxial quantum well layer coupled to the first removable epitaxial layer; and
   a second removable epitaxial layer coupled to the epitaxial quantum well layer.

7. The device of claim 1, further comprising:
   at least one of one or more capacitors or one or more resonators coupled to at least one of the first superconducting region or the second superconducting region.

* * * * *